United States Patent

Wang et al.

(10) Patent No.: US 12,382,725 B2
(45) Date of Patent: Aug. 5, 2025

(54) VARIABLE-SIZED ACTIVE REGIONS FOR A SEMICONDUCTOR DEVICE AND METHODS OF MAKING SAME

(71) Applicant: TAIWAN SEMICONDUCTOR MANUFACTURING COMPANY, LTD., Hsinchu (TW)

(72) Inventors: Ru-Yu Wang, Hsinchu (TW);
You-Cheng Xiao, Hsinchu (TW);
Kao-Cheng Lin, Hsinchu (TW);
Pin-Dai Sue, Hsinchu (TW); Ting-Wei Chiang, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 605 days.

(21) Appl. No.: 17/581,798

(22) Filed: Jan. 21, 2022

(65) Prior Publication Data

US 2023/0042514 A1 Feb. 9, 2023

Related U.S. Application Data

(60) Provisional application No. 63/229,766, filed on Aug. 5, 2021.

(51) Int. Cl.
*H10D 89/10* (2025.01)
*H10D 84/01* (2025.01)
*H10D 84/03* (2025.01)
*H10D 84/83* (2025.01)

(52) U.S. Cl.
CPC ......... *H10D 89/10* (2025.01); *H10D 84/0151* (2025.01); *H10D 84/038* (2025.01); *H10D 84/83* (2025.01)

(58) Field of Classification Search
CPC ......... H01L 27/0207; H01L 21/823481; H01L 27/088; H01L 21/823412; H01L 27/092; H01L 21/823475; H01L 27/0924; H01L 27/0886; H01L 29/66545
USPC ......................................................... 257/390
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2018/0269229 A1 | 9/2018 | Or-Bach et al. | |

(Continued)

*Primary Examiner* — Eva Y Montalvo
*Assistant Examiner* — Nicholas B Michaud
(74) *Attorney, Agent, or Firm* — Hauptman Ham, LLP

(57) ABSTRACT

A semiconductor device includes a substrate; and a cell region having opposite first and second sides, the cell region including active regions formed in the substrate; relative to an imaginary first reference line, a first majority of the active regions having first ends which align with the first reference line, the first side being parallel and proximal to the first reference line; relative to an imaginary second reference line in the second direction, a second majority of the active regions having second ends which align with the second reference line, the second side being parallel and proximal to the second reference line; and gate structures correspondingly on first and second ones of the active regions; and relative to the second direction, a first end of a selected one of the gate structures abuts an intervening region between the first and second active regions.

20 Claims, 42 Drawing Sheets

(56) References Cited

U.S. PATENT DOCUMENTS

2019/0312034 A1* 10/2019 Lee .................... H01L 27/0924
2020/0243446 A1    7/2020 Fan et al.
2021/0209284 A1*  7/2021 Li .................... H01L 21/823821
2021/0240902 A1*  8/2021 Ku ........................ G06F 30/392

* cited by examiner

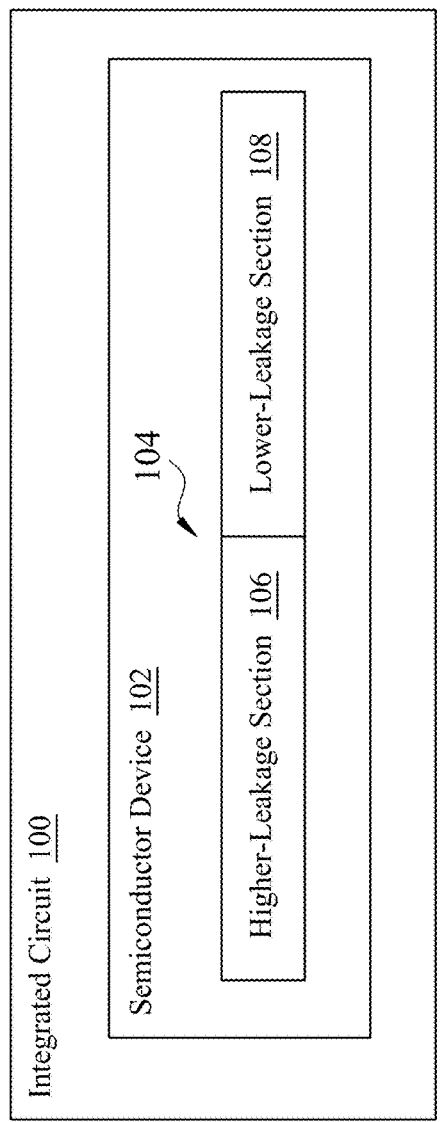
FIG. 1A
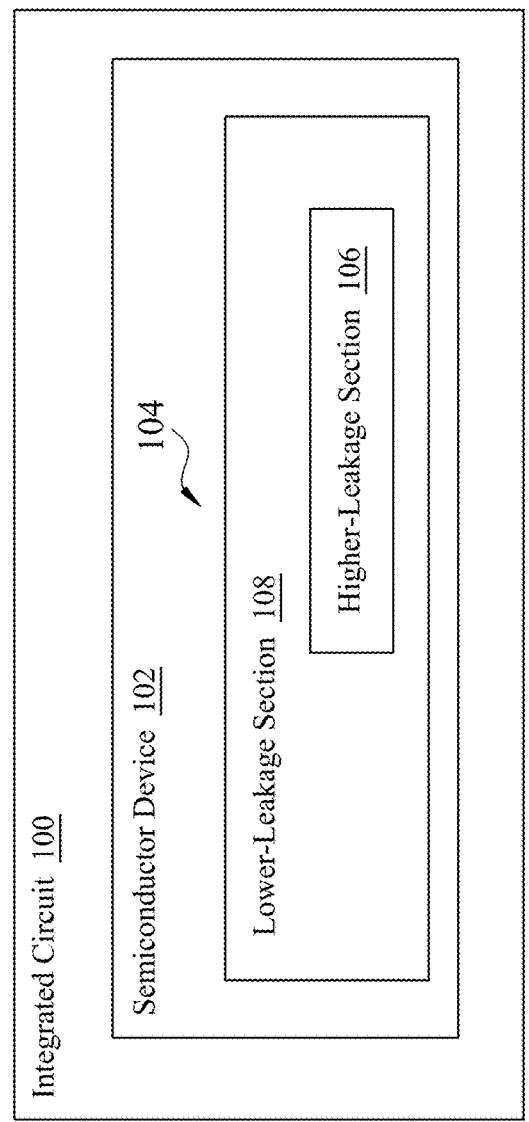
FIG. 1B
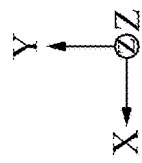

VARIABLE-SIZED ACTIVE REGIONS FOR A SEMICONDUCTOR DEVICE AND METHODS OF MAKING SAME

PRIORITY CLAIM

The present application claims the priority of U.S. Provisional Application No. 63/229,766, filed Aug. 5, 2021, which is incorporated herein by reference in its entirety.

BACKGROUND

The semiconductor integrated circuit (IC) industry produces a variety of analog and digital devices to address issues in a number of different areas. Developments in semiconductor process technology nodes have progressively reduced component sizes and tightened spacing resulting in progressively increased transistor density. ICs have become smaller.

In the context of semiconductor device manufacture, a design rule is a geometric constraint imposed on circuit board, semiconductor device, and IC designers to ensure their designs function properly, reliably, and are produced with acceptable yield. Design rules for production are developed by process engineers based on the corresponding semiconductor process technology node. Electronic design automation (EDA) is used to ensure that designers do not violate design rules; a process called design rule checking (DRC). DRC is a step during physical verification signoff on the design, which also involves LVS (layout versus schematic) checks, XOR (logic) checks, electrical rule checks (ERC), antenna checks (collection of charges from electromagnetic fields), or the like.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 1A-1B are corresponding block diagrams of an integrated circuit (IC), in accordance with some embodiments.

DETAILED DESCRIPTION

Figure 2A:
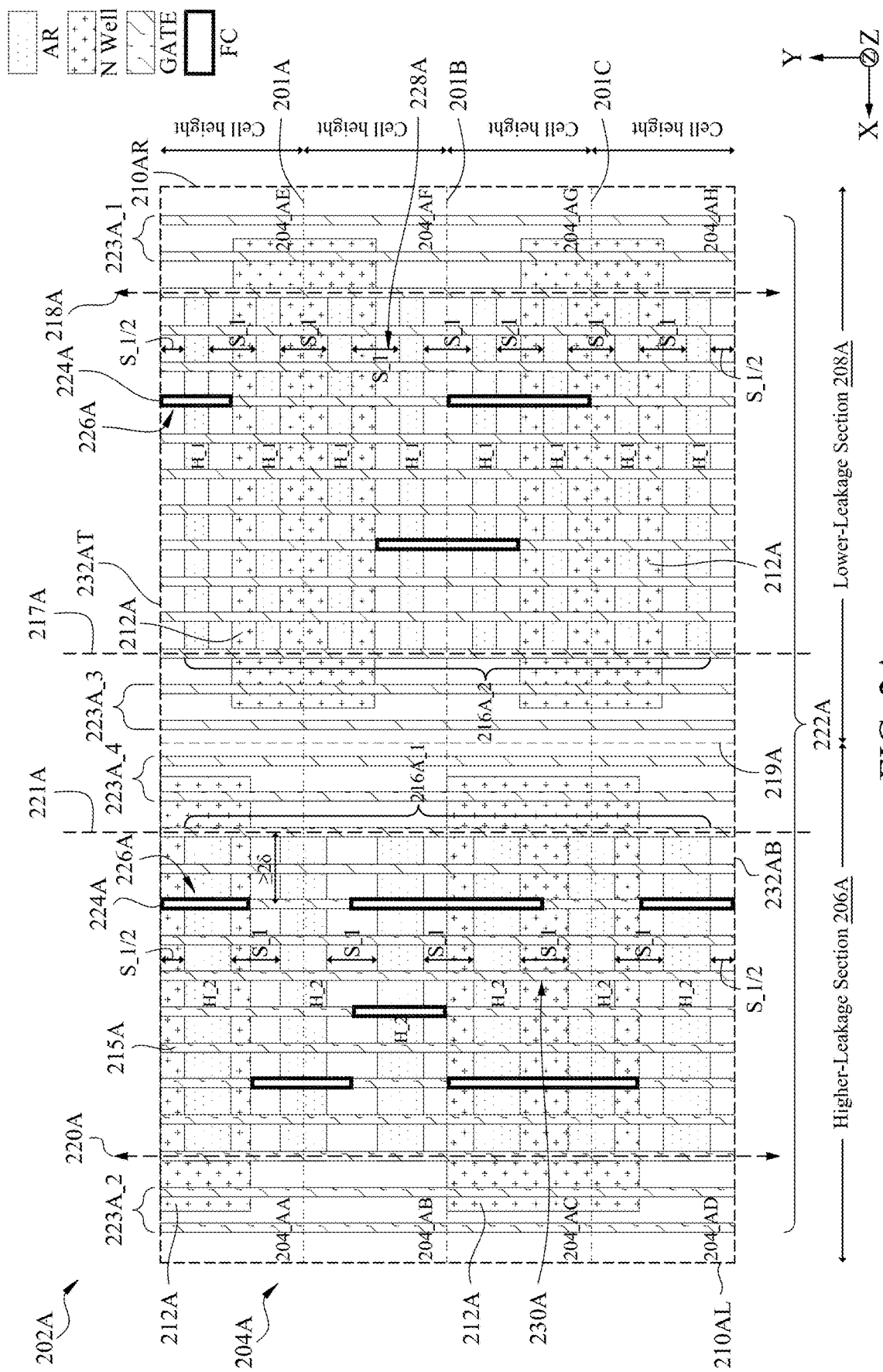
FIG. 2A is a layout diagram of a semiconductor device, in accordance with some embodiments.

The following disclosure discloses many different embodiments, or examples, for implementing different features of the subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may further include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, one or more semiconductor devices within an IC include a substrate and one or more cell regions. A cell region has opposite first and second sides relative to a first direction, e.g., the X-axis. A cell region includes active regions formed in the substrate, the active regions extending parallel to the X-axis. In some embodiments, relative to an imaginary first reference line in a perpendicular second direction, e.g., the Y-axis, a first majority of the active regions include first ends which align with the first reference line. In some embodiments, the first side is parallel and proximal to the first reference line. In some embodiments, relative to an imaginary second reference line parallel to the Y-axis, a second majority of the active regions include second ends which align with the second reference line. In some embodiments, the second side is parallel and proximal to the second reference line. Gate structures are correspondingly on first and second ones of the active regions. Relative to the X-axis, the first and second active regions are separated by an intervening region. Relative to the Y-axis, a first end of a selected one of the gate structures abuts the intervening region between the first and second active regions. In some embodiments, each of the gate structures is absent from an intervening region between the first and second active regions. In some embodiments, an intervening region between the first and second active regions is free from being overlapped by the gate structures.

In some embodiments, an isolation dummy gate occupies the intervening region. In some embodiments, the semiconductor device includes a lower-leakage (LL) section. In some embodiments, the semiconductor device includes a higher-leakage (HL) section. In some embodiments: the first active region is substantially within the LL section; and, relative to the Y-axis, the first active region is configured with a height that facilitates current leakage being below a predetermined threshold. In some embodiments: the second active region is substantially within the higher-leakage section; and, relative to the Y-axis, the second active region is configured with a height that is greater than the height of the first active region that facilitates higher performance, e.g., switching speeds at or exceeding a predetermined threshold. In some embodiments, a second isolation dummy gate separates one or more first active regions into a first portion and a second portion. In some embodiments, a third isolation dummy gate separates one or more second active regions into a first portion and a second portion. An isolation dummy gate is a dielectric structure that includes one or more dielectric materials and functions as an electrical isolation structure. Accordingly, an isolation dummy gate is not a structure that is electrically conductive and so does not function, e.g., as a gate electrode of an active transistor.

According to another approach, all active regions (ARs) within a substrate are rectangular in shape and are fully projected. According to the other approach, an active region that continuously extends from the one side to the other (e.g., left side to right side) of the cell region is regarded as being fully projected. The full projection of all ARs in the cell region according to the other approach wastes cell region space, e.g., because there can only be one active region on a given horizontal track (reference line) within the cell region and thus only one transistor on the given horizontal track within the cell region. By contrast, in some embodiments, for a given horizontal track, one or more isolation dummy gates are used to divide what otherwise would be a single, fully projected active region according to the other approach into multiple active regions on the same horizontal track line within the cell region and thus multiple transistors on the same given horizontal track within the cell region. Accordingly, in some embodiments, less cell region space is wasted as compared to the other approach, and thus transistor density (e.g., a ratio of the number of transistors in the cell region relative to the area of the cell region) is increased as compared to the other approach.

FIGS. 1A-1B are corresponding block diagrams of an IC 100, in accordance with some embodiments.

IC 100 includes a semiconductor device 102 with a cell region 104. Cell region 104 is configured with cell sections 106 and 108. Cell section 106 is a higher-performance and consequently higher-leakage (HL) section. Cell section 108 is a lower-leakage (LL) and consequently lower-performance section. In FIG. 1A, HL section 106 abuts LL section 108. In FIG. 1B, HL section 106 is surrounded by LL section 108. In some embodiments, relative to FIG. 1B, multiple instances of HL section 106 are surrounded by LL section 108. In some embodiments, one or more ARs within cell region 104 are not fully projected (see FC patterns of FIG. 2A, where, in some embodiments, FC is an acronym for future conversion to isolation dummy gate) and vary in their respective spacing between one another relative to the X-axis and the Y-axis. In some embodiments, one or more ARs within cell region 104 are broken up or separated by isolation dummy gates that correspondingly occupy intervening regions in contrast to other approaches. In some embodiments, the width (relative to the X-axis) and height (relative to the Y-axis) of the ARs within cell region 104 are configured to vary based on desired performance or a desired current leakage. In some embodiments, isolation dummy gates limit current leakage between neighboring ARs. In some embodiments, isolation dummy gates are configured to allow neighboring ARs to be placed closer to one another than previously allowed for by design rules according to another approach. In some embodiments, cell region performance is increased through increased AR size without sacrificing increased current leakage. In some embodiments, locating neighboring ARs between isolation dummy gates improves cell area ratios as well as cell area efficiency, AR density, and semiconductor yield. In some embodiments, a configuration of isolation dummy gates separating ARs within a cell region reduces the distance between ARs with varying sizes and maintains design rule checking (DRC) compliance.

IC 100 is referred to as a chip, or a microchip, and is a set of electronic circuits, or semiconductor devices, on one piece (e.g., wafer, chip, or substrate) of semiconductor material (e.g., substrate 314B FIGS. 3C-3D), usually silicon or other suitable materials within the contemplated scope of the disclosure. IC 100 supports one or more metal oxide semiconductor field-effect transistors (MOSFETs), such as semiconductor device 102, integrated into a chip; however, other suitable transistors and electrical components are within the contemplated scope of the disclosure. IC 100 is electrically coupled to, incorporates, or houses one or more semiconductor device 102.

Semiconductor device 102 is an electronic component or grouping of electronic components configured to use the electronic properties of a semiconductor material (e.g., silicon, germanium, or gallium arsenide, as well as organic semiconductors or other suitable materials within the contemplated scope of the disclosure) for its function.

In some embodiments, cell region 104 is a single cell region. In some embodiments, a cell region in the context of EDA is an abstract representation of a component within a schematic diagram or layout diagram of an electronic circuit in software. A cell-based design methodology is a technique that assists designers to analyze chip designs at varying levels of abstraction. For example, one designer focuses on the logical function (high-level) and another focuses on physical implementation (low-level).

In some embodiments, cell region 104 is a combination of two cell sections, such as HL section 106 and LL section 108 that abut, such as along a vertical axis as in FIG. 1A. In some embodiments, cell region 104 is a combination of two cell regions that abut along a horizontal axis. In some embodiments, cell region 104 is a combination of four cell regions that abut one another along a vertical axis. In some embodiments, cell region 104 is a combination of four cell regions where two cell regions abut along a horizontal axis and two other cell regions abut along a vertical axis. Other suitable cell region orientations are within the contemplated scope of the disclosure.

Each of HL 106 and LL 108 sections include one or more ARs that are configured such that they are not fully projected. In some embodiments, one or more of ARs within each of HL 106 and LL 108 are separated by one or more isolation dummy gates that occupy corresponding intervening regions. An isolation dummy gate is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, a isolation dummy gate is referred to as a dielectric gate structure. In some embodiments, an isolation dummy gate is an example of a structure included in a CPODE layout scheme. In some embodiments, CPODE is an acronym for continuous poly on diffusion edge. In some embodiments, CPODE is an acronym for continuous poly on oxide definition edge. In some embodiments, an isolation dummy gate is based on a gate structure as a precursor. In some embodiments, a dielectric gate is formed by first forming a gate structure, e.g., a dummy gate, sacrificing/removing (e.g., etching) the dummy gate to form a trench, (optionally) removing a portion of a substrate that previously had been under the dummy gate to deepen the trench, and then filling the trench with one or more dielectric materials such that the physical dimensions of the resultant electrical isolation structure, i.e., the isolation dummy gate, are similar to the dimensions of the precursor which was sacrificed, namely the gate structure or the combination of the gate structure and the portion of the substrate.

Cell region 104 is configured with a HL section 106, the latter being configured for performance, such as improved switching speed. In some embodiments, HL section 106 includes substantially all the cell area of cell region 104. In some embodiments, HL section 106 includes half of cell region 104. In some embodiments, HL section 106 includes a single AR, multiple ARs, or other suitable HL section 106 arrangements are within the contemplated scope of the disclosure.

Cell region 104 is further configured with LL section 108, the latter being configured to exhibit low leakage current. In some embodiments, LL section 108 includes substantially all the cell area of cell region 104. In some embodiments, LL section 108 includes up to half of cell region 104. In some embodiments, LL section 108 includes one AR, multiple ARs, or other suitable LL section 108 arrangements are within the contemplated scope of the disclosure.

In some embodiments, cell region 104 is configured with one or more HL sections 106 and one or more LL sections 108, the one or more HL cell sections 106 being interspersed with the one or more LL sections 108. In some embodiments, the distance between HL sections 106 and LL sections 108 is less than 3δ, where δ is the distance between centers of adjacent gate structures (also referred to as contact poly pitch~CPP), and where δ varies according to the corresponding semiconductor process technology node. In some embodiments, the distance between HL sections 106 and LL sections 108 is less than 2δ. In some embodiments, the distance between HL sections 106 and LL sections 108, separated by isolation dummy gate material, is 1δ. In some embodiments, the distance between HL sections 106 and LL sections 108 is approximately the width of the isolation dummy gate that occupies the intervening region. In some embodiments, the placement of HL sections 106 and LL sections 108 closer to one another improves cell area efficiency, AR density, and cell region yield.

FIG. 2A is a layout diagram 202A of a semiconductor device, in accordance with some embodiments.

For purposes of discussion of layout diagram 202A, shapes and patterns within layout diagram 202A are discussed with reference numerals in the form 2XXA or 2XX_A. Structures corresponding to the shapes and patterns of layout diagram 202A of a semiconductor device 202B (FIG. 2B) are discussed with reference numerals of the form 2XXB or 2XX_B in FIG. 2B.

Figure 2B:
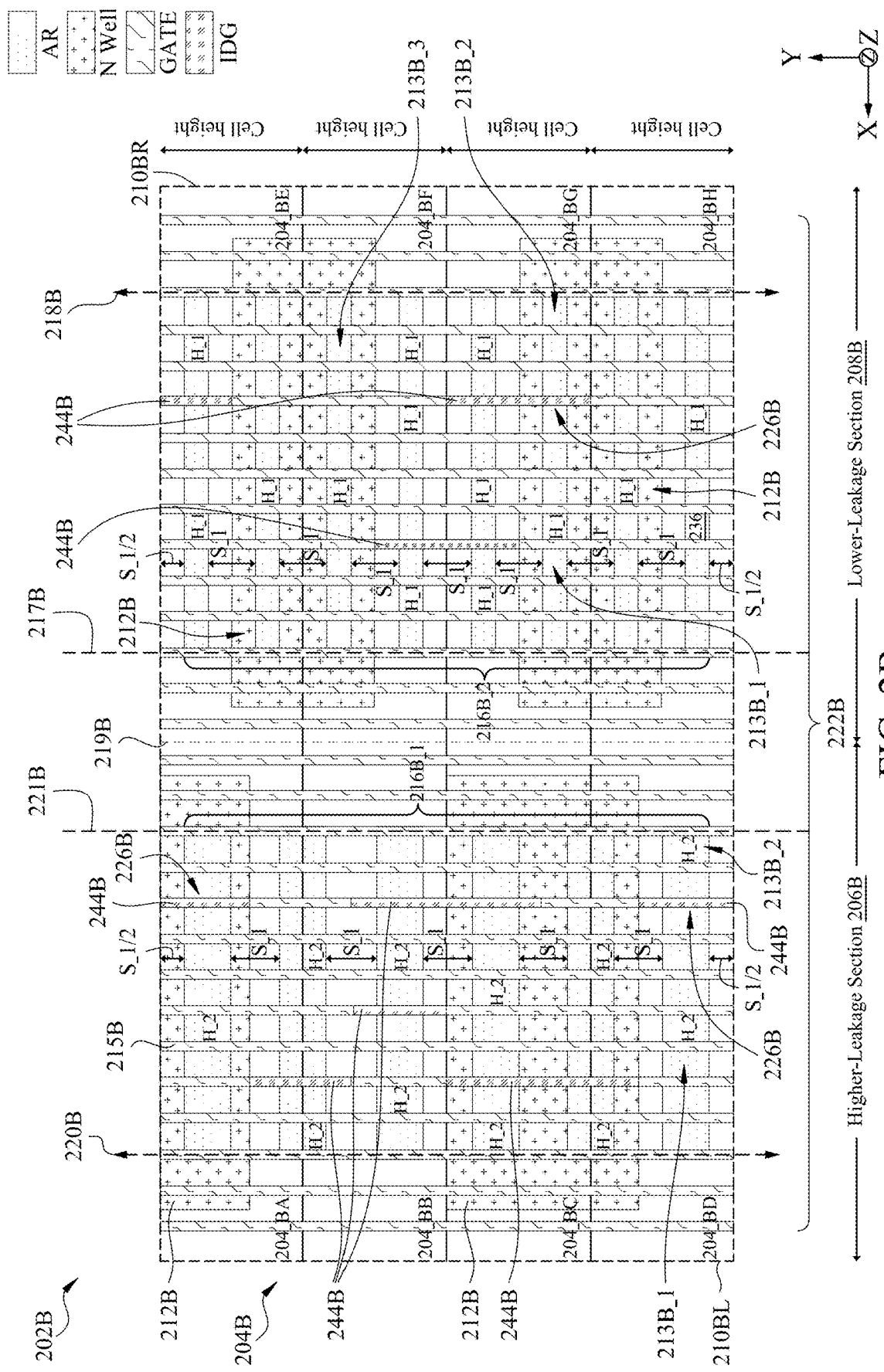
FIG. 2B is a plan view of a semiconductor device, in accordance with some embodiments.

Due to FC patterns 224A (discussed below) in FIG. 2A, corresponding interior isolation dummy gates of FIG. 2B are formed which result in corresponding ARs of FIG. 2B not being fully projected (discussed below). One or more benefits of not fully projecting all of the ARs in FIG. 2B include reduced cell region space waste, increased AR density, or the like, as compared to the other approach.

In some embodiments, layout diagram 202A is a layout diagram of a semiconductor device, e.g., semiconductor device 102. In some embodiments, layout diagram 202A is configured to be used in the fabrication of a semiconductor device, e.g., semiconductor device 202B (FIG. 2B), the latter being included within an IC, e.g., IC 100. In some embodiments, cell region 204A is an example of cell region 104. In some embodiments, cell regions 204_AA, 204_AB, 204_AC, 204_AD, 204_AE, 204_AF, 204_AG, and 204_AH are within cell region 204A of FIG. 2A, and are used in the fabrication of semiconductor cells, such as corresponding cell regions 204_BA, 204_BB, 204_BC, 204_BD, 204_BE, 204_BF, 204_BG, and 204_BH in cell region 204B of semiconductor device 202B of FIG. 2B, for use in an IC, such as IC 100. In some embodiments, HL section 206A is an example of HL section 106. In some embodiments, HL section 206A is configured to be used in the fabrication of an HL section, e.g., HL section 206B (FIG. 2B) and HL section 106. In some embodiments, LL section 208A is an example of LL section 108. In some embodiments, LL section 208A is configured to be used in the fabrication of an LL section like cell section 208B (FIG. 2B) and 108.

Layout diagram 202A includes cell region 204A which is a single cell region. In some embodiments, cell region 204A is regarded as a larger cell region that include smaller cell regions, such as cell regions 204_AA, 204_AB, 204_AC, 204_AD, 204_AE, 204_AF, 204_AG, and 204_AH.

In some embodiments, cell region 204A is regarded as a larger cell region which includes two medium-sized cell regions separated relative to the X-axis by an imaginary central vertical reference line 219A. In some embodiments, each of the two medium cell regions is regarded as a 'larger' cell region which includes smaller cell regions. For example, the medium cell region to the left of reference line 219A includes cell regions 204_AA, 204_AB, 204_AC, and 204_AD, and the medium cell region to the right of reference line 219A includes cell regions 204_AE, 204_AF, 204_AG, and 204_AH.

In some embodiments, cell region 204A is regarded as a larger cell region which includes two medium-sized cell regions separated relative to the Y-axis by an imaginary central horizontal reference line 201B. In some embodiments, each of the two medium cell regions is regarded as a 'larger' cell region which includes smaller cell regions. For example, e.g., the medium cell region above reference line 201B includes cell regions 204_AA, 204_AB, 204_AE, and 204_AF, and the medium cell region below reference line 201B includes cell regions 204_AC, 204_AD, 204_AG, and 204_AH.

In some embodiments, cell region 204A is regarded as a larger cell region that includes four medium-sized cell regions separated relative to the Y-axis by imaginary horizontal reference lines 201A, 201B, and 201C. In some embodiments, each of the four medium cell regions is regarded as a 'larger' cell region that includes smaller cell regions, e.g.: the medium cell region above reference line 201A includes cell regions 204_AA, 204_AE; the medium cell region between references line 201A and 201B includes cell regions 204_AB, and 204_AF; the medium cell region between references line 201B and 201C includes cell regions 204_AC, 204_AG; and the medium cell region below reference line 201C includes cell regions 204_AD, and 204_AH.

In some embodiments, cell region 204A is regarded as a larger cell region that includes four medium-sized cell regions separated relative to the X-axis by reference line 219A and separated relative to the Y-axis by reference line 201B. In some embodiments, each of the four medium cell regions is regarded as a 'larger' cell region that includes smaller cell regions, e.g.: the medium cell region to the left of reference line 219A and above reference line 201B includes cell regions 204_AA and 204_AB; the medium cell region to the left of reference line 219A and below reference line 201B includes cell regions 204_AC and 204_AD; the medium cell region to the right of reference line 219A and above reference line 201B includes cell regions 204_AE and 204_AF; and the medium cell region to the right of reference line 219A and below reference line 201B includes cell regions 204_AG and 204_AH. Other suitable cell region orientations are within the contemplated scope of the disclosure.

Layout diagram 202A further includes n-well patterns 212A within a substrate. In some embodiments, n-well patterns 212A and the substrate are within a first layer 340 (FIGS. 3C-3D) (e.g., a substrate layer 390). N-well patterns 212A are configured with a width extending in a first direction and a height extending in a perpendicular second direction. In FIG. 2A, the first and second directions are correspondingly the X-axis and the Y-axis. In some embodiments, the first and second directions are correspondingly other than the X-axis and the Y-axis. N-well patterns 212A are separated from each other along the Y-axis as well as along the X-axis; however, other orientations are contemplated within the disclosure.

Layout diagram 202A further includes opposite sides 210AR and 210AL relative to the X-axis. In some embodiments, opposite sides 210AR and 210AL correspond to cell boundaries. Cell region 204A includes a group 216A_1 of AR patterns and a group 216A_2 of AR patterns that include a width (Xδ, e.g., 9δ, 10δ) along the X-axis and a height (H_X, e.g., H_1, H_2) along the Y-axis. In some embodiments, an AR region is bounded by an oxide and is referred to as an oxide-dimensioned (OD) region or an oxide diffusion (OD) region. In some embodiments, groups 216A_1 and 216A_2 of AR patterns are within first layer 340 (FIGS. 3C-3D) of layout diagram 202A. During fabrication of semiconductor device based on layout diagram 202A, groups 216A_1 and 216A_2 of AR patterns result in corresponding ARs in groups 216B_1 and 216B_2 (FIG. 2B) of ARs.

Layout diagram 202A further includes imaginary reference lines 201A, 201B, 201C, 218A, 219A, 220A, 232AT, and 232AB. In some embodiments, the imaginary reference lines are orientation lines/tracks upon which the shapes and patterns of layout diagram 202A are placed. In some embodiments, imaginary reference lines 201A, 201B, 201C, 218A, 219A, 220A, 232AT, and 232AB are cell region boundaries. Reference line 218A extends parallel to the Y-axis. Relative to the X-axis, AR patterns group 216A_2 include ends which align with reference line 218A. In some embodiments, first side 210AR is parallel and proximal to reference line 218A. Reference line 220A extends parallel to the Y-axis. Relative to the X-axis, AR patterns of group 216A_1 include ends which align with reference line 220A. In some embodiments, second side 210AL is parallel and proximal to reference line 220A. In some embodiments, reference line 219A represents a cell boundary. In some embodiments, center reference line 219A represents a boundary between HL section 206A and LL section 208A. In some embodiments, reference line 219A is a vertical central reference line for cell region 204A. In some embodiments, reference line 219A is a cell boundary between cell regions 204_AA and 204_AE, 204_AB and 204_AF, 204_AC and 204_AG, and 204_AD and 204_AH. In some embodiments, first side 210AR and second side 210AL represent cell region boundaries.

Layout diagram 202A further includes a group 222A of gate patterns 215A. Gate patterns of group 222A correspondingly overlay the AR patterns group 216A_1 and 216A_2. In some embodiments, gate patterns of group 222A are in a second layer 342 (FIGS. 3C-3D) (e.g., a gate layer 396 (FIGS. 3C-3D). In some embodiments, second layer 342 is above first layer 340. In some embodiments, the gate layer 396 is in a third layer over a metal over diffusion layer (not shown) that is in second layer 342. In some embodiments, gate patterns of group 222A correspond to gate structures of group 222B (FIG. 2B).

In FIG. 2A, one of the gate patterns of group 222A is collinear with reference line 218A. Relative to the X-axis, all of the AR patterns in group 216A_2 extend away from reference line 219A toward reference line 218A such that the rightmost end of each AR pattern in group 216A_2 aligns with reference line 218A. Reference line 218A is parallel and proximal to first side 210AR of cell region 204A. In some embodiments, rightmost ends of fewer than all but nevertheless a first majority of the AR patterns in group 216A_2 align with reference line 218A.

FIG. 2A further includes imaginary reference line 217A that extends parallel to the Y-axis. In FIG. 2A, one of the gate patterns of group 222A is collinear with reference line 217A. Relative to the X-axis, all of the AR patterns in group 216A_2 extend away from reference line 218A toward reference line 219A such that the leftmost end of each AR pattern in group 216A_2 aligns with reference line 217A. In some embodiments, leftmost ends of fewer than all but nevertheless a second majority of the AR patterns in group 216A_2 align with reference line 217A. In some embodiments, the first majority of AR patterns in group 216A_2 is the same as the second majority of AR patterns in group 216A_2.

In FIG. 2A, one of the gate patterns of group 222A is collinear with reference line 220A. Relative to the X-axis, all of the AR patterns in group 216A_1 extend away from reference line 219A toward reference line 220A such that the leftmost end of each AR pattern in group 216A_1 aligns with reference line 220A. Reference line 220A is parallel and proximal to second side 210AL of cell region 204A. In some embodiments, leftmost ends of fewer than all but nevertheless a first majority of the AR patterns in group 216A_1 align with reference line 220A.

FIG. 2A further includes imaginary reference line 221A that extends parallel to the Y-axis. In FIG. 2A, one of the gate patterns of group 222A is collinear with reference line 221A. Relative to the X-axis, all of the AR patterns in group 216A_1 extend away from reference line 220A toward reference line 219A such that the rightmost end of each AR pattern in group 216A_1 aligns with reference line 221A. In some embodiments, rightmost ends of fewer than all but nevertheless a second majority of the AR patterns in group 216A_1 align with reference line 221A. In some embodiments, the first majority of AR patterns in group 216A_1 is the same as the second majority of AR patterns in group 216A_1.

In some embodiments, a first sub-group 223A_1 of gate patterns is between reference line 218A and first side 210AR, a second sub-group 223A_2 of gate patterns is between reference line 220A and second side 210AL. In some embodiments, a third sub-group 223A_3 is between group 216A_2 of AR patterns and central reference line 219A. In some embodiments, a fourth sub-group 223A_4 is between group 216A_1 of AR patterns and central reference line 219A. In some embodiments, the gate patterns of sub-groups 223A_1, 223A_2, 223A_3 and/or 223A_4 are dummy gate patterns. In some embodiments, a dummy gate pattern is configured to be used for isolating one cell region from another. In some embodiments, a dummy gate is not part of a transistor. In some embodiments, one or more dummy gate patterns are arranged at the edge of a cell region, such as cell region 204A or cell regions 204_AA, 204_AB, 204_AC, 204_AD, 204_AE, 204_AF, 204_AG, and 204_AH. In some embodiments, first side 210AR and second side 210AL represent portions of a cell boundary. In some embodiments, reference lines 218A and 220A represent portions of a cell boundary. In some embodiments, central reference line 219A represents a portion of corresponding cell boundaries. In some embodiments, reference lines 201A, 201B, and 201C represent portions of corresponding cell boundaries. In some embodiments, sub-group 223A_1 of gate patterns correspond to a cell boundary. In some embodiments, sub-groups 223A_1, 223A_2, 223A_3 and 223A_4 of gate patterns 215A represents portions of corresponding cell boundaries.

In FIG. 2A, variations in the arrangement of n-well patterns 212A are contemplated. In some embodiments, relative to the X-axis: left ends of the instances of n-well patterns 212A underlying corresponding AR patterns in group 216A_1 extend between the two gate patterns of sub-group 223A_2; right ends of the instances of n-well patterns 212A underlying corresponding AR patterns in group 216A_1 extend between the two gate patterns of sub-group 223A_4; left ends of the instances of n-well patterns 212A underlying corresponding AR patterns in group 216A_2 extend between the two gate patterns of sub-group 223A_3; and right ends of the instances of n-well patterns 212A underlying corresponding AR patterns in group 216A_2 extend between the two gate patterns of sub-group 223A_1.

In some embodiments, relative to the X-axis: left ends of the instances of n-well patterns 212A underlying corresponding AR patterns in group 216A_1 extend beyond reference line 220A but not so far as to underlie any gate pattern of sub-group 223A_2; right ends of the instances of n-well patterns 212A underlying corresponding AR patterns in group 216A_1 extend beyond the gate pattern which overlies the right ends of the AR patterns in group 216A_1 but not so far as to underlie any gate pattern of sub-group 223A_4; left ends of the instances of n-well patterns 212A underlying corresponding AR patterns in group 216A_2 extend beyond the gate pattern which overlies the left ends of the AR patterns in group 216A_2 but not so far as to underlie any gate pattern of sub-group 223A_3; and right ends of the instances of n-well patterns 212A underlying corresponding AR patterns in group 216A_2 extend beyond reference line 218A but not so far as to underlie any gate pattern of sub-group 223A_2.

Layout diagram 202A further includes future conversion to isolation dummy gate (FC) patterns 224A extending relative to the Y-axis. Manufacture of a semiconductor device based on layout diagram 202A of FIG. 2A results in semiconductor device 202B of FIG. 2B, and more particularly, manufacture of a semiconductor device based on FC patterns 224A of FIG. 2A results in isolation dummy gates 244B of FIG. 2B. A given FC pattern 224A overlies a given portion of a corresponding gate pattern, and the given portion of the gate pattern overlies a portion of a corresponding AR pattern; the given portions of the gate pattern and the AR pattern represent an intervening region 226A.

In some embodiments, relative to the Y-axis, a given region 226A in FIG. 2A is regarded as being intervening with respect to the corresponding gate pattern because given region 226A is between upper and lower portions of the corresponding gate pattern. The upper portion of the corresponding gate pattern does not underlie, i.e., is not covered by, a corresponding FC pattern 224A. The lower portion of the corresponding gate pattern does not underlie, i.e., is not covered by, corresponding FC pattern 224A. Accordingly, given region 226A is said to intervene between the uncovered upper and lower portions of the corresponding gate pattern. In some embodiments, relative to the Y-axis, a size of given region 226A is smaller than corresponding FC pattern 224A. In some embodiments, relative to the Y-axis, the size of given region 226A is about the same as corresponding FC pattern 224A.

It is to be recalled that intervening regions in FIG. 2A correspond to intervening regions 226B in FIG. 2B. Similarly, in some embodiments, relative to the Y-axis, a given region 226B in FIG. 2B is regarded as being intervening with respect to the corresponding gates because given region 226B is between an upper gate and a lower gate. Given region 226B is occupied by a corresponding isolation dummy gate 244B, wherein corresponding isolation dummy gate 244B separates the upper gate from the lower gate relative to the Y-axis. In some embodiments, relative to the Y-axis, a size of given region 226B is smaller than corresponding isolation dummy gate 244B. In some embodiments, relative to the Y-axis, the size of given region 226B is about the same as corresponding isolation dummy gate 244B.

In some embodiments, relative to the X-axis, a given region 226A in FIG. 2A is regarded as being intervening with respect to the corresponding AR pattern because given region 226A is between a left portion and a right portion of the corresponding AR pattern. The left portion of the corresponding AR pattern does not underlie, i.e., is not covered by, a corresponding FC pattern 224A. The right portion of the corresponding AR pattern does not underlie, i.e., is not covered by, corresponding FC pattern 224A. Accordingly, given region 226A is said to intervene between the uncovered left and right portions of the corresponding AR pattern. In some embodiments, relative to the X-axis, a size of given region 226A about the same as corresponding FC pattern 224A. In some embodiments, relative to the Y-axis, the size of given region 226A is smaller than corresponding FC pattern 224A.

It is to be recalled that intervening regions in FIG. 2A correspond to intervening regions 226B in FIG. 2B. Similarly, in some embodiments, relative to the X-axis, a given region 226B in FIG. 2B is regarded as being intervening with respect to the corresponding ARs because given region 226B is between a left AR and a right AR. Given region 226B is occupied by a corresponding isolation dummy gate 244B, wherein corresponding isolation dummy gate 244B separates the left AR from the right AR relative to the X-axis. In some embodiments, relative to the X-axis, an instance of isolation dummy gate 244B found between left and right ARs is referred to as an interior isolation dummy gate 244B. By contrast, in such embodiments, an instance of isolation dummy gate 244B that is not between corresponding left and right ARs of the same cell region is referred to as an exterior isolation dummy gate 244B. In such embodiments, relative to the X-axis, an exterior isolation dummy gate 244B is found at or near a boundary of the corresponding cell region and is adjacent to a left AR or to a right AR but is not adjacent to both a left and right AR of the same cell region. In some embodiments, relative to the X-axis, a size of given region 226B is about the same as corresponding isolation dummy gate 244B. In some embodiments, relative to the X-axis, the size of given region 226B is smaller than corresponding isolation dummy gate 244B.

In some embodiments, FC patterns 224A extend in a third direction perpendicular to each of the first and second directions. In FIG. 2A, the third direction is parallel to the Z-axis (not shown in FIG. 2A). More particularly, in some embodiments, FC patterns 224A extend from the bottom of first layer 340 to the top of second layer 342. In some embodiments, FC patterns 224A extend from first layer 340 to the third layer. In some embodiments, FC patterns 224A extend from a substrate layer 390 (FIG. 3C) through an n-well layer 392, through an AR layer 394 (FIGS. 3C-3D), and through a gate layer 396. Other FC pattern configurations, arrangements on other layout levels or quantities of FC patterns 224A are within the scope of the present disclosure.

In some embodiments, each FC pattern 224A designates a future separation or break between AR patterns and between gate patterns of an otherwise fully projected cell region. In some embodiments, each FC pattern 224A is a precursor of a corresponding interior isolation dummy gate 244B. In some embodiments, one or more FC patterns 224A are configured on each of a majority of the AR patterns in each of groups 216A_1 and 216A2. In some embodiments, relative to the X-axis, corresponding portions of FC patterns 224A are positioned at least 2δ from a nearest end of a corresponding AR pattern. In some embodiments, the width of AR patterns is at least 2δ. In some embodiments, the width of AR patterns is at least 3δ (see FIG. 15C). In some embodiments, some of the AR patterns are as narrow as 1δ (see FIG. 15C).

Layout diagram 202A includes lower-leakage section 208A and higher-leakage section 206A. The AR patterns of group 216A_2 are substantially within lower-leakage (LL) section 208A. The AR patterns of group 216A_1 are substantially within higher-leakage (HL) section 206A. Relative to the Y-axis, the AR patterns of group 216A_2 are configured with a height H_1 that facilitates current leakage below a predetermined threshold. Relative to the Y-axis, the AR patterns of group 216A_1 are configured with a height H_2 that is greater than the height of group 216A_2 of AR patterns and supports switching speeds within a predetermined threshold. In some embodiments, each AR pattern having a height of H_2 is a HL section. In some embodiments, each AR pattern having a height of H_1 is a LL section. In some embodiments, larger AR patterns relative to other AR patterns within the cell region are configured as a set of HL sections. In some embodiments, smaller AR patterns relative to other AR patterns within the cell region are configured as a set of LL sections. In some embodiments, relative to the Y-axis, the AR patterns in group 216A_1 are twice as large as the AR patterns in group 216A_2.

Relative to the X-axis, one or more of the AR patterns in each of groups 216A_1 and 216A_2 is overlied by one or more corresponding FC patterns 224A. A long axis of FC patterns 224A extends relative to the Y-axis. In some embodiments, a long axis of one or more FC patterns 224A extends relative to the Y-axis from a first end of a gate pattern 222A to a second end of a gate pattern 222A. The AR patterns in group 216A_2 are separated from each other by corresponding gaps 228A having a distance S_1. The AR patterns in group 216A_1 are separated from each other by corresponding gaps 230A having a distance S_1. In some embodiments, gaps 228A and 230A are configured with the same height. In some embodiments, gaps 228A and 230A are configured with different heights. In some embodiments, distance S_1 is determined by design rules of the corresponding semiconductor process technology node. In some embodiments, distance S_1 is a minimum height allowed between AR patterns according to design rules of the corresponding semiconductor process technology node. For purposes of describing embodiments of the present disclosure, gap heights are labeled in the form S_X, where X is a non-negative integer or fraction. For purposes of describing embodiments of the present disclosure, AR heights are labeled in the form H_X, where X is a non-negative integer.

The uppermost and lowermost AR patterns in group 216A_1 are separated from corresponding reference lines 232AT and 232AB by a distance of S_½. In some embodiments, reference lines 232AT and 232AB are cell boundaries. The uppermost and lowermost AR patterns in group 216A_2 are separated from corresponding reference lines 232AT and 232AB by a distance of S_½. The AR patterns in group 216A_2 are sized differently from the AR patterns in group 216A_1, e.g., with corresponding heights H_1 and H_2. In some embodiments, groups 216A_1 and 216A_2 of AR patterns within n-well patterns 212A are configured to be p-type diffusion material and support p-channel metal oxide semiconductors (PMOSs). In some embodiments, groups 216A_1 and 216A_2 of AR patterns outside of n-well patterns 212A are configured to be n-type diffusion material and support n-channel metal oxide semiconductors (NMOSs).

In some embodiments, each of cell regions 204_AE, 204_AF, 204_AG, and 204_AH is configured according to design rule (1) below. In some embodiments, each of cell regions 204_AA, 204_AB, 204_AC, and 204_AD, is expressed by design rule (2) below. In some embodiments, cell region 204A is expressed by design rule (3) below.

Cell Height=2·S_1+2·H_1  rule (1)

Cell Height=1.5·S_1+1.5·H_2  rule (2)

FIG. 2B is a plan view of a semiconductor device 202B, in accordance with some embodiments.

Semiconductor device 202B is an example of semiconductor device 102. In some embodiments, semiconductor device 202B is configured to be used within IC 100. In some embodiments, cell region 204B is an example of cell region 104. Cell regions 204B, 204_BA, 204_BB, 204_BC, 204_BD, 204_BE, 204_BF, 204_BG, and 204_BH of FIG. 2B correspond to cell regions 204A, 204_AA, 204_AB, 204_AC, 204_AD, 204_AE, 204_AF, 204_AG, and 204_AH. In some embodiments, HL section 206B is an example of HL section 106. In some embodiments, HL section 206B is configured to be used in cell region 104. In some embodiments, LL section 208B is an example of LL section 108. In some embodiments, LL section 208B is configured to be used in cell region 104.

Cell region 204B is configured with isolation dummy gates 244B and intervening regions 226B. More particularly, isolation dummy gates 244B occupy corresponding intervening regions 226B. In some embodiments, at least selected portions of selected ones of the gate electrodes that correspondingly align with reference lines 217B, 218B, 220B and 221B are replaced with corresponding isolation dummy gates, wherein the selected portions otherwise would overlie corresponding ends of corresponding ARs. In such embodiments, in the context of cell region 204B, isolation dummy gates 244B are referred to as interior isolation dummy gates whereas and the isolation dummy gates which replace the selected portions of the selected gate structures are referred to as exterior isolation dummy gates. In some embodiments, not only selected portions but entireties of the selected gate electrodes that correspondingly align with reference lines 217B, 218B, 220B and 221B are replaced with corresponding isolation dummy gates.

Semiconductor device 202B includes a cell region 204B including ARs in groups 216B_1 and 216B_2 extending parallel to X-axis. Group 216B_1 includes instances of AR 213B_1 and AR_213B_2. Group 216B_2 includes instances of AR 213B_1, AR 213B_2 and AR 213B_3. Each instance of AR 213B_1 and AR 213B_2 is an example of a non-fully projected AR. Each instance of AR 213B_3 is an instance of a fully projected AR. Relative to an imaginary central reference line 219B extending parallel to the Y-axis, cell region 204B is arranged so that central reference line 219B is located centrally within cell region 204B relative to X-axis. Relative to an imaginary first reference line 218B extending parallel to the Y-axis, first end portions of two or more of the ARs in group 216B_2 extend a distance relative to X-axis from central reference line 219B to first reference line 218B. A first edge 210BR of cell region 204B is parallel and proximal to first reference line 218B. Relative to an imaginary second reference line 220B extending parallel to the Y-axis, second end portions of two or more of active regions 216B_1 extend a distance from central reference line 219B to second reference line 220B. A second edge 210BL of cell region 204B is parallel and proximal to second reference line 220B. Second edge 210BL is on an opposite side of cell region 204B relative to first edge 210BR. Corresponding instances of AR 213B_1 on the left and corresponding instances of AR 213B_2 on the right include corresponding long axes that are parallel to the X-axis and which are collinear. In some embodiments, instances of AR 213B_1 on the left and corresponding instances of AR 213B_2 on the right are separated by corresponding instances of intervening region 226B. In some embodiments, a first set of instances of AR 213B_1 and a second set of instances of AR 213B_2 are separated by an instance of intervening region 226B.

In FIG. 2B, in some embodiments, rightmost ends of fewer than all but nevertheless a first majority of the ARs in group 216B_2 align with reference line 218B. Relative to the X-axis, all of the ARs in group 216B_2 extend away from reference line 218B toward reference line 219B such that the leftmost end of each AR in group 216B_2 aligns with reference line 217B. In some embodiments, leftmost ends of fewer than all but nevertheless a second majority of the ARs in group 216B_2 align with reference line 217B. In some embodiments, the first majority of ARs in group 216B_2 is the same as the second majority of ARs in group 216B_2.

In FIG. 2B, in some embodiments, leftmost ends of fewer than all but nevertheless a first majority of the ARs in group 216B_1 align with reference line 220B. Relative to the X-axis, all of the ARs in group 216B_1 extend away from reference line 220B toward reference line 219B such that the rightmost end of each AR in group 216B_1 aligns with reference line 221B. In some embodiments, rightmost ends of fewer than all but nevertheless a second majority of the ARs in group 216B_1 align with reference line 221B. In some embodiments, the first majority of ARs in group 216B_1 is the same as the second majority of ARs in group 216B_1.

Referring to FIG. 2B, intervening region(s) 226B, now occupied by corresponding isolation dummy gates 224B, are located at varying locations in the ARs of groups 216B_1 and 216B_2 in contrast to other approaches. In some embodiments, the removal of portions of gate structures 222B and corresponding portions of ARs in groups 216B_1 and 216B_2 is implemented in a fin field-effect transistor (FinFET) technology, nanosheet FET technology, gate-all-around technology, or the like.

Semiconductor device 202B is configured with isolation dummy gates 244B that occupy corresponding intervening regions 226B. Not all instances of ARs in groups 216B_1 and 216B_2 are collinear with another instance of AR. Relative to the X-axis, not all interior instances of isolation dummy gate 244B are necessarily collinear with another interior instance of isolation dummy gate 244B. Relative to the X-axis, various instances of isolation dummy gate 244B are located at different locations from one AR to the next. Each of the ARs in groups 216B_1 has a height H_2 each of the ARs in group 216B_2 has a height H_1, relative to the Y-axis, where H_1<H_2.

Figure 3A:
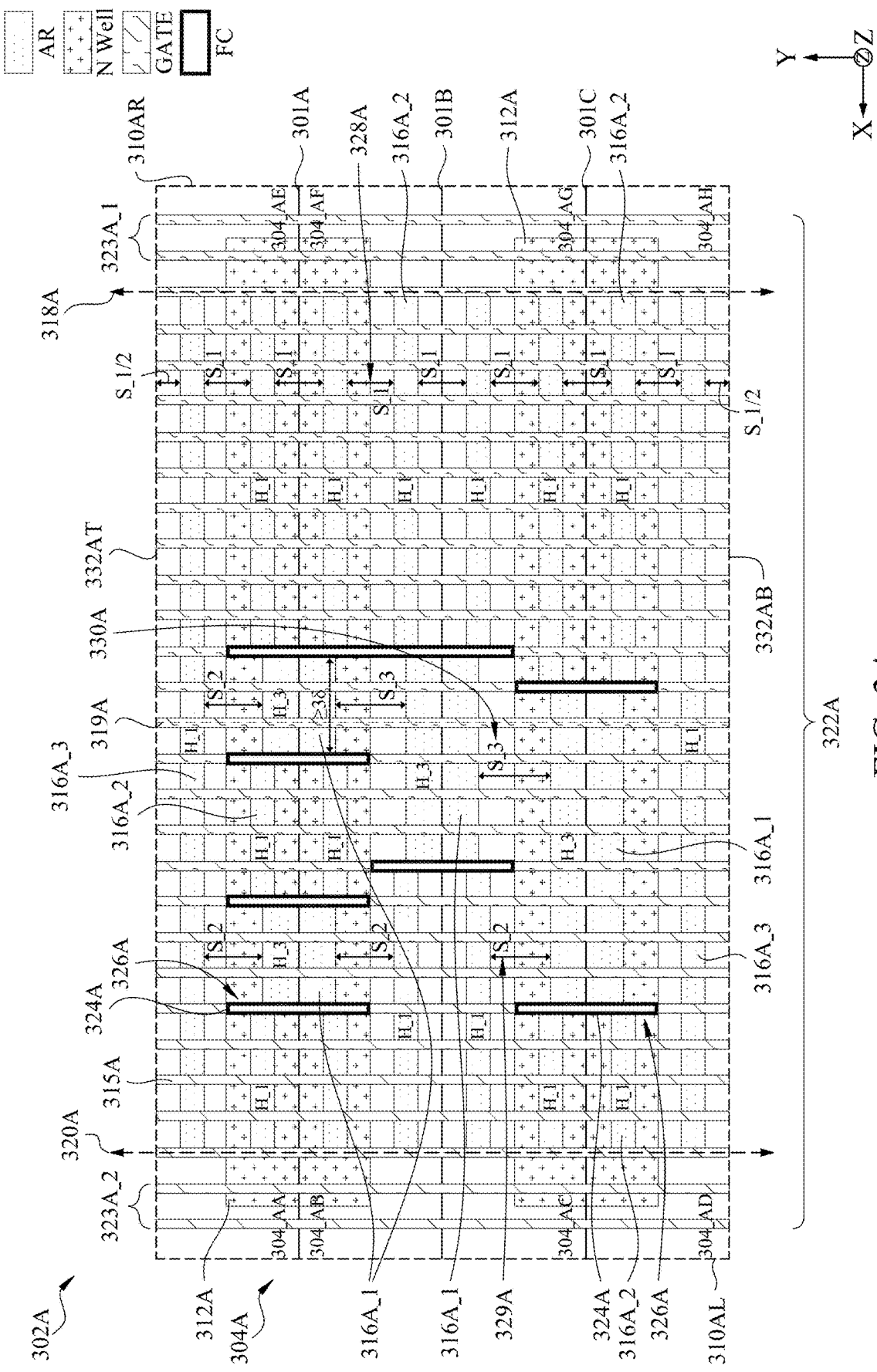
FIG. 3A is a layout diagram of a semiconductor device, in accordance with some embodiments.

FIG. 3A is a layout diagram 302A of a semiconductor device, in accordance with some embodiments.

For purposes of discussion of layout diagram 302A, shapes and patterns within layout diagram 302A are discussed with reference numerals in the form 3XXA or 3XX_A. Structures corresponding to the shapes and patterns of layout diagram 302A of a semiconductor device 302B (FIG. 3B) are discussed with reference numerals of the form 3XXB or 3XX_B in FIG. 3B.

Figure 3B:
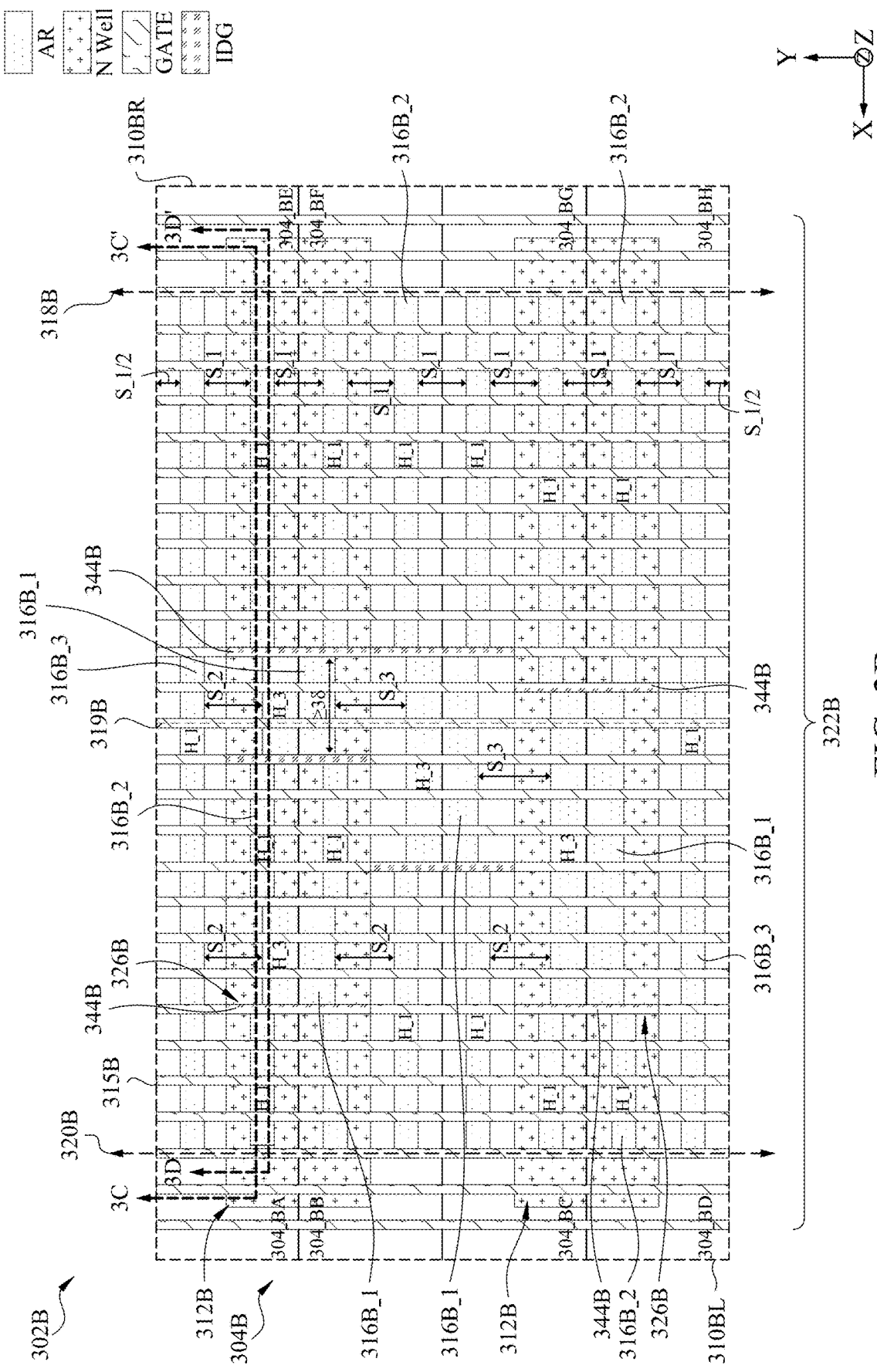
FIG. 3B is a plan view of a semiconductor device, in accordance with some embodiments.
Figures 3C, 3D:
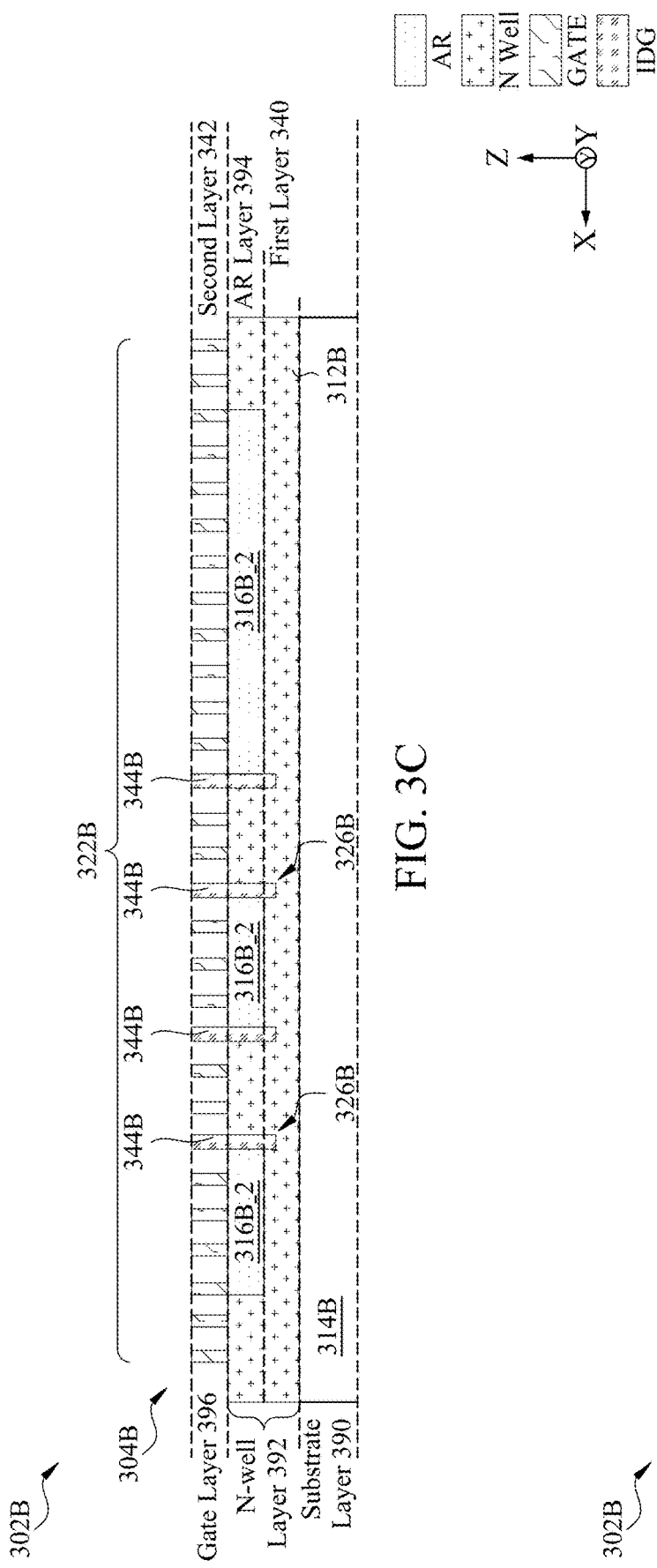
FIGS. 3C-3D are corresponding cross-sectional diagrams of the semiconductor device of FIG. 3B, in accordance with some embodiments.

Due to FC patterns 324A (discussed below) in FIG. 3A, corresponding interior isolation dummy gates of FIG. 3B are formed, which results in corresponding ARs of FIG. 3B not being fully projected (discussed below). Benefits of not fully projecting all of the ARs in FIG. 3B include reduced cell region space waste, increased AR density, or the like, as compared to the other approach.

In some embodiments, layout diagram 302A is a layout diagram of a semiconductor device, e.g., semiconductor device 102. In some embodiments, layout diagram 302A is configured to be used in the fabrication of a semiconductor device, e.g., semiconductor device 302B (FIG. 3B), the latter being included within an IC, e.g., IC 100. In some embodiments, cell region 304A is an example of cell region 104. In some embodiments, cell regions 304_AA, 304_AB, 304_AC, 304_AD, 304_AE, 304_AF, 304_AG, and 304_AH within cell region 304A of FIG. 3A and are used in the fabrication of semiconductor devices, such as corresponding cell regions 304_BA, 304_BB, 304_BC, 304_BD, 304_BE, 304_BF, 304_BG, and 304_BH in cell region 304B of semiconductor device 302B of FIG. 3B, for use in an IC, such as IC 100. In some embodiments, an HL section, e.g., HL section 106, is represented by a group of AR patterns 316A_1, each AR pattern 316A_1 having a height H_3 relative to the Y-axis. In some embodiments, an LL section, e.g., LL section 108, is represented by a group of AR patterns 316A_2 and 316A_3, each of AR patterns 316A_2 and 316A_3 having height H_1.

In FIG. 3A, relative to the X-axis, the instances of AR patterns 316A_3, 316A_2, and 316A_1 are not-fully projected. In some embodiments, the distance between an instance of AR pattern 316A_2 and an instance of AR pattern 316A_1 is less than or equal to 16, or is less than the width of FC pattern 324A, or is less than the width of gate patterns of group 322A.

Layout diagram 302A includes cell region 304A, which is a single cell region. In some embodiments, cell region 304A is regarded as a larger cell region that includes smaller cell regions, such as cell regions 304_AA, 304_AB, 304_AC, 304_AD, 304_AE, 304_AF, 304_AG, and 304_AH.

In some embodiments, cell region 304A is regarded as a larger cell region which includes two medium sized cell regions separated relative to the X-axis by an imaginary central vertical reference line 319A. In some embodiments, each of the two medium cell regions is regarded as a 'larger' cell region which includes smaller cell regions. For example, e.g., the medium cell region to the left of reference line 319A includes cell regions 304_AA, 304_AB, 304_AC, and 304_AD and the medium cell region to the right of reference line 319A includes cell regions 304_AE, 304_AF, 304_AG, and 304_AH.

In some embodiments, cell region 304A is regarded as a larger cell region which includes two medium-sized cell regions separated relative to the Y-axis by an imaginary central horizontal line 301B. In some embodiments, each of the two medium cell regions is regarded as a 'larger' cell region which includes smaller cell regions. For example, e.g., the medium cell region above reference line 301B includes cell regions 304_AA, 304_AB, 304_AE, and 304_AF and the medium cell region below reference line 301B includes cell regions 304_AC, 304_AD, 304_AG, and 304_AH.

In some embodiments, cell region 304A is regarded as a larger cell region that includes four medium-sized cell regions separated relative to the Y-axis by imaginary horizontal reference lines 301A, 301B, and 301C. In some embodiments, each of the four medium cell regions is regarded as a 'larger' cell region that includes smaller cell regions, e.g.: the medium cell region above reference line 301A includes cell regions 304_AA, 304_AE; the medium cell region between references line 301A and 301B includes cell regions 304_AB, and 304_AF; the medium cell region between references line 301B and 301C includes cell regions 304_AC, 304_AG; and the medium cell region below reference line 301C includes cell regions 304_AD, and 304_AH.

In some embodiments, cell region 304A is regarded as a larger cell region that includes four medium-sized cell regions separated relative to the X-axis by reference lines 319A and separated relative to the Y-axis by reference line 301B. In some embodiments, each of the four medium cell regions is regarded as a 'larger' cell region that includes smaller cell regions, e.g.: the medium cell region to the left of reference line 319A and above reference line 301B includes cell regions 304_AA and 304_AB; the medium cell region to the left of reference line 319A and below reference line 301B includes cell regions 304_AC and 304_AD; the medium cell region to the right of reference line 319A and above reference line 301B includes cell regions 304_AE and 304_AF; and the medium cell region to the right of reference line 319A and below reference line 301B includes cell regions 304_AG and 304_AH. Other suitable cell region orientations are within the contemplated scope of the disclosure.

Layout diagram 302A further includes n-well patterns 312A within a substrate. In some embodiments, n-well patterns 312A and the substrate are within a first layer 340 (FIGS. 3C-3D), e.g., a substrate layer 390 (FIGS. 3C-3D). N-well patterns 312A are configured with a width extending in the X-axis and a height along the Y-axis. In FIG. 3A, the first and second directions are correspondingly the X-axis and the Y-axis. In some embodiments, the first and second directions are correspondingly something other than the X-axis and the Y-axis. N-well patterns 312A are separated from each another relative to the X-axis; however, other orientations are contemplated within the disclosure. Variations in the arrangement of n-well patterns 312A which are similar to the variations of n-well patterns 212A are contemplated.

Layout diagram 302A further includes opposite sides 310AR and 310AL relative to the X-axis. In some embodiments, opposite sides 310AR and 310AL correspond to cell boundaries. Cell region 304A includes AR patterns 316A_2, 316A_3, and 316A_1, each of which has a width that is a corresponding multiple of δ (Xδ) relative to the X-axis and has a height (H_X) relative to the Y-axis, where X is a non-negative integer. In some embodiments, an AR region is bounded by an oxide and is referred to as an oxide-dimensioned (OD) region or an oxide diffusion (OD) region. In some embodiments, AR patterns 316A_2, 316A_3, and 316A_1 are within the first layer 340 (FIGS. 3C-3D) of layout diagram 302A. During fabrication of semiconductor device based on layout diagram 302A, instances of AR patterns 316A_2, 316A_3, and 316A_1 result in corresponding instances of ARs 316B_2, 316B_3 and 316B_1 (FIG. 3B)

Layout diagram 302A further includes imaginary reference lines 301A, 301B, 301C, 318A, 319A, and 320A, 332AT, and 332AB. In some embodiments, imaginary reference lines are orientation lines/tracks upon which the shapes and patterns of layout diagram 302A are positioned. Reference line 318A extends parallel to the Y-axis. Relative to the X-axis, AR patterns 316A_2 include ends which align with reference line 318A. In some embodiments, first side 310AR is parallel and proximal to reference line 318A and relative to reference line 320A extends parallel to the Y-axis. Relative to the X-axis, instances of AR pattern 316A_3 and selected instances of AR pattern 316A_2 include ends which align with reference line 320A. Second side 310AL is parallel and proximal to reference line 320A. In some embodiments, reference line 319A is a vertical central reference line for cell region 304A. In some embodiments, reference line 319A is a cell boundary between cell regions 304_AA and 304_AE, 304_AB and 304_AF, 304_AC and 304_AG, and 304_AD and 304_AH. In some embodiments, AR patterns 316A_3 extend from reference line 318A to 320A. In some embodiments, AR patterns 316A_3 are located correspondingly at the uppermost and lowermost portions of cell region 304A. Instances of AR patterns 316A_3 are a distance of S_½ from corresponding reference lines 332AT and 332AB.

Layout diagram 302A further includes a group 322A of gate patterns 315A. Gate patterns of group 322A correspondingly overlay the AR patterns 316A_2, 316A_3, and 316A_1. In some embodiments, gate patterns of group 322A are in a second layer 342 (FIGS. 3C-3D), e.g., a gate layer 396 (FIGS. 3C-3D). In some embodiments, second layer 342 is above first layer 340. In some embodiments, the gate layer 396 is in a third layer over a metal over diffusion layer (not shown) that is in second layer 342. In some embodiments, gate patterns of group 322A correspond to gate structures of group 322B (FIG. 3B).

In FIG. 3A, one of the gate patterns of group 322A is collinear with reference line 318A. Relative to the X-axis, all of the AR patterns 316A_2 extend away from reference line 319A toward reference line 318A such that the rightmost end of each AR patterns 316A_2 aligns with reference line 318A. Reference line 318A is parallel and proximal to first side 310AR of cell region 304A. In some embodiments, rightmost ends of fewer than all but nevertheless a first majority of AR patterns 316A_2 align with reference line 318A.

FIG. 3A further includes imaginary reference line 317A that extends parallel to the Y-axis. In FIG. 3A, one of the gate patterns of group 322A is collinear with reference line 317A. Relative to the X-axis, all of AR patterns 316A_2 extend away from reference line 318A toward reference line 319A such that the leftmost end of each AR pattern 316A_2 aligns with reference line 317A. In some embodiments, leftmost ends of fewer than all but nevertheless a second majority of AR patterns 316A_2 align with reference line 317A. In some embodiments, the first majority of AR patterns 316A_2 is the same as the second majority of AR patterns 316A_2.

In FIG. 3A, one of the gate patterns of group 322A is collinear with reference line 320A. Relative to the X-axis, all of AR patterns 316A_1 extend away from reference line 319A toward reference line 320A such that the leftmost end of each AR pattern 316A_1 aligns with reference line 320A. Reference line 320A is parallel and proximal to second side 310AL of cell region 304A. In some embodiments, leftmost ends of fewer than all but nevertheless a first majority of the AR patterns 316A_1 align with reference line 320A.

FIG. 3A further includes imaginary reference line 321A that extends parallel to the Y-axis. In FIG. 3A, one of the gate patterns of group 322A is collinear with reference line 321A. Relative to the X-axis, all of the AR patterns 316A_1 extend away from reference line 320A toward reference line 319A such that the rightmost end of each AR pattern 316A_1 aligns with reference line 321A. In some embodiments, rightmost ends of fewer than all but nevertheless a second majority of the AR patterns 316A_1 align with reference line 321A. In some embodiments, the first majority of AR patterns 316A_1 is the same as the second majority of AR patterns 316A_1.

In some embodiments, a first sub-group 323A_1 of gate patterns is between reference line 318A and first side 310AR, and a second sub-group 323A_2 of gate patterns is between reference line 320A and second side 310AL. In some embodiments, first side 310AR and second side 310AL represent portions of a cell boundary. In some embodiments, reference lines 318A and 320A represent portions of a cell boundary. In some embodiments, central reference line 319A represents portions of corresponding cell boundaries. In some embodiments, gate patterns of sub-group 323A_1 correspond to a cell boundary. In some embodiments, one of gate patterns of sub-group 323A_1 corresponds to a cell boundary.

In FIG. 3A, variations in the arrangement of n-well patterns 312A are contemplated. In some embodiments, relative to the X-axis: left ends of the instances of n-well patterns 312A underlying corresponding AR patterns 316A_1 and 316A_2 extend between the two gate patterns of sub-group 323A_2; right ends of the instances of n-well patterns 312A underlying corresponding AR patterns 316A_1 and 316A_2 extend between the two gate patterns of sub-group 323A_1.

In some embodiments, relative to the X-axis: left ends of the instances of n-well patterns 312A underlying corresponding AR patterns 316A_1 and 316A_2 extend beyond reference line 320A but not so far as to underlie any gate pattern of sub-group 323A_2; right ends of the instances of n-well patterns 312A underlying corresponding AR patterns 316A_1 and 316_2 extend beyond the gate pattern which overlies the right ends of the AR patterns 316A_1 and 316A_2 but not so far as to underlie any gate pattern of sub-group 323A_1.

Layout diagram 302A further includes FC patterns 324A extending relative to the Y-axis. Manufacture of a semiconductor device based on layout diagram 302A of FIG. 3A results in semiconductor device 302B of FIG. 3B, and more particularly, manufacture of a semiconductor device based on FC patterns 324A of FIG. 3A results in isolation dummy gates 344B of FIG. 3B. A given FC pattern 324A overlies a given portion of a corresponding gate pattern, and the given portion of the gate pattern overlies a portion of a corresponding AR pattern; the given portions of the gate pattern and the AR pattern represent intervening region 326A.

In some embodiments, relative to the Y-axis, a given region 326A in FIG. 3A is regarded as being intervening with respect to the corresponding gate pattern because given region 326A is between upper and lower portions of the corresponding gate pattern. The upper portion of the corresponding gate pattern does not underlie, i.e., is not covered by, a corresponding FC pattern 324A. The lower portion of the corresponding gate pattern does not underlie, i.e., is not covered by, corresponding FC pattern 324A. Accordingly, given region 326A is said to intervene between the uncovered upper and lower portions of the corresponding gate pattern. In some embodiments, relative to the Y-axis, a size of given region 326A is smaller than corresponding FC pattern 324A. In some embodiments, relative to the Y-axis, the size of given region 326A is about the same as corresponding FC pattern 324A.

It is to be recalled that intervening regions in FIG. 3A correspond to intervening regions 326B in FIG. 3B. Similarly, in some embodiments, relative to the Y-axis, a given region 326B in FIG. 3B is regarded as being intervening with respect to the corresponding gates because given region 326B is between an upper gate and a lower gate. Given region 326B is occupied by a corresponding isolation dummy gate 344B, wherein corresponding isolation dummy gate 344B separates the upper gate from the lower gate relative to the Y-axis. In some embodiments, relative to the Y-axis, a size of given region 326B is smaller than corresponding isolation dummy gate 344B. In some embodiments, relative to the Y-axis, the size of given region 326B is about the same as corresponding isolation dummy gate 344B.

In some embodiments, relative to the X-axis, a given region 326A in FIG. 3A is regarded as being intervening with respect to the corresponding AR pattern because given region 326A is between a left portion and a right portion of the corresponding AR pattern. The left portion of the corresponding AR pattern does not underlie, i.e., is not covered by, a corresponding FC pattern 324A. The right portion of the corresponding AR pattern does not underlie, i.e., is not covered by, corresponding FC pattern 324A. Accordingly, given region 326A is said to intervene between the uncovered left and right portions of the corresponding AR pattern. In some embodiments, relative to the X-axis, a size of given region 326A about the same as corresponding FC pattern 324A. In some embodiments, relative to the Y-axis, the size of given region 326A is smaller than corresponding FC pattern 324A.

It is to be recalled that intervening regions in FIG. 3A correspond to intervening regions 326B in FIG. 3B. Similarly, in some embodiments, relative to the X-axis, a given region 326B in FIG. 3B is regarded as being intervening with respect to the corresponding ARs because given region 326B is between a left AR and a right AR. Given region 326B is occupied by a corresponding isolation dummy gate 344B, wherein corresponding isolation dummy gate 344B separates the left AR from the right AR relative to the Y-axis. Accordingly, such left and right ARs are examples of ARs that are not fully projected. In some embodiments, relative to the X-axis, an instance of isolation dummy gate 344B found between left and right ARs is referred to as an interior isolation dummy gate 344B. By contrast, in such embodiments, an instance of isolation dummy gate 344B that is not between corresponding left and right ARs of the same cell region is referred to as an exterior isolation dummy gate 344B. In such embodiments, relative to the X-axis, an exterior isolation dummy gate 344B is found at or near a boundary of the corresponding cell region and is adjacent to a left AR or to a right AR but is not adjacent to both a left and right AR of the same cell region. In some embodiments, relative to the X-axis, a size of given region 326B is about the same as corresponding isolation dummy gate 344B. In some embodiments, relative to the X-axis, the size of given region 326B is smaller than corresponding isolation dummy gate 344B.

In some embodiments, FC patterns 324A extend in the third direction perpendicular to each of the first and second directions. In FIG. 3A, the third direction is parallel to the Z-axis (not shown in FIG. 3A). More particularly, in some embodiments, FC patterns 324A extend from first layer 340 to second layer 342. In some embodiments, FC patterns 324A extend from first layer 340 to the third layer. In some embodiments, FC patterns 324 extend from substrate layer 390 through the n-well layer 392 (FIGS. 3C-3D), through the AR layer 394, and through the gate layer 396. Other FC pattern configurations, arrangements on other layout levels or quantities of FC patterns 324A are within the scope of the present disclosure.

In some embodiments, each FC pattern 324A designates a future separation or break between corresponding AR patterns 316A_2 and 316A_1 and one or more gate patterns in group 322A. In some embodiments, each FC pattern 324A is a precursor of a corresponding interior isolation dummy gate 344B. FC patterns 324A are positioned between each of AR pattern 316A_2 and 316A_1. In some embodiments, FC patterns 324A are, relative to the X-axis, less than 16 in width. FC patterns 324A overlay one or more gate patterns in group 322A located at the junction of AR patterns 316A_2 and 316A_1.

In some embodiments, layout diagram 302A includes LL sections which are AR patterns 316A_2 and 316A_3. In some embodiments, HL sections are AR patterns 316A_1. In some embodiments, AR patterns 316A_2 and 316A_3 are configured with a height H_1 that facilitates current leakage below a predetermined threshold. In some embodiments, AR patterns 316A_1 are configured with a height that is greater than the height of AR patterns 316A_2 and supports switching speeds within a predetermined threshold. In some embodiments, AR patterns 316A_1 are considered HL sections individually. In some embodiments, AR patterns 316A_2 and 316A_3 are considered LL sections individually. In some embodiments, relative to the Y-axis, AR patterns 316A_1 are three times as large as AR patterns 316A_2 and 316A_3.

Relative to the X-axis, ARs 316A_1 and selected AR patterns 316A_2 are overlied by corresponding FC patterns 324A. A long axis of FC patterns 324A extends relative to the Y-axis from a first end of a gate pattern 322A to another end or second end of the same gate pattern 322A. Corresponding AR patterns 316A_2 and 316A_3 are separated from each other by corresponding gaps 328A having a distance S_1. AR patterns 316A_1 are separated from each other by corresponding gaps 330A having a distance S_3. AR patterns 316A_2 are separated from AR patterns 316A_1 by corresponding gaps 329A having a distance S_2. In some embodiments, gaps 328A, 329A and 330A are configured with the same height. In some embodiments, gaps 328A, 329A and 330A are configured with different heights. In some embodiments, distances S_1, S_2, and S_3 are determined by design rules of the corresponding semiconductor process technology node. In some embodiments, $S\_1 \leq S\_2 \leq S\_3$.

Uppermost and lowermost AR patterns 316A_3 are separated from corresponding reference lines 332AT and 332AB by a distance of S_½. In some embodiments, AR patterns 316A_2 and 316A_1 within n-well patterns 312A are configured to be p-type diffusion material and support p-channel metal oxide semiconductors (PMOSs). In some embodiments, AR patterns 316A_2, 316A_3, and 316A_1 outside of n-well patterns 312A are configured to be n-type diffusion material and support n-channel metal oxide semiconductors (NMOSs).

Due to each of FC patterns 324A, each of AR patterns 316A_1 and 316A_2 in FIG. 3C is without full projection. As no instances of FC pattern 324A is associated with either instance of AR pattern 316A_3, each instance of AR pattern 316A_3 is with full projection, i.e., is fully projected between left side 310AL and right side 310AR of cell region 304A.

FIG. 3B is a plan view of a semiconductor device 302B, in accordance with some embodiments.

Semiconductor device 302B is an example of semiconductor device 102 and is configured to be used within IC 100. In some embodiments, semiconductor device 302B is fabricated from a photolithographic process using layout diagram 302A. In some embodiments, cell region 304B is an example of cell region 104. Cell regions 304_BA, 304_BB, 304_BC, 304_BD, 304_BE, 304_BF, 304_BG, and 304_BH of FIG. 3B correspond to cell regions 304A, 304_AA, 304_AB, 304_AC, 304_AD, 304_AE, 304_AF, 304_AG, and 304_AH. In some embodiments, ARs 316B_1 are HL sections, e.g., HL section 106. In some embodiments, ARs 316B_2 and 316B_3 are LL sections, e.g., LL section 108.

Cell region 304B is configured with isolation dummy gates 344B and intervening regions 326B. More particularly, isolation dummy gates 344B occupy corresponding intervening regions 326B. In some embodiments, at least selected portions of selected ones of the gate electrodes that correspondingly align with reference lines 318B and 320B are replaced with corresponding isolation dummy gates, wherein the selected portions otherwise would overlie corresponding ends of corresponding ARs. In such embodiments, in the context of cell region 304B, isolation dummy gates 344B are referred to as interior isolation dummy gates whereas and the isolation dummy gates which replace the selected portions of the selected gate structures are referred to as exterior isolation dummy gates. In some embodiments, not only selected portions but entireties of the selected gate electrodes that correspondingly align with reference lines 318B and 320B are replaced with corresponding isolation dummy gates.

Semiconductor device 302B includes a cell region 304B including ARs 316B_2, 316B_3, and 316B_1 extending parallel to X-axis. Relative to an imaginary central reference line 319B extending parallel to the Y-axis, cell region 304B is arranged so that central reference line 319B is located centrally within cell region 304B relative to X-axis. Relative to an imaginary first reference line 318B extending parallel to the Y-axis, first end portions of two or more of ARs 316B_2 and 316B_3 extend a distance in X-axis from central reference line 319B to first reference line 318B. A first edge 310BR of cell region 304B being parallel and proximal to first reference line 318B. Relative to an imaginary second reference line 320B extending parallel to the Y-axis, second end portions of two or more of active regions 316B_2 and 316B_3 extend a distance from central reference line 319B to second reference line 320B. A second edge 310BL of cell region 304B is parallel and proximal to second reference line 320B. Second edge 310BL is on an opposite side of cell region 304B relative first edge 310BR. Corresponding instances of ARs 316B_2, and corresponding instances of ARs 316B_1, have corresponding long axes parallel to the X-axis which are collinear. Corresponding instances of AR 316B_2 and 316B_1 are separated by corresponding instances of intervening region 326B.

Regarding FIG. 3B, in some embodiments, regarding instances of AR 316B_2 that extend to the right of reference line 319B, rightmost ends of fewer than all but nevertheless a first majority of the same align with reference line 318B. In some embodiments, regarding instances of AR 316B_2 that extend to the left of reference line 319B, leftmost ends of fewer than all but nevertheless a second majority of the same align with reference line 320B. In some embodiments, the first majority is the same as the second majority.

In FIG. 3B, all instances of AR 316B_2 are not fully projected, and all instances of AR 316B_1 are not fully projected. In some embodiments, fewer than all but nevertheless a majority of the instances of AR 316B_2 are not fully projected. In some embodiments, fewer than all but nevertheless a majority of the instances of AR 316B_1 are not fully projected. Also in FIG. 3B, all instances of AR 316B_3 are fully projected. Regarding Intervening regions 326B, which are occupied in FIG. 3B by corresponding instances of isolation dummy gate 344B, some (but not necessarily all) are located so as to align with other instances of isolation dummy gate 344B relative to the X-axis. In some embodiments, the removal of portions of corresponding gate structures in group 322B and corresponding portions of ARs 316B_1 and 316B_2 (so as to implement a less than fully-projected AR) is applied to FinFET, nanosheet FET technology, gate-all-around technology, or the like. Thus, cell region 304B does not have a fully projected set of ARs.

Semiconductor device 302B is configured with isolation dummy gates 344B that occupy corresponding intervening regions 326B. Each instance of AR 316B_2 and AR 316B_3 has a height H_1, and each instance of AR 316B_1 has a height of H_3 relative to the Y-axis. In some embodiments, selected instances of AR 316B_1 have corresponding long axes that are parallel to the X-axis and that are collinear. Selected instances of AR 316B_2 and corresponding instances of AR 316B_1 are separated by corresponding instances of isolation dummy gate 344B that occupy corresponding instances of intervening region 326B. Due to each of isolation dummy gates 344B, each of ARs 316B_1 and 316B_2 in FIG. 3B is without full projection. As no instances of isolation dummy gate 344B is associated with either instance of AR 316B_3, each instance of AR 316B_3 is with full projection, i.e., is fully projected between the left and right sides of cell region 304B.

FIGS. 3C-3D are corresponding cross-sectional diagrams of the semiconductor device 302B of FIG. 3B, in accordance with some embodiments.

The cross-sectional diagram of FIG. 3C corresponds to sectional line 3C-3C' in FIG. 3B. Among other structures, each of FIGS. 3C-3D shows substrate layer 390 which includes substrate 314B. Relative to the X-axis, a width of a given instance of intervening region 326B depends upon the structures between which the given instance of intervening region 326B is positioned, i.e., intervenes.

In FIG. 3C, there are two instances of intervening region 326B between corresponding instances of AR 316B_2. Accordingly, each of the two instances of intervening region 326B in FIG. 3C is wider than a single instance of isolation dummy gate 344B. More particularly, each of the two instances of intervening region 326B in FIG. 3C is wider than two instances of isolation dummy gate 344B. Each of the two instances of intervening region 326B in FIG. 3C is partially occupied by the two corresponding instances of isolation dummy gate 344B. Yet more particularly, each of the two instances of intervening region 326B in FIG. 3C has a width equal to or greater than about 3δ.

In FIG. 3D, there are two instances of intervening region 326B between corresponding pairs of an instance of AR 316B_2 and an instance of AR 316B_1. Accordingly, each of the two instances of intervening region 326B in FIG. 3D is substantially the same width as a single instance of isolation dummy gate 344B. Each of the two instances of intervening region 326B in FIG. 3D is substantially fully occupied by the corresponding single instance of isolation dummy gate 344B.

Figure 4A:
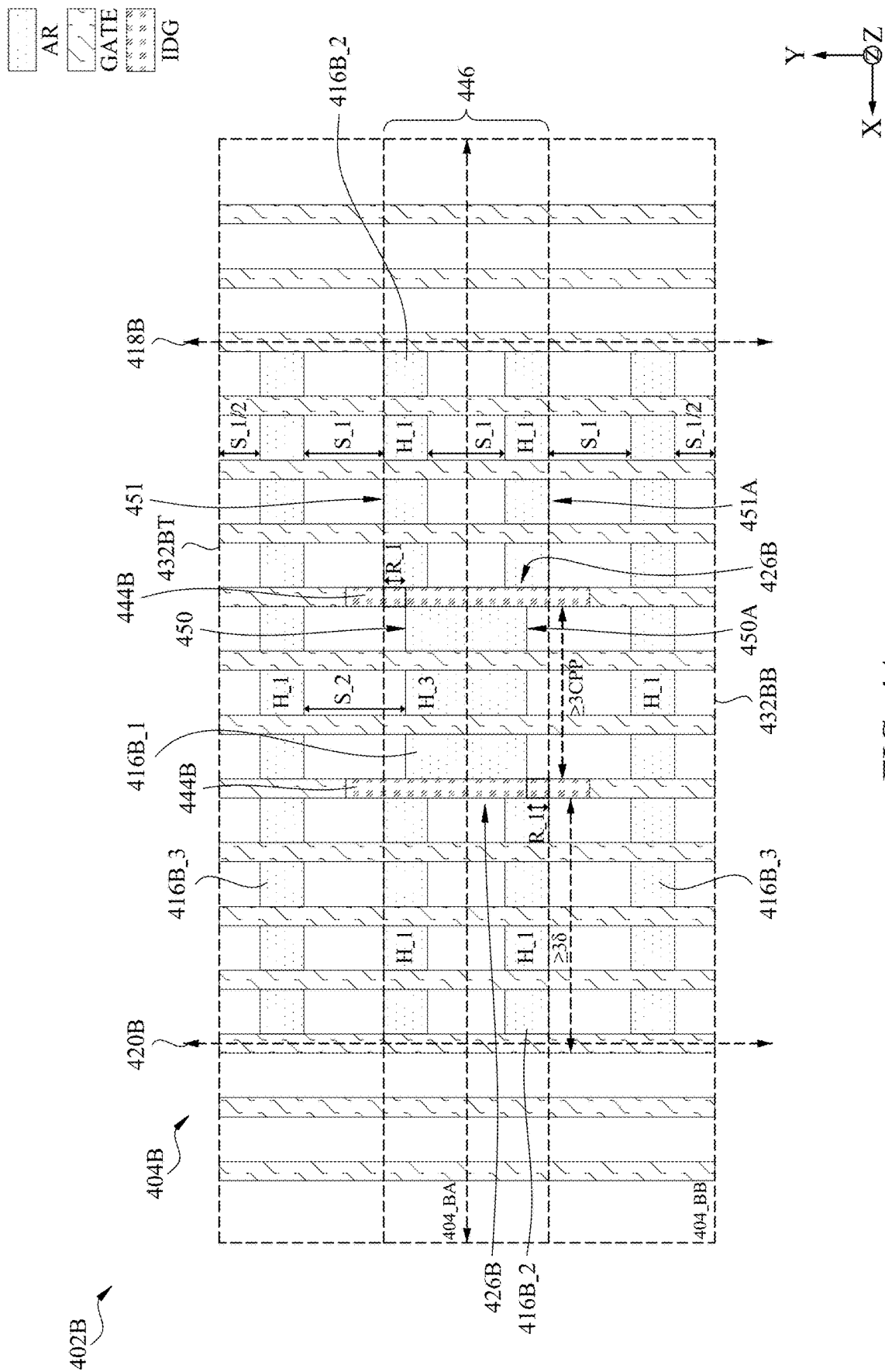
FIGS. 4A, 4B, 4C, 4D, and 4E are plan views of a semiconductor device, in accordance with some embodiments.

FIG. 4A is a plan view of a semiconductor device 402B, in accordance with some embodiments.

Semiconductor device 402B is an example of semiconductor device 102. In some embodiments, semiconductor device 402B is configured to be used within IC 100. Semiconductor device 402B is a variation of semiconductor device 302B of FIG. 3B. In some embodiments, cell region 404B is an example of cell region 104. In some embodiments, AR 416B_1 is included in an HL section, e.g., HL section 106. In some embodiments, ARs 416B_2 and 416B_3 are included in corresponding LL sections, e.g., LL section 108. For purposes of clarity and brevity, reference to n-wells within the cell regions is left out. However, it is understood the cell regions include n-well structures in some embodiments.

In FIG. 4A, cell region 404B includes cell regions 404_BA and 404_BB. Cell region 404B includes ARs 416B_2 and 416B_3, and a portion of AR 416B_1. Corresponding pairs of an instance of AR 416B_2 and a corresponding portion of AR 416B_1 are separated by corresponding portions of corresponding isolation dummy gates 444B. At least some of intervening regions 426B are occupied by corresponding portions of isolation dummy gates 444B. Cell region 404B includes upper and lower ARs 416B_3 that extend correspondingly from first imaginary reference line 418B to second imaginary reference line 420B. In some embodiments, the upper and lower ARs 416B_3 have different heights (see FIG. 13). Each of ARs 416B_2 and 416B_3 has height H_1, whereas AR 416B_1 has height H_3, and where H_1<H_3.

AR 416B_1 and instances of AR 416B_2 are grouped into a set 446 of ARs. In some embodiments, set 446 of ARs are in an I-shape or an I-frame with two or more upper ARs 416B_2 forming the upper horizontal portion of the I-frame, centrally located AR 416B_1 forming the vertical portion of the I-frame, and two or more lower ARs 416B_2 forming the lower horizontal portion of the I-frame. In some embodiments, this I-frame structure is common to AR sets, such as AR set 446.

Relative to the Y-axis, upper edge 450 of AR 416B_1 extends upward and aligns with a middle portion of upper ARs 416B_2 but within a range R_1 of an uppermost edge 451 of upper ARs 416B_2. For purposes of discussion of the present disclosure, ranges are referenced in the form R_X, where X is a non-negative integer. Upper edge 450 extends above a lower edge of AR 416B_2 but does not extend above an upper edge 451 of AR 416B_2.

Regarding FIG. 4A, when a viewer scans parallel to the X-axis from left to right in FIG. 4A, upper edge 451 of upper ARs 416B_2 and upper edge 450 of AR 416B_1 form a first profile. The first profile varies in position relative to the Y-axis as the viewer's point of focus is moved from left to right parallel to the X-axis. Relative to the Y-axis and looking from a perspective of a central region of AR 416B_1, the first profile is described as concave towards a central location in cell region 402B, wherein upper edge 450 of AR 416B_1 is recessed below upper edge 451 of upper ARs 416B_2. Accordingly, AR set 446 is described as a non-fully projected, concave arrangement of ARs.

Figure 4B:
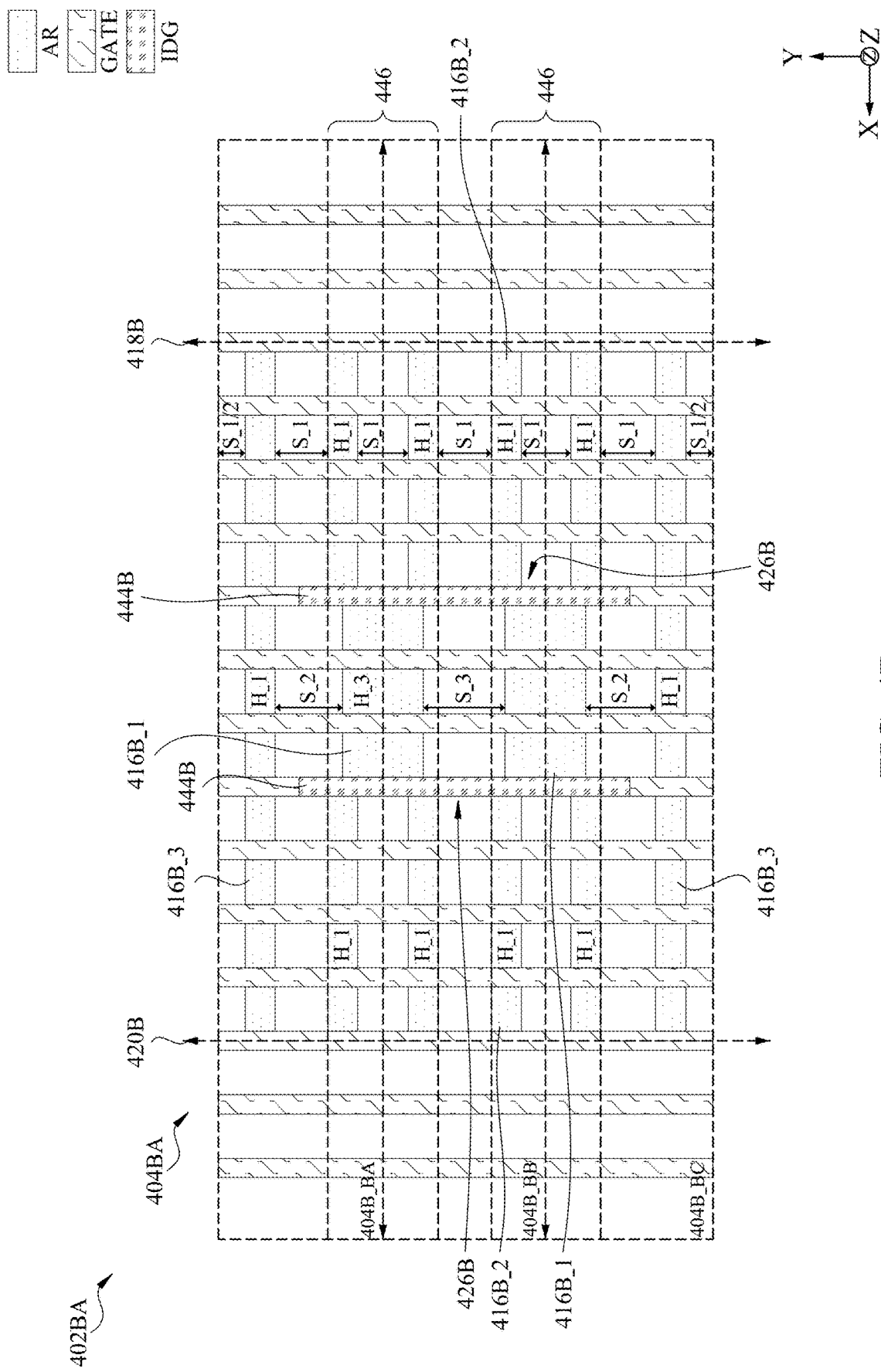

Also regarding FIG. 4B, when the viewer scans parallel to the X-axis from left to right in FIG. 4A, lower edge 451A of lower ARs 416B_2 and lower edge 450A of AR 416B_1 form a second profile. The second profile varies in position relative to the Y-axis as the viewer's point of focus is moved from left to right parallel to the X-axis. Relative to the Y-axis and looking from the perspective of the central region of AR 416B_1, the second profile is described as concave towards the central location in cell region 402B, wherein lower edge 450A of AR 416B_1 is recessed above lower edge 451A of lower ARs 416B_2. Accordingly, AR set 446 is described as a non-fully projected, concave arrangement of ARs.

In FIG. 4A, a first distance between upper edge 450 of AR 416B_1 and upper edge 451 of upper ARs 416B_2 of set 446 is substantially the same as a second distance between lower edge 450A of AR 416B_1 and lower edge 451A of lower ARs 416B_2 of set 446. In some embodiments, the first distance between upper edge 450 of AR 416B_1 and upper edge 451 of upper ARs 416B_2 of set 446 is different than the second distance between lower edge 450A of AR 416B_1 and lower edge 451A of lower ARs 416B_2 of set 446.

Cell region 404B is configured according to design rules (3) and (4) to satisfy DRC.

$$S\_1 \leq H\_3 \leq S\_1 + 2 \cdot H\_1 \quad \text{rule (3)}$$

$$S\_1 \leq S\_2 \leq S\_1 + H\_1 \quad \text{rule (4)}$$

In FIG. 4A, S_1 is the distance between two instances of AR 416B_2, and the distance between an instance of AR_416B and a corresponding instance of AR 416B_2. In FIG. 4A, S_1 is less than or equal to height H_3 of AR 416B_1. Height H_3 is less than or equal twice the height H_1 plus the distance S_1. In FIG. 4A, relative to the X-axis, the widths of ARs 416B_2 are equal to or greater than about 3δ, and the width of AR 416B_1 is equal to or greater than about 3δ. In some embodiments, other suitable heights and widths of ARs 416B_2, 416B_3 and 416B_1 are within the contemplated scope of the disclosure.

FIGS. 4B-4E are plan views of a semiconductor devices 402BA, 402BB, 402BC, and 402BD in accordance with some embodiments.

Semiconductor devices 402BA, 402BB, 402BC, and 402BD of corresponding FIGS. 4B-4E are variations of semiconductor device 402B of FIG. 4A. Discussion of FIGS. 4B-4E is limited to the differences between semiconductor device 402B and semiconductor devices 402BA, 402BB, 402BC, and 402BD for the sake of brevity, conciseness, and to reduce repetitiveness. Like elements retain their reference number while new or different elements are called out with different reference numbers.

In FIG. 4B, cell region 404BA includes two sets 446 of ARs. Cell region 404BA includes cell regions 404_BA, 404_BB, and 404_BC. Each of cell regions 404_BA and 404_BC includes ARs 416B_2 and 416B_3, and portions of AR 416B_1. Cell region 404_BB includes ARs 416B_2 and portions of ARs 416B_1. An instance of AR 416B_1 extends from cell region 404_BB into cell region 404_BA. Another instance of AR 416B_1 extends from cell region 404_BB into cell region 404_BC.

Cell region 404BA is configured according to design rules (3) (4) noted above, and (5) to satisfy DRC.

$$S\_1 \leq S\_3 \leq S\_1 + 2H\_1 \quad \text{rule (5)}$$

In some embodiments, a height of each of cell regions 404_BA, 404_BB and 404_BC is defined by design rule (6) or (7) or (8).

$$2 \cdot S_1 + 2 \cdot H\_1 \quad \text{rule (6)}$$

$$\tfrac{1}{2} S\_1 + S\_2 + H_1 + \tfrac{1}{2} H\_3 \quad \text{rule (7)}$$

$$S\_3 + H\_3 \quad \text{rule (8)}$$

Figure 4C:
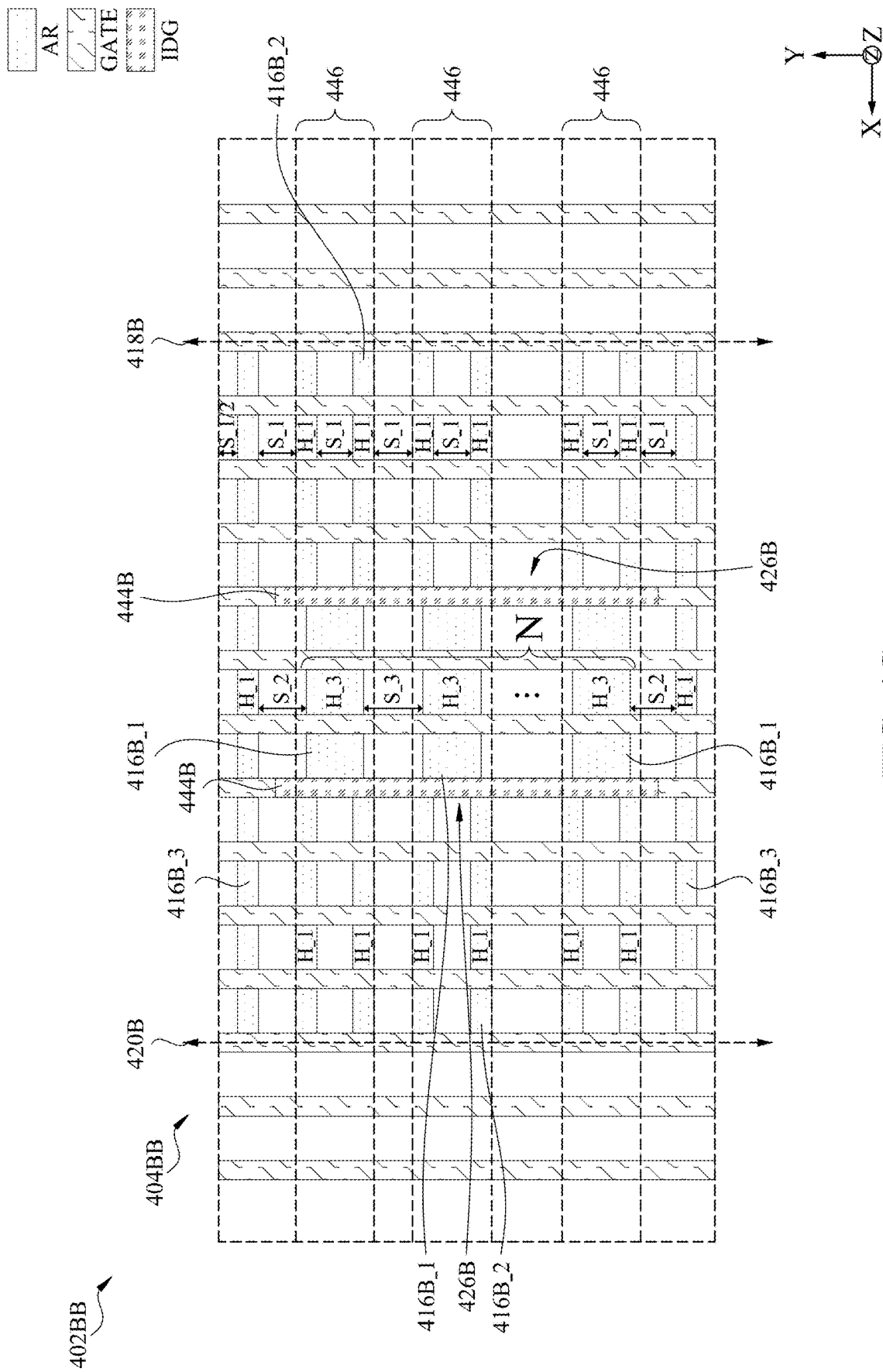

In FIG. 4C, cell region 404BB includes N sets 446 of ARs (where N is a non-negative integer). In FIG. 4C, each set 446 of ARs includes one instance of AR 416B_1 and four corresponding instances of AR 416B_2. In FIG. 4C, N≤3.

Figure 4D:
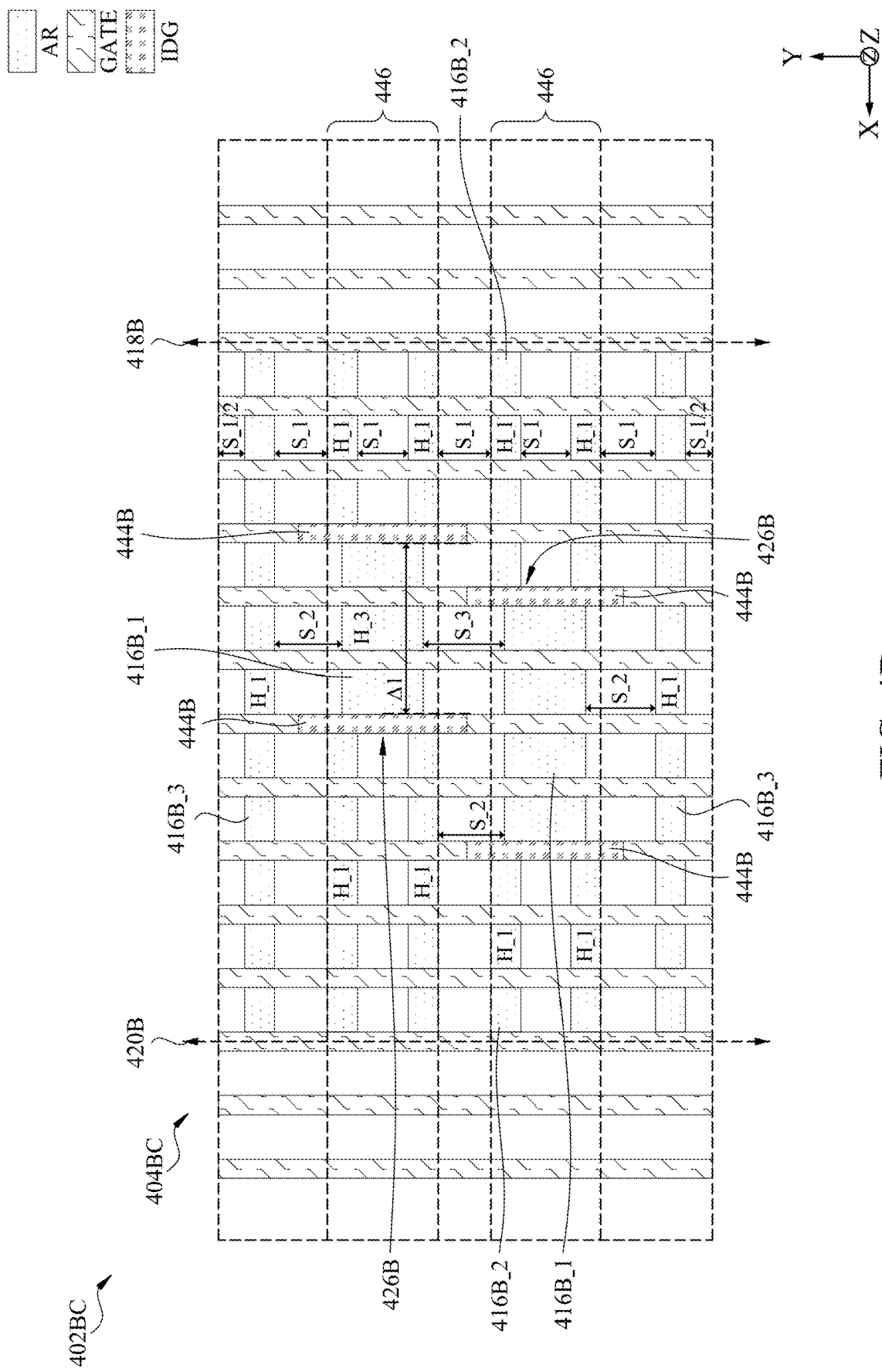

FIG. 4D is similar to FIG. 4B. In FIG. 4D, cell region 404BC includes two sets of ARs 446 where instances of ARs 416B_1 are configured with different widths (e.g., lower AR 416B_1 is configured with a width of about 4δ and upper AR 416B_1 is configured with a width of about 3δ). In some embodiments, other suitable positions of the various instances of AR 416B_1 are within the contemplated scope of the disclosure. Relative to the X-axis, ARs 416B_1 overlap by a distance Δ1 relative to the X-axis. In some embodiments, Δ1 is a distance greater than zero and up to and including the smallest width of any instance of AR 416B_1.

Figure 4E:
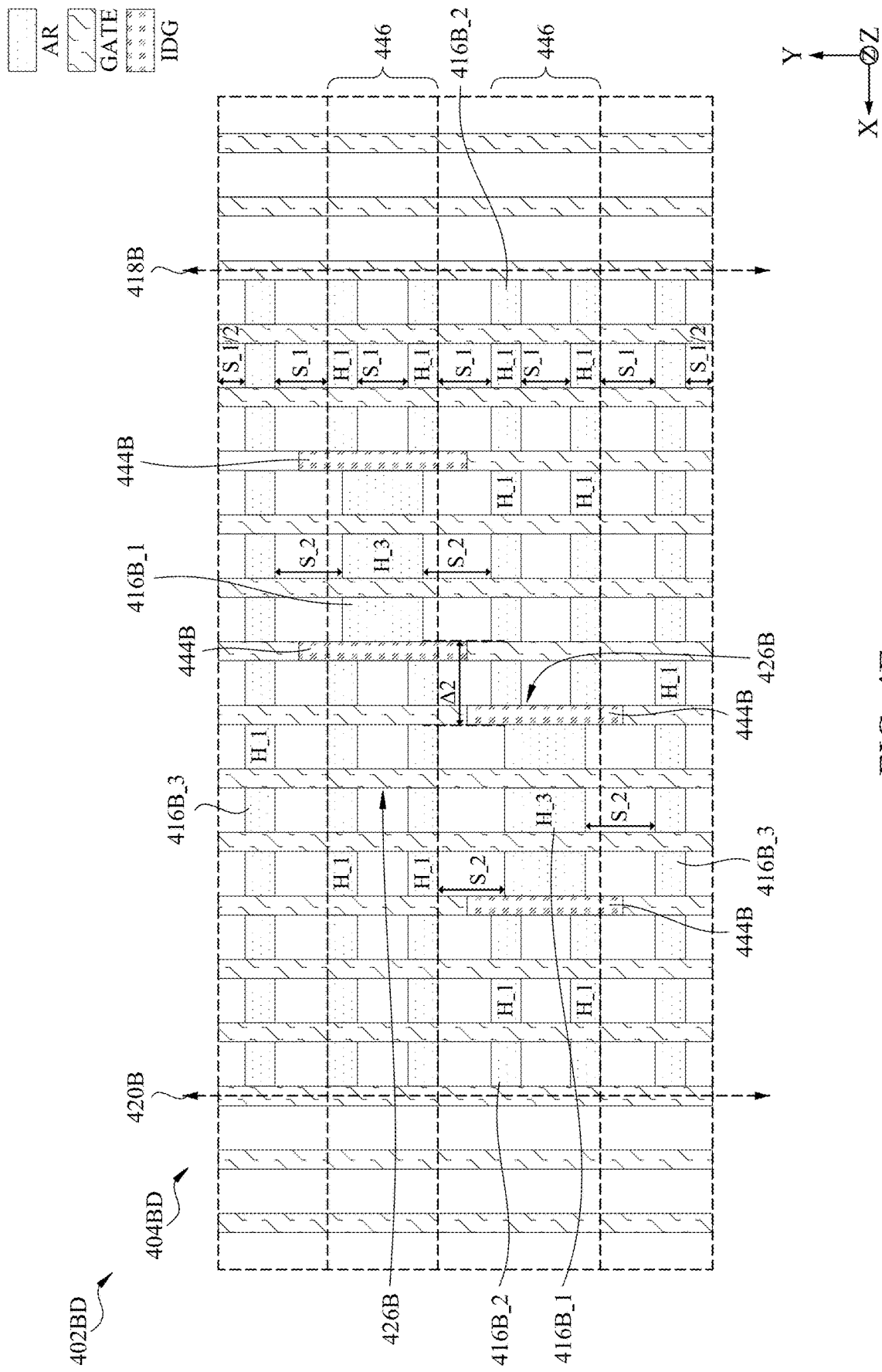

FIG. 4E is similar to FIG. 4B. In FIG. 4E, relative to the X-axis, ARs 416B_1 are offset from one another by a distance Δ2 and so do not overlap each other relative to the X-axis. In some embodiments, Δ2 is greater than zero and less than the width of AR 416B_3 minus the sum of the widths of both ARs 416B_1 (e.g., ≥7δ).

Figure 5A:
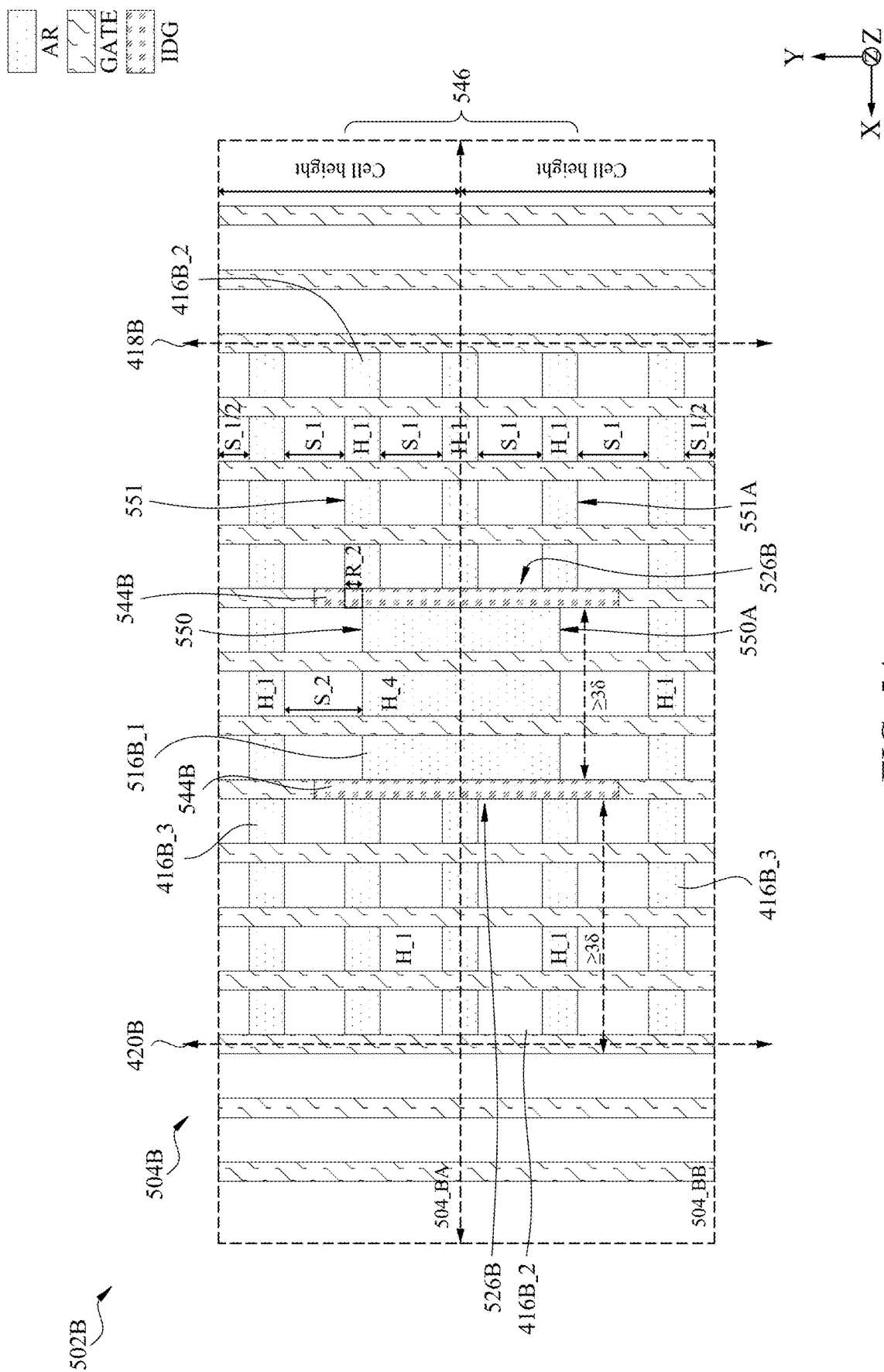
FIGS. 5A, 5B, 5C, 5D, and 5E are plan views of a semiconductor device, in accordance with some embodiments.

FIG. 5A is a plan view of a semiconductor device 502B, in accordance with some embodiments.

Semiconductor device 502B is an example of semiconductor device 102 and is configured to be used within IC 100. In some embodiments, cell region 504B is an example of cell region 104. In some embodiments, AR 516B_1 is an HL section, e.g., HL section 106. In some embodiments, ARs 416B_2 and 416B_3 are LL sections, e.g., LL section 108.

Semiconductor devices 502B, 502BA, 502BB, 502BC, and 502BD are variations of semiconductor device 402B of FIG. 4A. Discussion of FIGS. 5A-5E is limited to the differences between semiconductor device 402B and semiconductor devices 502B, 502BA, 502BB, 502BC, and 502BD of FIGS. 5A-5E for the sake of brevity, conciseness, and to reduce repetitiveness. Like elements retain their reference number while new or different elements are called out with different reference numbers.

In FIG. 5A, cell region 504B includes cell regions 504_BA and 504_BB. Each of cell regions 504_BA and 504_BB includes ARs 416B_2 and 416B_3, and a portion of AR 516B_1. Cell region 504B includes upper and lower ARs 416B_3, each of which extends from first imaginary reference line 418B to second imaginary reference line 420A. Each of ARs 416B_2 and 416B_3 has height of H_1, AR 516B_1 has a height H_4, and wherein H_1<H_4. In some embodiments, H_3 (FIGS. 4A-4E) is less than H_4, i.e., H_3<H_4.

In FIG. 5A, ARs 416B_2 and AR 516B_1 are grouped into a set 546 of ARs. In some embodiments, set 546 of ARs form an I-shape or an I-frame with two or more upper ARs 416B_2 forming the upper horizontal portion of the I-frame, a AR 516B_1 forming the vertical portion of the I-frame, and two or more lower ARs 416B_2 forming the lower horizontal portion of the I-frame.

In FIG. 5A, relative to the Y-axis, upper edge 550 of AR 516B_1 extends upward to align with a middle portion of upper ARs 416B_2 and is within a range R_2 of an upper edge 551 of upper ARs 416B_2. Relative to the Y-axis, lower edge 550A of AR 516B_1 extends downward to align with a middle portion of lower ARs 416B_2 and is within a range R_2 of a lower edge 551A of lower ARs 416B_2. In FIG. 5A, AR set 546 is a concave arrangement of ARs along upper edge 550 and upper edge 551 and is a concave arrangement of ARs along lower edge 550A and lower edge 551A. In some embodiments, this concave AR set 546 is an arrangement of ARs that is without full projection of all ARs. Cell region 504B is without full projection of all ARs. In FIG. 5A, relative to the Y-axis, AR 516B_1 arranged symmetrically with respect to ARs 416B_2. In some embodiments, relative to the Y-axis, AR 516B_1 is arranged asymmetrically with respect to ARs 416B_2 (e.g., FIGS. 7A-7B, 8A-8B, 9A-9B, 10A-10B, 11A-11B, 12A-12B, 13A-13B, 14, or the like).

Cell region 504B is configured according to design rules (9) and (10) to satisfy DRC.

$$2 \cdot S\_1 + H\_1 \leq H\_4 \leq 2 \cdot S\_1 + 3 \cdot H\_1 \qquad \text{rule (9)}$$

$$S\_1 \leq S\_2 \leq S\_1 + H\_1 \qquad \text{rule (10)}$$

Twice the distance S_1 between ARs 416B_2 combined with the height H_1 of AR 416B_2 is less than or equal to the height H_4 of AR 516B_1 that is less than or equal three times the height H_1 of AR 416B_2 combined with twice the distance S_1 between ARs 416B_2. In some embodiments, two and a half times the height H_1 combined with two and a half times the distance S_1 corresponds to a cell region height, such as cell region 504_BA. In some embodiments, a cell region height is larger than or equal to the height of the largest AR in the cell (e.g., AR 516B_1), which is larger than or equal to the distance between the smallest ARs (e.g., ARs 416B_2 and 416B_3) in cell region 504B or the smallest distance in cell region 504B (i.e., S_1). In some embodiments, S_1 is the minimum distance between ARs 416B_2 and 416B_3 in cell region 504B. In FIG. 5A, relative to the X-axis, ARs 416B_2 are 46 in width, and AR 516B_1 is 36 in width. In some embodiments, the width of AR 516B_1 is greater than 36. In some embodiments, other suitable heights and widths of ARs 416B_2, 416B_3 and 516B_1 are within the contemplated scope of the disclosure FIGS. 5B-5E are plan views of a semiconductor devices 502BA, 502BB, 502BC, and 502BD in accordance with some embodiments.

Semiconductor devices 502BA, 502BB, 502BC, and 502BD of corresponding FIGS. 5B-5E are variations of semiconductor device 502B of FIG. 5A. Discussion of FIGS. 5B-5E is limited to the differences between semiconductor device 502B and semiconductor devices 502BA, 502BB, 502BC, and 502BD for the sake of brevity, conciseness, and to reduce repetitiveness. Like elements retain their reference numbers while new or different elements are called out with different reference numbers.

Figure 5B:
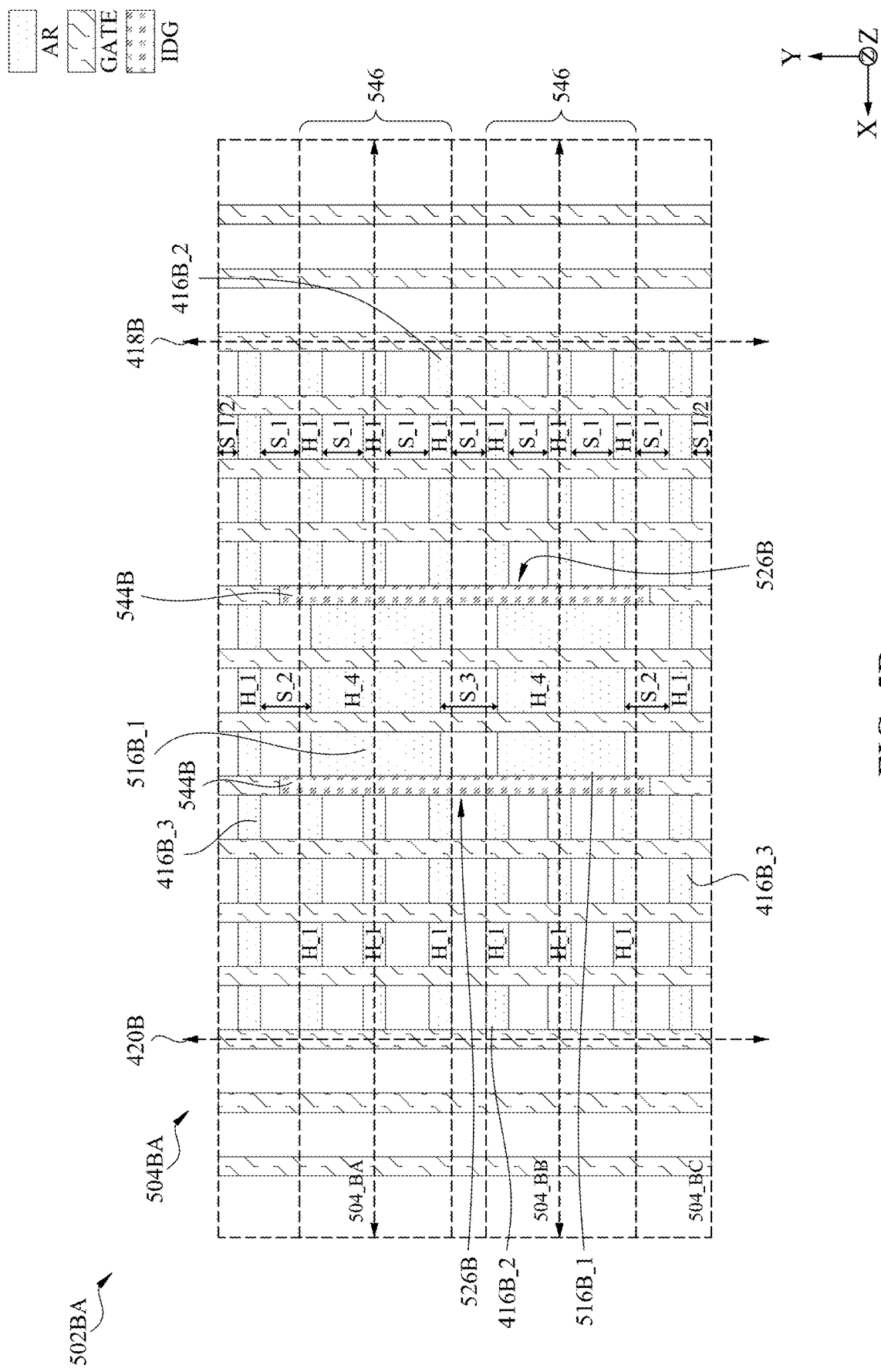

In FIG. 5B, cell region 504BA includes two sets of ARs 546. Cell region 504BA includes cell regions 504_BA, 504_BB, and 504_BC. Each of cell regions 504_BA and 504_BC includes two whole AR 416_B2, two half AR 416B_2, one AR 416B_3, and a half of AR 516B_1. Cell region 504_BB includes four whole ARs 416B_2, four half ARs 416B_1, and two half ARs 516B_1. The upper instance of AR 516B_1 extends from cell region 504_BB into cell region 504_BA. The lower instance of AR 516B_1 extends from cell region 504_BB into cell region 504_BC.

Cell region 504BA is configured according to design rules (9), (10) and (11) to satisfy DRC.

$$S\_1 \leq S\_3 \leq S\_1 + 2 \cdot H\_1 \qquad \text{rule (11)}$$

In some embodiments, a height of each of cell regions 504_BA, 504_BB and 504_BC is defined by design rules (12) or (13) or (14).

$$2\tfrac{1}{2} \cdot S_1 + 2\tfrac{1}{2} \cdot H\_1 \qquad \text{rule (12)}$$

$$\tfrac{1}{2} S\_1 + S\_2 + H_1 + \tfrac{1}{2} H\_4 \qquad \text{rule (13)}$$

$$S\_3 + H\_3 \qquad \text{rule (14)}$$

Figure 5C:
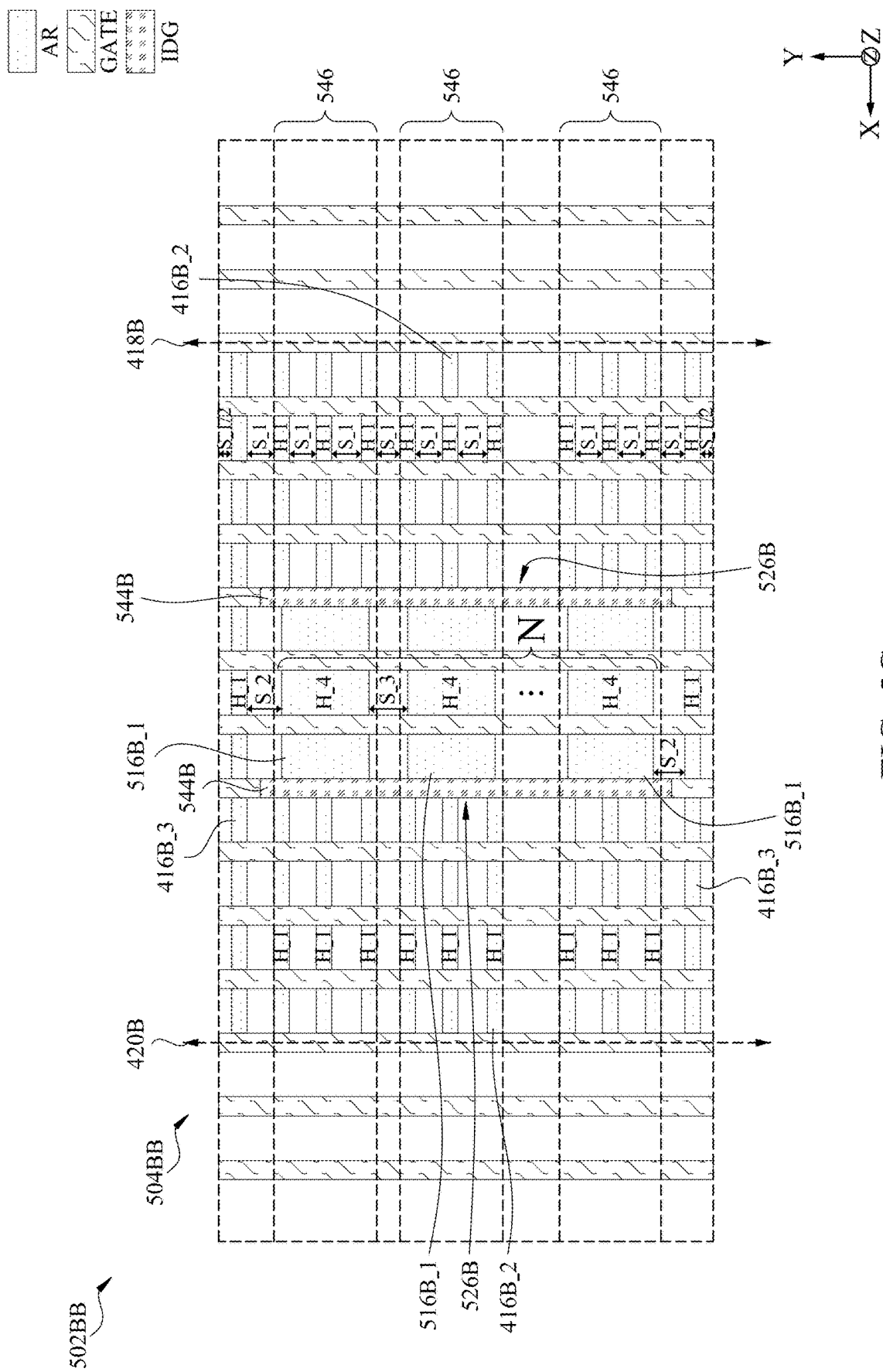

In FIG. 5C, cell region 504BB includes N sets of ARs 546 (where N is a non-negative integer). In FIG. 5C, each set 546 of ARs includes one instance of AR 516B_1 and six corresponding instances of AR 416B_2. In FIG. 5C, N≥3.

Figure 5D:
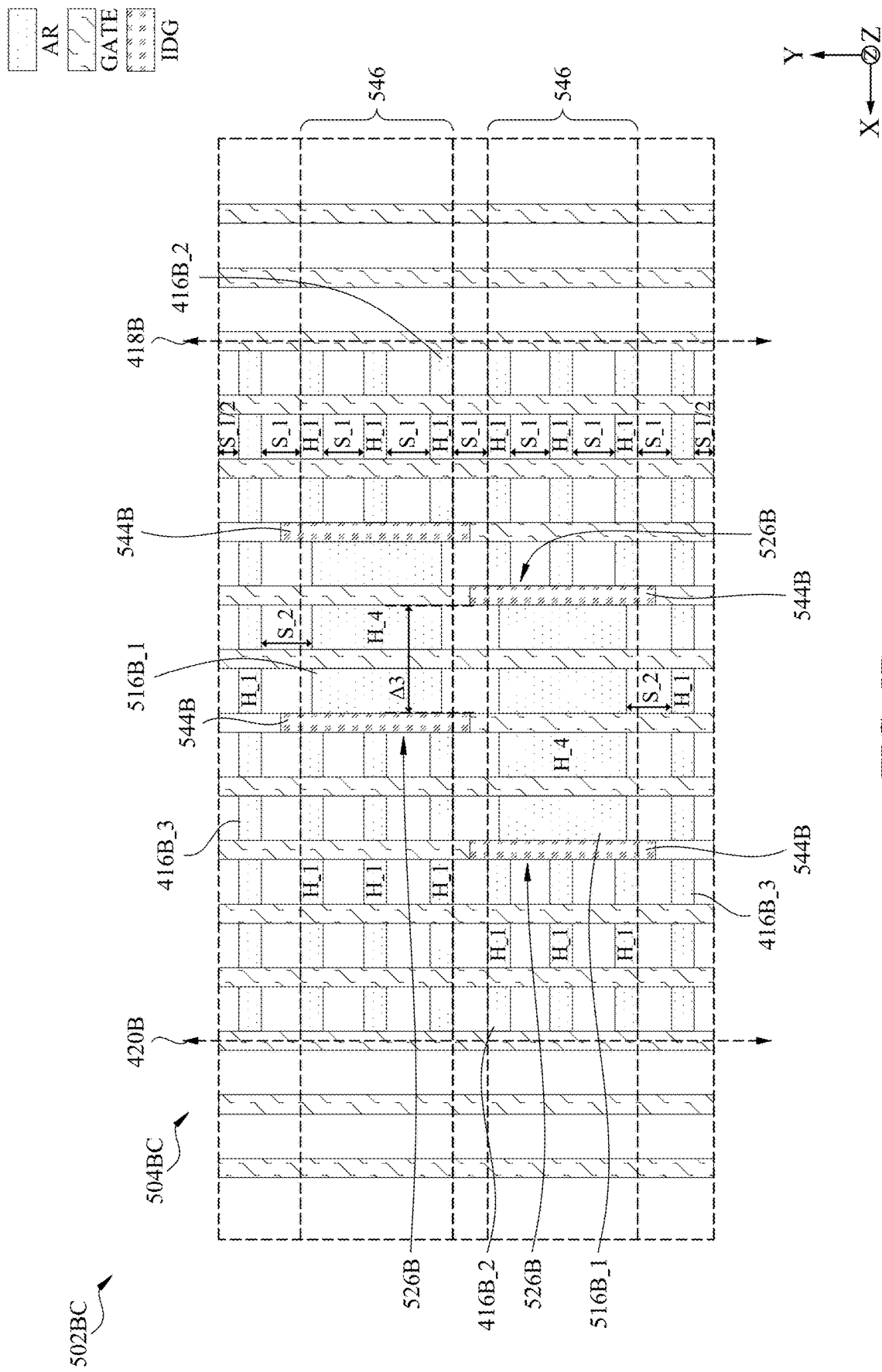

In FIG. 5D, cell region 504BC includes two sets of ARs 546 where instances of ARs 516B_1 are configured with different widths (e.g., lower AR 516B_1 is configured with a width of about 46 and upper AR 516B_1 is configured with a width of about 36). In some embodiments, other suitable positions of the various instances of AR 516B_1 are within the contemplated scope of the disclosure. ARs 516B_1 overlap by a distance Δ3 relative to the X-axis. In some embodiments, Δ3 is a distance greater than zero and up to and including the smallest width of any instance of AR 516B_1.

Figure 5E:
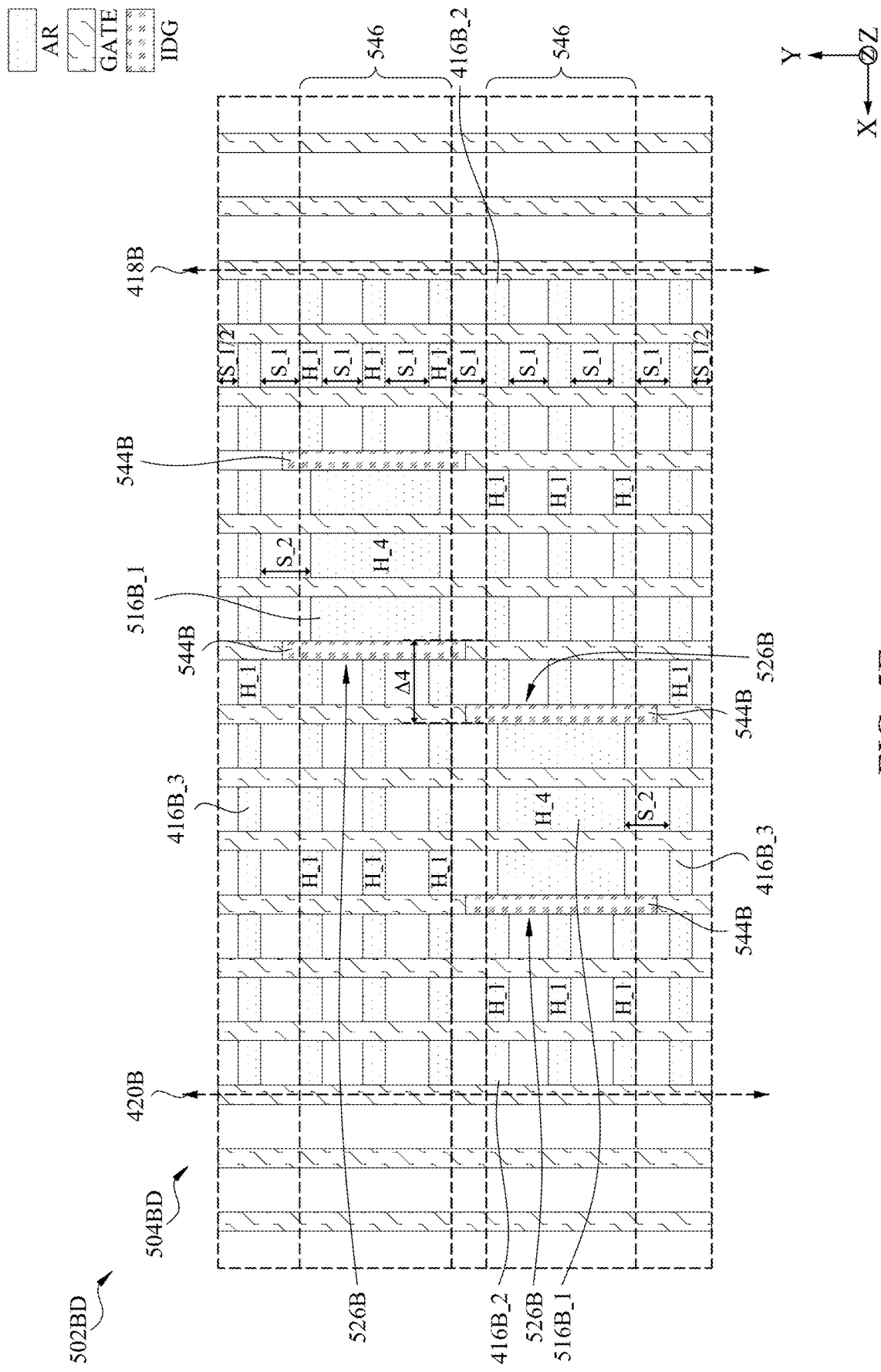

FIG. 5E is similar to FIG. 5D. In FIG. 5E, ARs 516B_1 are offset from one another by a distance Δ4. In some embodiments, Δ4 is greater than zero and less than the width of AR 416B_3 minus the sum of the widths of both ARs 516B_1 (e.g., ≥7δ).

Figure 6A:
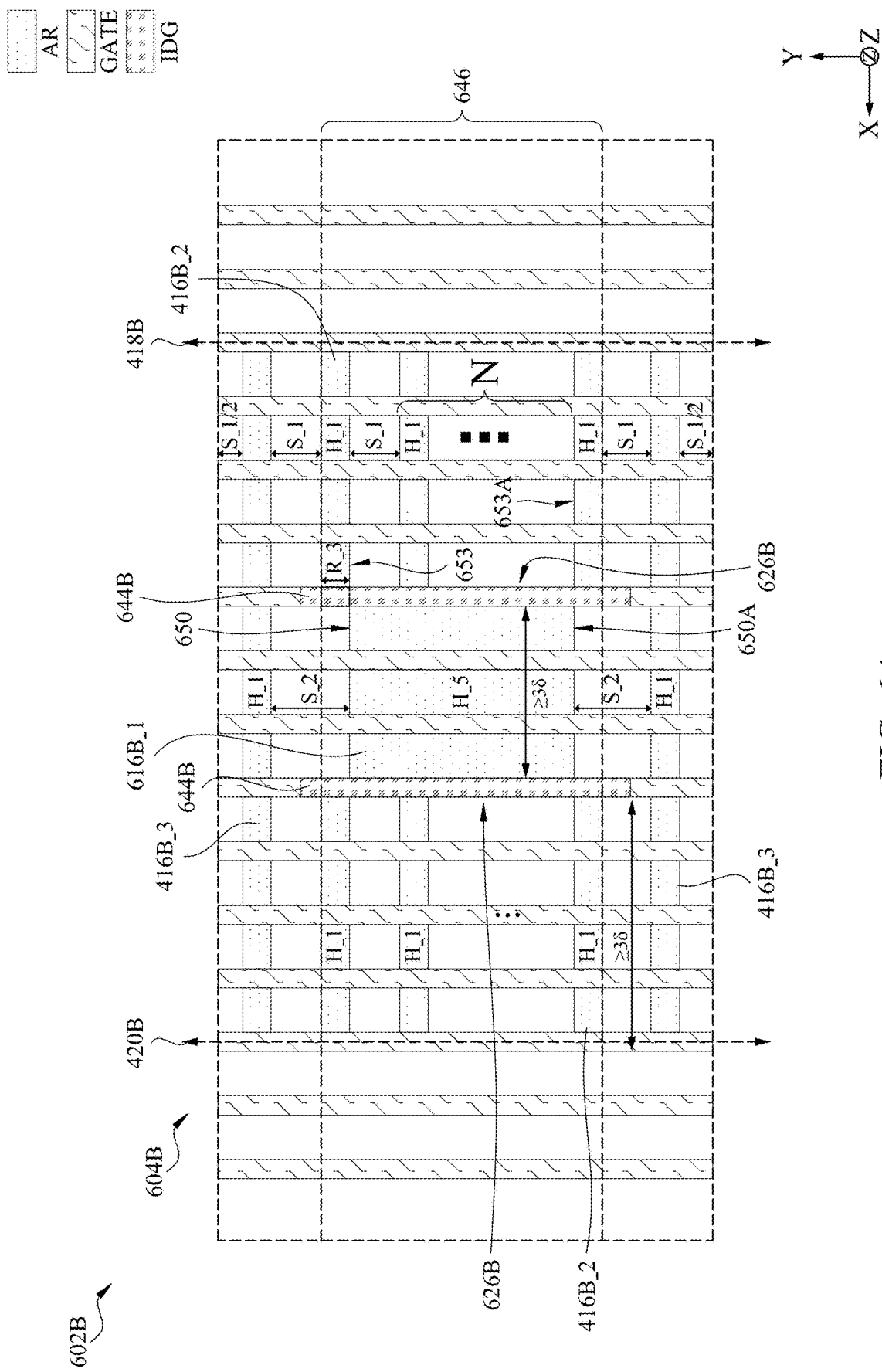
FIGS. 6A, 6B, and 6C are plan views of a semiconductor device, in accordance with some embodiments.

FIG. 6A is a plan view of a semiconductor device 602B, in accordance with some embodiments.

Semiconductor device 602B is an example of semiconductor device 102 and is configured to be used within IC 100. In some embodiments, cell region 604B is an example of cell region 104. In some embodiments, ARs 416B_2 and 416B_3 are LL sections, e.g., LL section 108. In some embodiments, AR 616B_1 is an HL section, e.g., HL section 106.

Figure 6B:
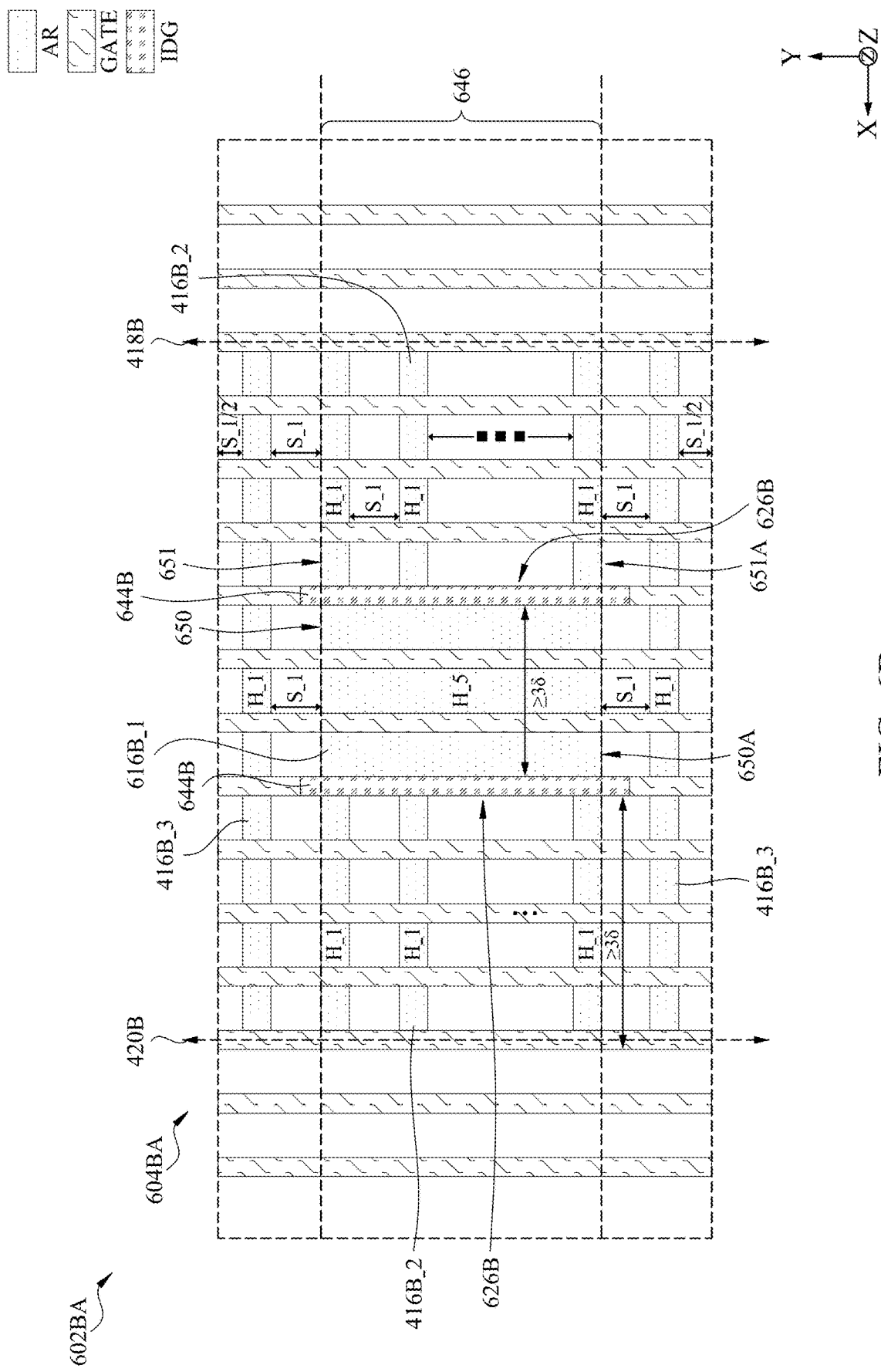
Figure 6C:
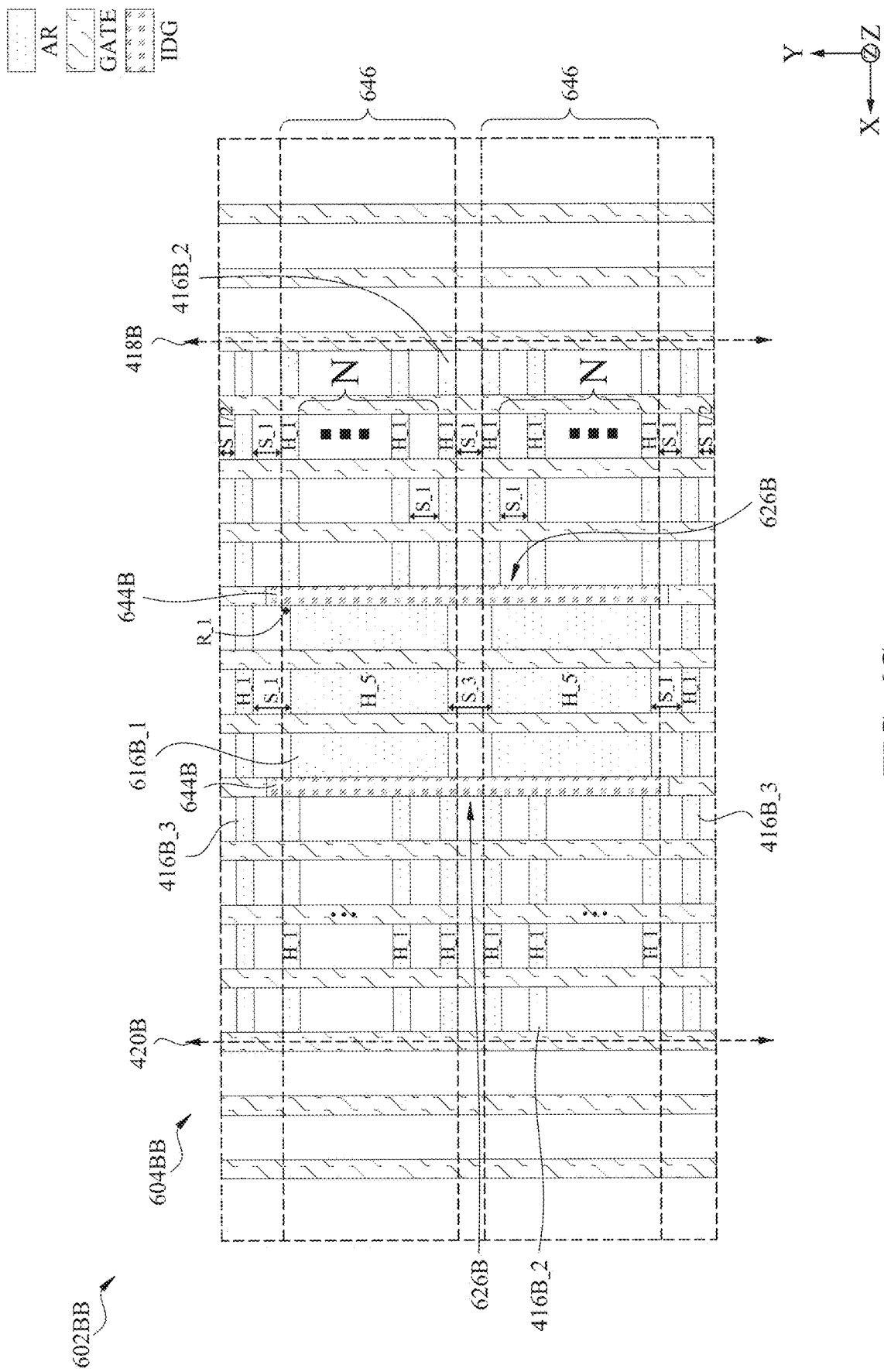

Semiconductor devices 602B, 602BA, and 602BB of corresponding FIGS. 6A-6C are variations of semiconductor device 402B of FIG. 4A. Discussion of FIGS. 6A-6C is limited to the differences between semiconductor device 402B and semiconductor devices 602B, 602BA, and 602BB of FIGS. 6A-6C for the sake of brevity, conciseness, and to reduce repetitiveness. Further, for the sake of brevity and conciseness, and to reduce repetitiveness, mention of medium cell regions within a larger cell region, such as cell region 604B is left out. However, multiple medium cell regions within a larger cell region is contemplated by embodiments of the present disclosure. Like elements retain their reference number while new or different elements are called out with different reference numbers Cell region 604B includes ARs 416B_2, 416B_3, and AR 616B_1. Cell region 604B includes upper and lower ARs 416B_3, each of which extend from first imaginary reference line 418B to second imaginary reference line 420B, imaginary reference lines 418B and 420B being parallel to the Y-axis. Each of ARs 416B_2 and 416B_3 has a height H_1. AR 616B_1 has a height H_5, and wherein H_1<H_5. In some embodiments, H_4 (FIGS. 5A-5E) is less than H_5, i.e., H_4<H_5. ARs 416B_2 and 616B_1 are grouped in a set 646 of ARs. In some embodiments, set 646 of ARs forms an I-shape or an I-frame with two or more upper ARs 416B_2 forming the upper horizontal portion of the I-frame, AR 616B_1 forming a center vertical portion of the I-frame, and two or more lower ARs 416B_2 forming the lower horizontal portion of the I-frame.

In FIG. 6A, relative to the Y-axis, upper edge 650 of AR 616B_1 extends upward to align with a lower edge 653 of uppermost ARs 416B_2 and is within a range R_3 of lower edge 653 of AR 416B_2. That is, upper edge 650 does not extend above lower edge 653 of uppermost ARs 416B_2 but is even with lower edge 653 of AR 416B_2. In some embodiments, upper edge 650 of AR 616B_1 is below lower edge 653 of uppermost ARs 416B_2. Relative to the Y-axis, a lower edge 650A of AR 616B_1 extends downward to align with an upper edge 653A of lowermost ARs 416B_2. In some embodiments, lower edge 650A of AR 616B_1 is above upper edge 653A of lowermost ARs 416B_2. In some embodiments, R_3 equals H_1. In some embodiments, R_3 is greater than or less than H_1.

A taller AR, such as AR 616B_1, has a height H_5 relative to the Y-axis. Cell region 604B is configured according to design rules (15) and (16) to satisfy DRC. More particularly, design rule 15 configures height H_5 in terms of a positive integer N, where N represents the number of instances of AR 416B_2 which are overlapped substantially completely by AR 616B_1 relative to the Y-axis.

$$N \cdot S\_1 + (N-1) \cdot H\_1 \leq H5 \leq N \cdot S\_1 + (N+1) \cdot H\_1 \qquad \text{rule (15)}$$

$$S\_1 \leq S\_2 \leq S\_1 + H\_1 \qquad \text{rule (16)}$$

FIG. 6B is a plan view of a semiconductor device 602BA, in accordance with some embodiments.

Semiconductor device 602BA of FIG. 6B is a variation of semiconductor device 602B of FIG. 6A, and a discussion of the differences between semiconductor device 602BA and semiconductor 602B are included. Similarities between the two semiconductor devices are left out to eliminate repetitiveness and provide clarity.

Lower edge 650A of AR 616B_1 aligns with lower edge 651A of lowermost ARs 416B_2. Upper edge 650 of AR 616B_1 aligns with upper edge 651 of uppermost ARs 416B_2. Furthermore, AR 616B_1 is separated from corresponding ARs 416B_3 by distance S_1 in contrast to semiconductor device 602B where AR 616B_1 is separated from corresponding ARs 416B_3 by distance S_2.

FIG. 6C is a plan view of a semiconductor device 602BB, in accordance with some embodiments.

Semiconductor device 602BB of FIG. 6C is a variation of semiconductor device 602B of FIG. 6A, and a discussion of the differences between semiconductor 602BB and semiconductor device 602B are included. Similarities between the two semiconductor devices are left out to eliminate repetitiveness and provide clarity.

Cell region 604BB of FIG. 6C includes two instances of AR 606B_1, and two sets 646 of ARs. Cell region 604BB is configured according to design rules (15), (16) and (17) to satisfy DRC.

$$S\_1 \leq S\_3 \leq S\_1 + 2 \cdot H\_1 \qquad \text{rule (17)}$$

Figure 7A:
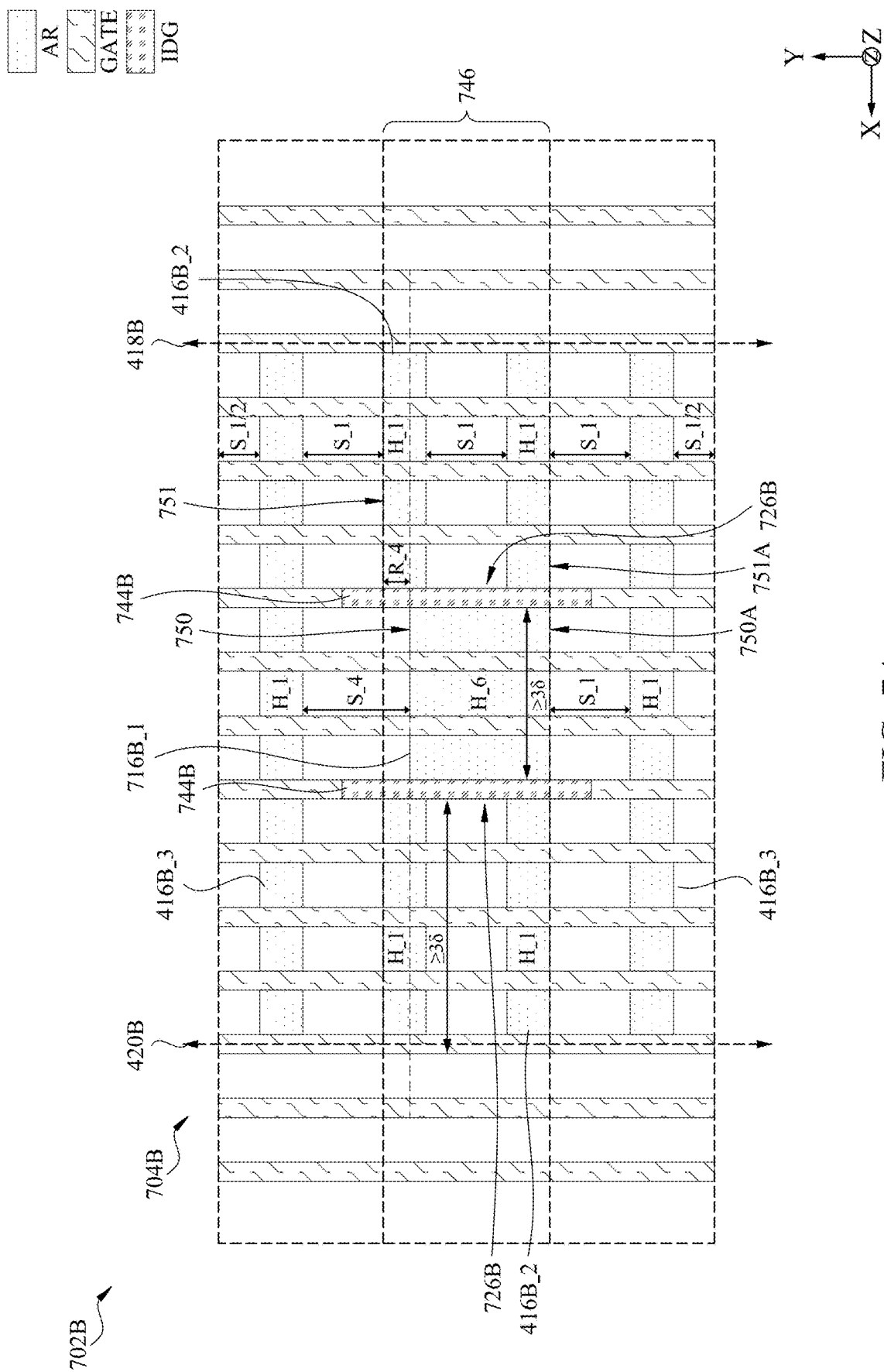
FIGS. 7A and 7B are plan views of a semiconductor device, in accordance with some embodiments.

FIG. 7A is a plan view of a semiconductor device 702B, in accordance with some embodiments.

Semiconductor device 702B is an example of semiconductor device 102 and is configured to be used within IC 100. In some embodiments, cell region 704B is an example of cell region 104. In some embodiments, AR 716B_1 is an HL section, e.g., HL section 106. In some embodiments, ARs 416B_2 and 416B_3 are LL sections, e.g., LL section 108.

Figure 7B:
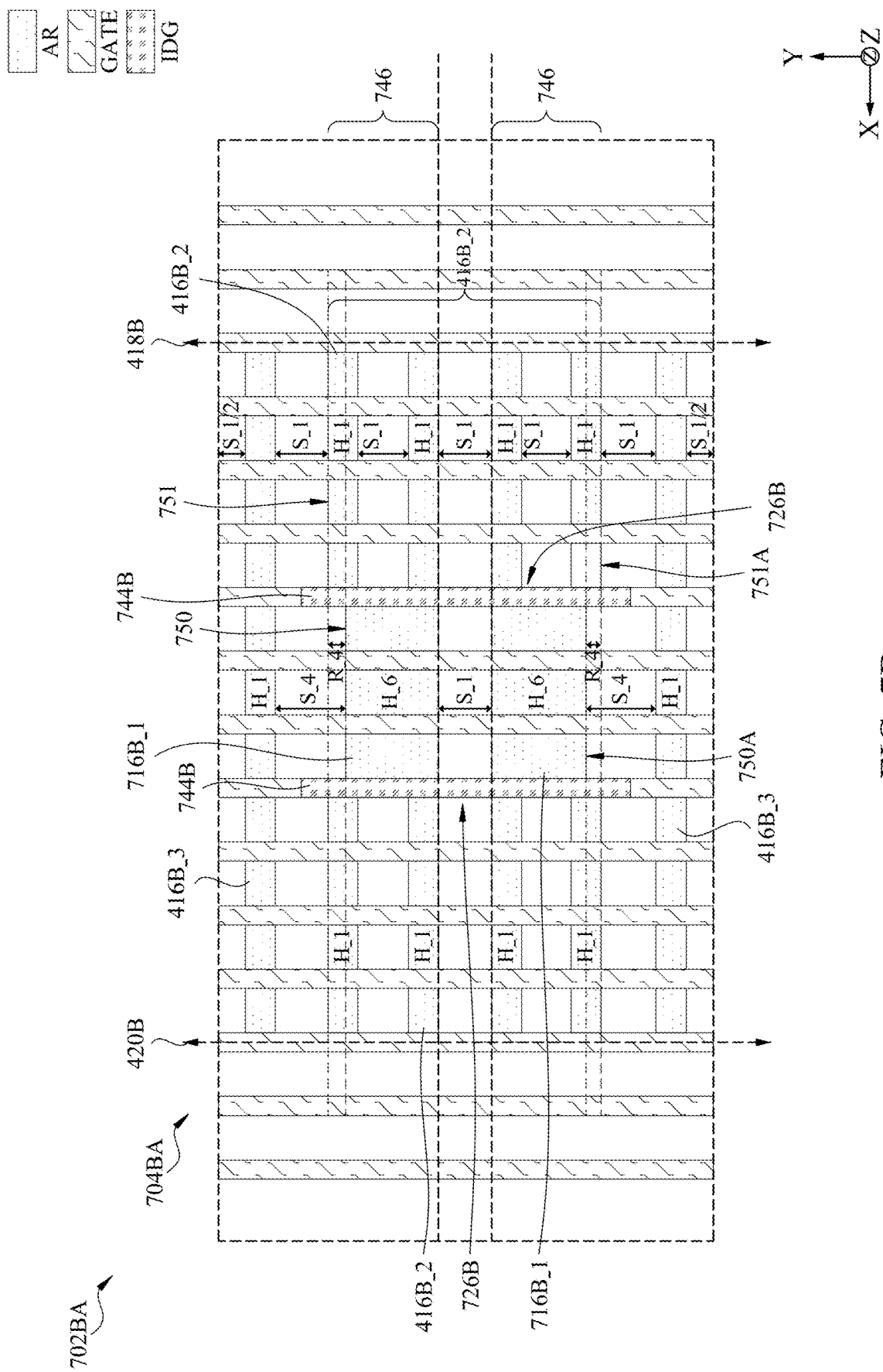

Semiconductor devices 702B and 702BA of corresponding FIGS. 7A-7B are variations of semiconductor device 402B of FIG. 4A. Discussion of FIGS. 7A-7B is limited to the differences between semiconductor device 402B and semiconductor devices 702B and 702BA of FIGS. 7A-7B for the sake of brevity, conciseness, and to reduce repetitiveness. Like elements retain their reference number while new or different elements are called out with different reference numbers.

In FIG. 7A, ARs 416B_2 and 716B_1 are grouped into a set of ARs 746. FIG. 7A is similar to FIG. 4A, e.g., each includes one instance of an I-frame. In FIG. 7A, when a viewer scans parallel to the X-axis from left to right, there are two profiles, namely a first profile and a second profile. Relative to the Y-axis, the first profile is at the top of the I-frame and the second profile is at the bottom of the I-frame. The first profile is formed by upper edge 751 of upper ARs 416B_2 and upper edge 750 of AR 716B_1, and is the same as the concave first profile in FIG. 4A. The second profile of FIG. 7A is different than the second profile of FIG. 4A. When the viewer scans parallel to the X-axis from left to right in FIG. 7A, the second profile is formed by lower edge 751A of lower ARs 416B_2 and lower edge 750A of AR

716B_1. In FIG. 7A, the lower edge 751A of lower ARs 416B_2 and lower edge 750A of AR 716B_1 are substantially collinear such that the second profile is linear, whereas the second profile in FIG. 4A is concave in that lower edge 450A of AR 416B_1 is recessed above lower edge 451A of lower ARs 416B_2. In FIG. 7A, relative to the Y-axis, AR 716B_1 is arranged asymmetrically with respect to ARs 416B_2. Upper edge 750 of AR 716B_1 extends upward and is within a range R_4 of an uppermost edge 751 of upper ARs 416B_2. Cell region 704B is without full projection. More particularly, each of the concave first profile and the linear second profile is a result of the corresponding ARs being without full projection. The first profile has a concave depth or an offset of R_4.

Relative to the Y-axis: AR 716B_1 is separated from each of upper AR 416B_3 and lower AR 416B_3 by a distance S_4; ARs 416B_2 are separated from each other by distance S_1; ARs 416B_2 are separated from corresponding ARs 416B_3 by distance S_1; ARs 416B_2 and 416B_3 have height H_1; and AR 716B_1 has a height of H_6. Cell region 704B is configured according to design rules (18), (19) and (20) to satisfy DRC.

$$0 \leq R\_4 \leq S\_1 + H\_1 \quad \text{rule (18)}$$

$$H\_1 \leq H\_6 \leq S\_1 + 2H\_1 \quad \text{rule (19)}$$

$$S\_4 = S\_1 + R\_4 \quad \text{rule (20)}$$

Relative to the Y-axis, the distance R_4 between upper edge 750 and 751 is greater than or equal to zero and less than or equal to the height H_1 plus the distance S_1. The height H_1 of ARs 416B_2 is less than or equal to the height H_6 of AR 716B_1, and the height H_6 is less than or equal to the distance S_1 plus twice the height H_1. In some embodiments, relative to the X-axis, ARs 416B_2 and 416B_3 are at least 36 in width. In some embodiments, AR 716B_1 is less than 36 in width. In some embodiments, other suitable heights and widths of ARs 416B_2, 416B_3 and 716B_1 are within the contemplated scope of the disclosure.

FIG. 7B is a plan view of a semiconductor device 702BA in accordance with some embodiments.

Semiconductor devices 702BA of FIG. 7B is a variation of semiconductor device 702B of FIG. 7A. Discussion of FIG. 7B is limited to the differences between semiconductor device 702B and semiconductor device 702BA for the sake of brevity, conciseness, and to reduce repetitiveness. Like elements retain their reference number while new or different elements are called out with different reference numbers.

FIG. 7B includes two sets 746 of ARs. FIG. 7B is similar to FIG. 4B, e.g., each includes an upper I-frame and a lower I-frame. The upper I-frame in FIG. 7B is similar to the I-frame in FIG. 7A. Relative to an axis of symmetry between the upper I-frame and the lower I-frame of FIG. 7B, the lower I-frame is mirror symmetric with respect to the upper I-frame.

In FIG. 7B, relative to the Y-axis, the first profile of the lower I-frame is above the second profile of the lower I-frame. More particularly, the first/upper profile of the lower I-frame corresponds to the second/lower profile of the upper I-frame., and the second/lower profile of the lower I-frame corresponds to the first/upper profile of the upper I-frame. Each of the first/upper profile of the upper I-frame and the second/lower profile of the lower I-frame is concave. Each of the second/lower profile of the upper I-frame and the first/upper profile of the lower I-frame is linear.

Figure 8A:
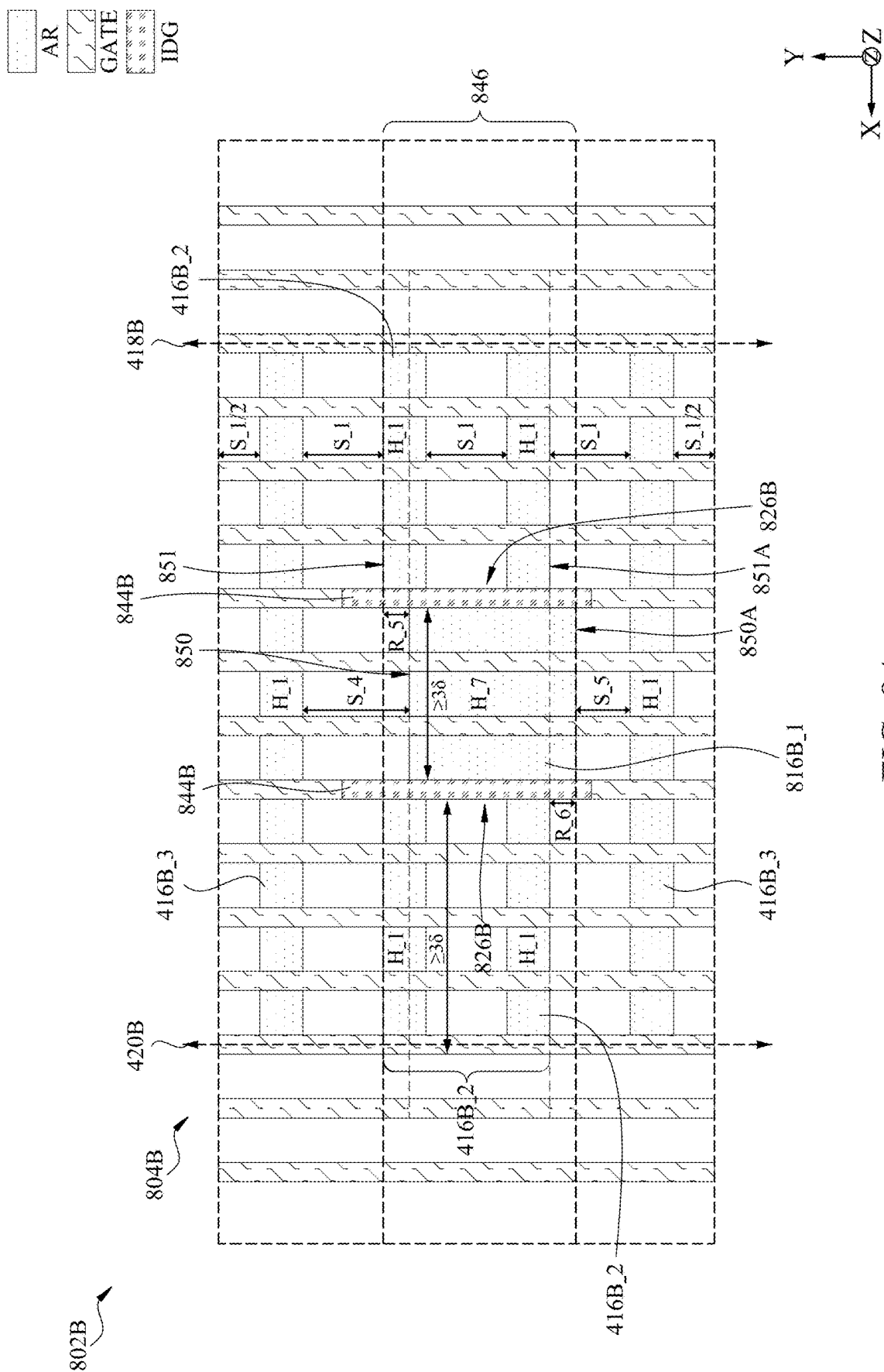
FIGS. 8A and 8B are plan views of a semiconductor device, in accordance with some embodiments.

FIG. 8A is a plan view of a semiconductor device 802B, in accordance with some embodiments.

FIG. 8A is similar to FIG. 7A, e.g., each includes one instance of an I-frame. In FIG. 8A, when a viewer scans parallel to the X-axis from left to right, there are two profiles, namely a first profile and a second profile. Relative to the Y-axis, the first profile is at the top of the I-frame and the second profile is at the bottom of the I-frame. The first profile is formed by upper edge 851 of upper ARs 416B_2 and upper edge 850 of AR 816B_1 and is the same as the concave first profile in FIG. 7A. The second profile of FIG. 8A is different than the second profile of FIG. 7A. When the viewer scans parallel to the X-axis from left to right in FIG. 8A, the second profile is formed by lower edge 851A of lower ARs 416B_2 and lower edge 850A of AR 816B_1. In FIG. 8A, relative to the Y-axis, lower edge 850A of AR 816B_1 extends below lower edge 851A of lower ARs 416B_2 such that the second profile is convex in that lower edge 850A of AR 816B_1 protrudes below lower edge 851A of lower ARs 416B_2, whereas the second profile in FIG. 7A is linear, and whereas the second profile in FIG. 4A is concave. In FIG. 8A, relative to the Y-axis, AR 816B_1 is arranged asymmetrically with respect to ARs 416B_2. Upper edge 850 of AR 816B_1 extends upward and is within a range R_4 of an uppermost edge 851 of upper ARs 416B_2. Cell region 804B is without full projection.

Semiconductor device 802B is an example of semiconductor device 102 and is configured to be used within IC 100. In some embodiments, cell region 804B is an example of cell region 104. In some embodiments, AR 816B_1 is an HL section, e.g., HL section 106. In some embodiments, ARs 416B_2 and 416B_3 are LL sections, e.g., LL section 108.

Figure 8B:
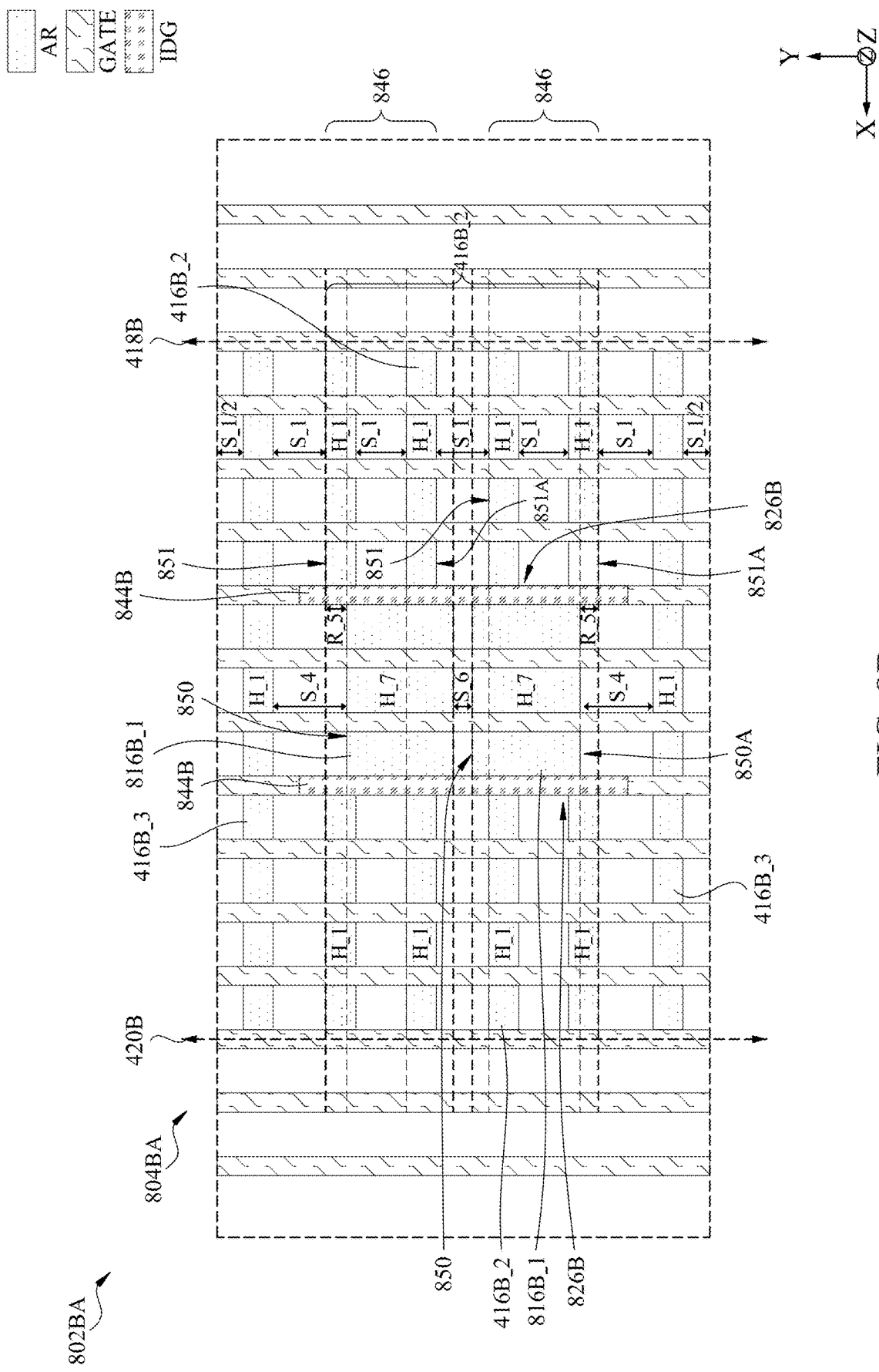

Semiconductor devices 802B and 802BA of corresponding FIGS. 8A-8B are variations of semiconductor device 402B of FIG. 4A. Discussion of FIGS. 8A-8B is limited to the differences between semiconductor device 402B and semiconductor devices 802B and 802BA of FIGS. 8A-8B for the sake of brevity, conciseness, and to reduce repetitiveness Like elements retain their reference number while new or different elements are called out with different reference numbers.

ARs 416B_2 and 816B_1 are grouped into a set of ARs 846. Relative to the Y-axis, upper edge 850 of AR 816B_1 extends upward and is within a range R_5 of an upper edge 851 of upper ARs 416B_2. Lower edge 850A of AR 816B_1 extends below lower edge 851A of lower ARs 416B_2 by a distance R_6. Further, relative to the Y-axis, AR 816B_1 is asymmetrically located between upper ARs 416B_2 and lower ARs 416B_2. Cell region 804B in without full projection. More particularly, each of the concave first profile and the convex second profile is a result of the corresponding ARs being without full projection. The first and second profiles have corresponding depths or offsets of R_5 and offset R_6.

Relative to the Y-axis: AR 816B_1 is separated from upper AR 416B_3 by distance S_4; AR 816B_1 is separated from lower AR 416B_3 by a distance S_5; ARs 416B_2 and ARs 416B_3 have height H_1; and AR 816B_1 has a height H_7. Cell region 804B is configured according to design rules (21), (22), (23), (24) and (25) to satisfy DRC.

$$0 \leq R\_5 \leq S\_1 + H\_1 \quad \text{rule (21)}$$

$$0 \leq R\_6 \leq S\_1 \quad \text{rule (22)}$$

$$H\_1 \leq H\_7 \leq S_1 + 2H\_1 + R\_6 \quad \text{rule (23)}$$

$$S\_4 = S\_1 + R\_5 \quad \text{rule (24)}$$

$$S\_5 = S\_1 - R\_6 \quad \text{rule (25)}$$

The distance R_5 between upper edges 850 and 851 is greater than or equal to zero and less than or equal to H_1 plus S_1. The distance R_6 between lower edges 850A and 851A is greater than or equal to zero and less than or equal to S_1. Height H_1 is less than or equal to height H_7, and H_7 is less than or equal to S_1 plus twice H_1 plus R_6. In some embodiments, relative to the X-axis, ARs 416B_2 and 416B_3 are at least 3δ in width. In some embodiments, AR 816B_1 is less than 3δ in width. In some embodiments, other suitable heights and widths of ARs 416B_2, 416B_3 and 816B_1 are within the contemplated scope of the disclosure. In some embodiments, the distance between lower AR 416B_3 and AR 816B_1 is S_5, which represents a minimum distance allowed for DRC.

FIG. 8B is a plan view of a semiconductor device 802BA in accordance with some embodiments.

Semiconductor devices 802BA of FIG. 8B is a variation of semiconductor device 802B of FIG. 8A. Discussion of FIG. 8B is limited to the differences between semiconductor device 802B and semiconductor device 802BA for the sake of brevity, conciseness, and to reduce repetitiveness. Like elements retain their reference number while new or different elements are called out with different reference numbers.

In FIG. 8B, cell region 804BA includes two sets 846 of ARs. FIG. 8B is similar to FIG. 7B, e.g., each includes an upper I-frame and a lower I-frame. The upper I-frame in FIG. 8B is similar to the I-frame in FIG. 8A. Relative to an axis of symmetry between the upper I-frame and the lower I-frame of FIG. 8B, the lower I-frame is mirror symmetric with respect to the upper I-frame.

In FIG. 8B, relative to the Y-axis, the first profile of the lower I-frame is above the second profile of the lower I-frame. More particularly, the first/upper profile of the lower I-frame corresponds to the second/lower profile of the upper I-frame., and the second/lower profile of the lower I-frame corresponds to the first/upper profile of the upper I-frame. Each of the first/upper profile of the upper I-frame and the second/lower profile of the lower I-frame is concave. Each of the second/lower profile of the upper I-frame and the first/upper profile of the lower I-frame is convex.

Relative to the Y-axis, ARs 816B_1 are separated by distance S_6. Cell region 804BA is configured according to design rules (21), (22), (23), (24) and (25) (see above), and according to design rule (26), to satisfy DRC.

$$S_6 = S\_1 - 2R\_6 \qquad \text{rule (26)}$$

The distance S_6 is equal to S_1 minus twice R_6, where R_6 is as follows. Relative to the Y-axis: Lower edge 850A of upper AR 816B_1 extends below lower edge 851A of corresponding ARs 416B_2 of the upper I-frame by distance R_6; and upper edge 850 of lower AR 816B_1 extends above upper edge 851 of corresponding ARs 416B_2 of the upper I-frame by distance R_6.

Figure 9A:
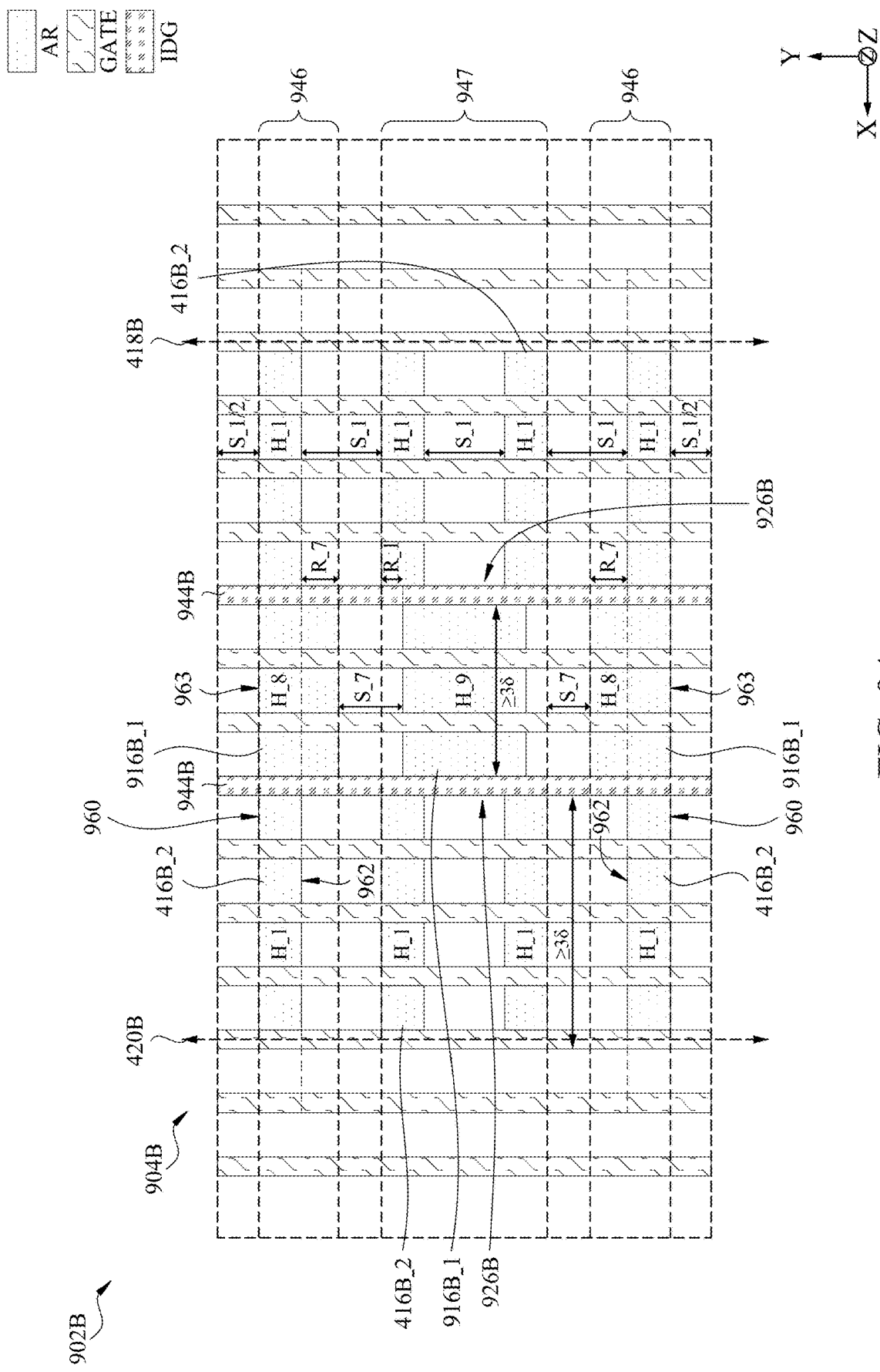
FIGS. 9A and 9B are plan views of a semiconductor device, in accordance with some embodiments.

FIG. 9A is a plan view of a semiconductor device 902B, in accordance with some embodiments.

Semiconductor device 902B is an example of semiconductor device 102 and is configured to be used within IC 100. In some embodiments, cell region 904B is an example of cell region 104. In some embodiments, ARs 916B_1 are HL sections, e.g., HL section 106. In some embodiments, ARs 416B_2 are LL sections, e.g., LL section 108.

Figure 9B:
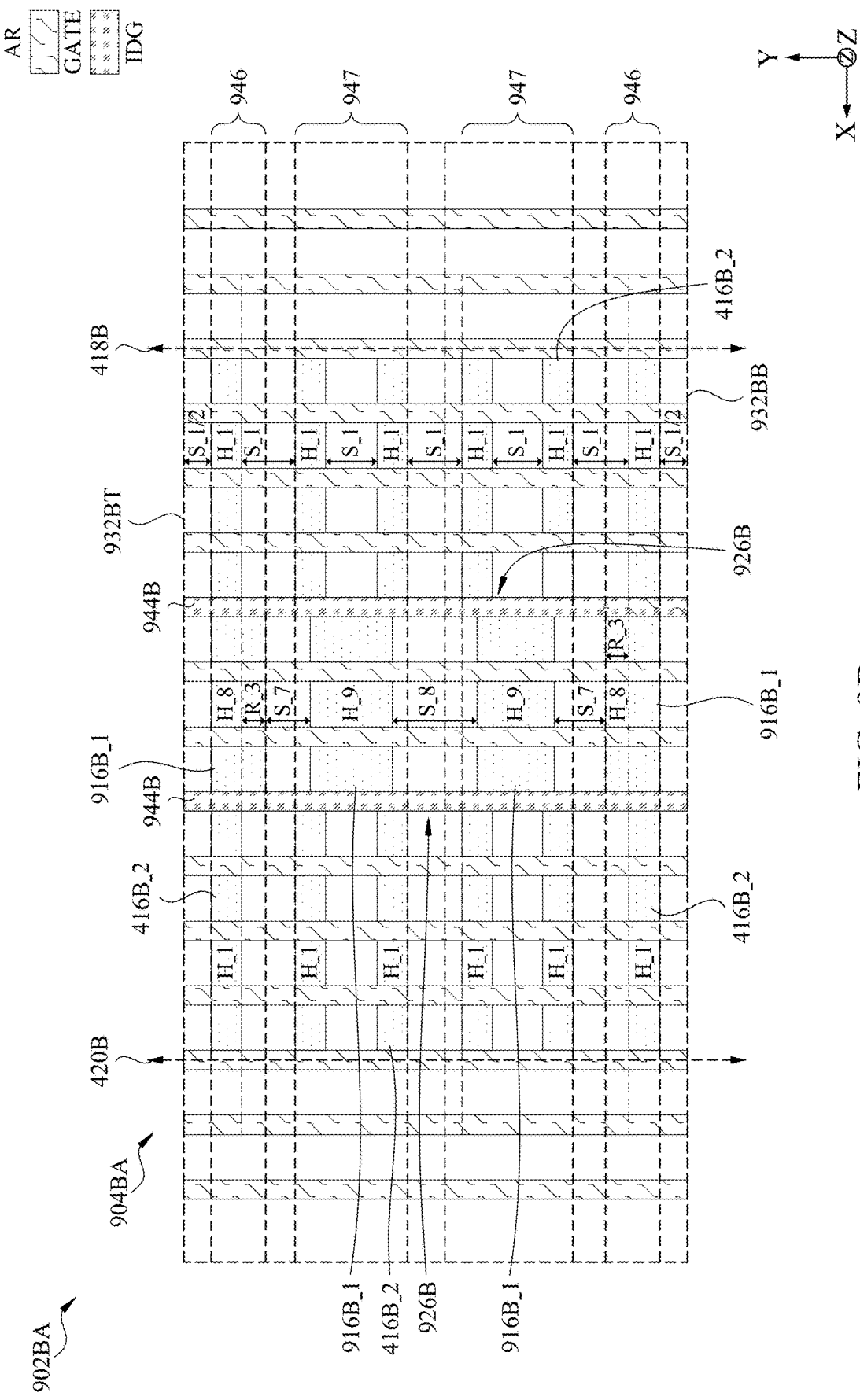

Semiconductor devices 902B and 902BA of corresponding FIGS. 9A and 9B are variations of semiconductor device 402BB of FIG. 4C. Discussion of FIGS. 9A-9B is limited to the differences between semiconductor device 402BB of FIG. 4C and semiconductor devices 902B and 902BA of FIGS. 9A-9B for the sake of brevity, conciseness, and to reduce repetitiveness. Like elements retain their reference number while new or different elements are called out with different reference numbers.

Cell region 904B includes a set 947 of ARs and upper and lower sets 946 of corresponding ARs. Set 947 is similar to each of sets 446 of FIG. 4B in that, e.g., set 947 forms an I-frame. Each of sets 946 differs from sets 446 of FIG. 4B in that, e.g., each of sets 946 forms a T-shape or a T-frame. Relative to the Y-axis, upper set 946 has a right-side-up orientation of the T-frame, whereas lower set 946 has an upside-down orientation of the T-frame. In some embodiments, relative to the Y-axis, upper set 946 is sufficiently close to set 947 that upper set 946 is regarded as sharing the upper instances of AR 416B_2 of set 947 so that upper set 946 is regarded as forming an I-frame. In some embodiments, relative to the Y-axis, lower set 946 is sufficiently close to set 947 that lower set 946 is regarded as sharing the lower instances of AR 416B_2 of set 947 so that lower set 946 is regarded as forming an I-frame.

Relative to the X-axis, ARs 916B_1 are separated from corresponding ARs 416B_2 and 416B_1 by corresponding isolation dummy gates 944B that occupy corresponding intervening regions 926B. Isolation dummy gates 944B extend from reference lines 932BT to 932BB. Due to each of isolation dummy gates 944B, each of ARs 416B_2 and 916B_1 in FIG. 9A is without full projection.

Relative to Y-axis and looking from a central location in cell region 902B, each of the upper profile and the lower profile of set 947 is concave. An upper profile of upper set 946, relative to a central location in cell region 902B, includes outer edges 960 of corresponding uppermost ARs 416B_2 and an outer edge 963 of upper AR 916B_1. The upper profile of upper set 946 is linear. A lower profile of lower set 946, relative to the central location in cell region 902B, includes outer edges 960 of corresponding lowermost ARs 416B_2 and outer edge 963 of lower AR 916B_1. The lower profile of lower set 946 is linear.

A lower profile of upper set 946, relative to the central location in cell region 902B, includes inner edges 962 of uppermost ARs 416B_2 and an inner edge 961 of upper AR 916B_1. Relative to the Y-axis and looking from the central location in cell region 902B, the lower profile of upper set 946 is convex. An upper profile of lower set 946, relative to the central location in cell region 902B, includes inner edges 962 of lowermost ARs 416B_2 and an inner edge 961 of lower AR 916B_1. Relative to the Y-axis and looking from the central location in cell region 902B, the lower profile of lower set 946 is convex.

Relative to the Y-axis: AR 916B_1 of set 947 is separated from ARs 916B_1 of corresponding upper and lower sets 946 by a distance S_7; ARs 416B_2 are separated from each other by distance S_1; ARs 416B_2 have height H_1; ARs 916B_1 of upper and lower sets 946 have a height H_8; and AR 916B_1 of set 947 has a height H_9. Cell region 904B is configured according to design rules (27), (28), (29), (30), and (31) to satisfy DRC.

$$0 \leq R\_7 \leq S\_1 \qquad \text{rule (27)}$$

$$H\_8 = H\_1 + R\_7 \qquad \text{rule (28)}$$

$$S\_1 \leq H\_9 \leq S_1 + 2H\_1 \qquad \text{rule (29)}$$

$$S\_1 \leq S\_7 \leq S\_1 + H\_1 \qquad \text{rule (30)}$$

$$S\_1 \leq S\_8 \leq S\_1 + 2H\_1 \qquad \text{rule (31)}$$

Relative to the Y-axis, distance R_7 is the distance between inner edges 962 and 961, and is greater than or equal to zero but less than or equal to S_1. Relative to the Y-axis, height H_8 of ARs 916B_1 in set 947 is equal to R_7 plus H_1. Relative to the Y-axis, height H_9 of AR 916B_1 in each of sets 946 is greater than or equal to the S_1, but is less than or equal to twice H_1 plus S_1. Relative to the Y-axis, distance S_7 is the distance between AR 916B_1 of set 947 and each of ARs 916B_1 of sets 946, and is greater than or equal to S_1, but is less than or equal to H_1 plus S_1. In some embodiments, relative to the X-axis, each of ARs 916B_1 is less than 3δ in width. In some embodiments, relative to the X-axis, ARs 416B_2 are greater than 3δ. In some embodiments, other suitable heights and widths of ARs 416B_2 and 916B_1 are within the contemplated scope of the disclosure.

FIG. 9B is a plan view of a semiconductor device 902BA in accordance with some embodiments.

Cell region 904BA of semiconductor device 902BA of FIG. 9B is like cell region 904B of semiconductor device 902B of FIG. 9A, however, cell region 904BA includes an additional set 947 of ARs as compared to FIG. 9A. Relative to the Y-axis, ARs 916B_1 of corresponding upper and lower sets 947 are separated by a distance S_8. Distance S_8 is greater than or equal to S_1 but is less than or equal to S_1 plus twice H_1.

Figure 10A:
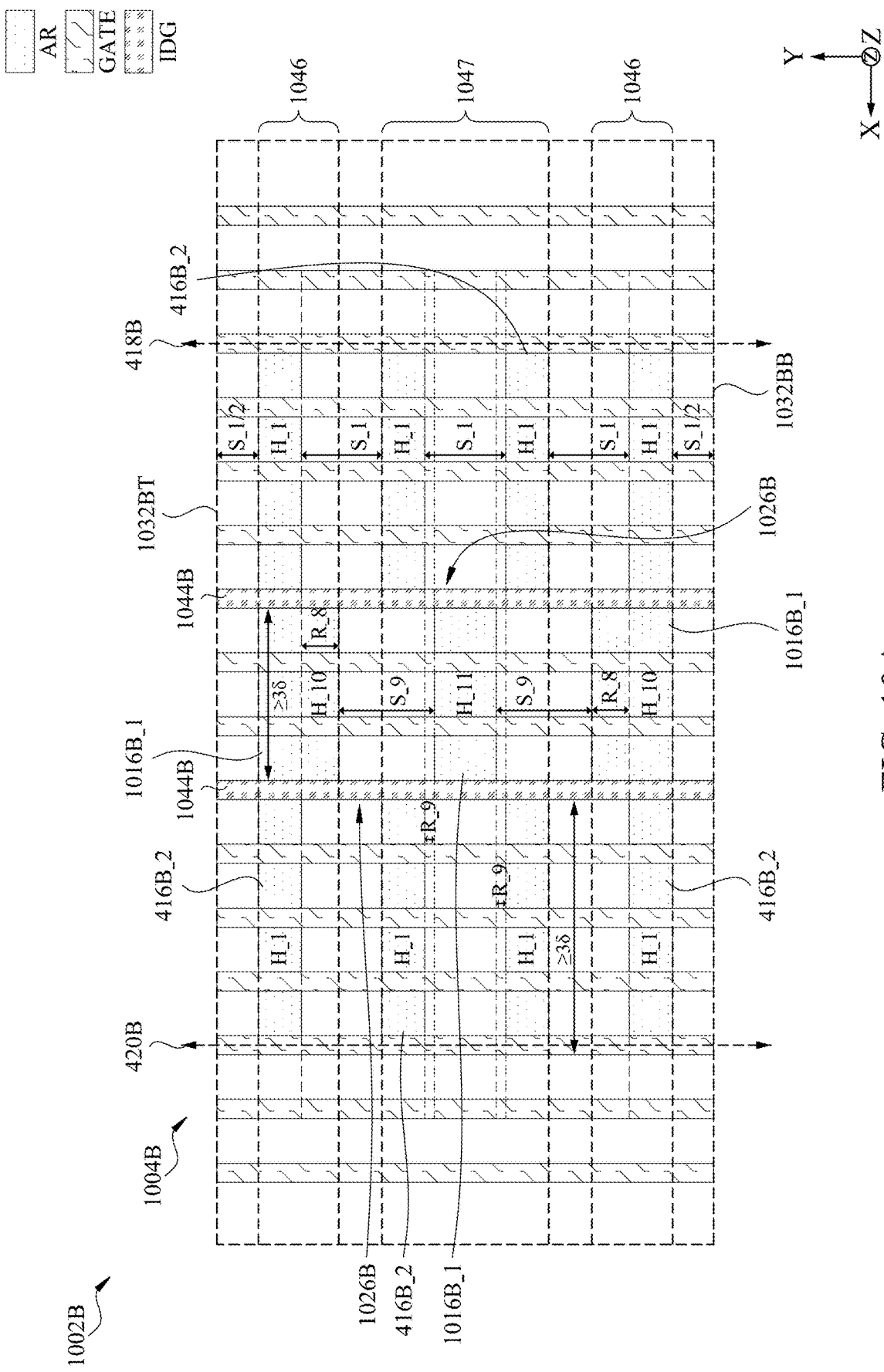
FIGS. 10A and 10B are plan views of a semiconductor device, in accordance with some embodiments.

FIG. 10A is a plan view of a semiconductor device 1002B, in accordance with some embodiments.

Semiconductor device 1002B is an example of semiconductor device 102 and is configured to be used within IC 100. In some embodiments, cell region 1004B is an example of cell region 104. In some embodiments, ARs 1016B_1 are HL sections, e.g., HL section 106. In some embodiments, ARs 416B_2 are LL sections, e.g., LL section 108.

Figure 10B:
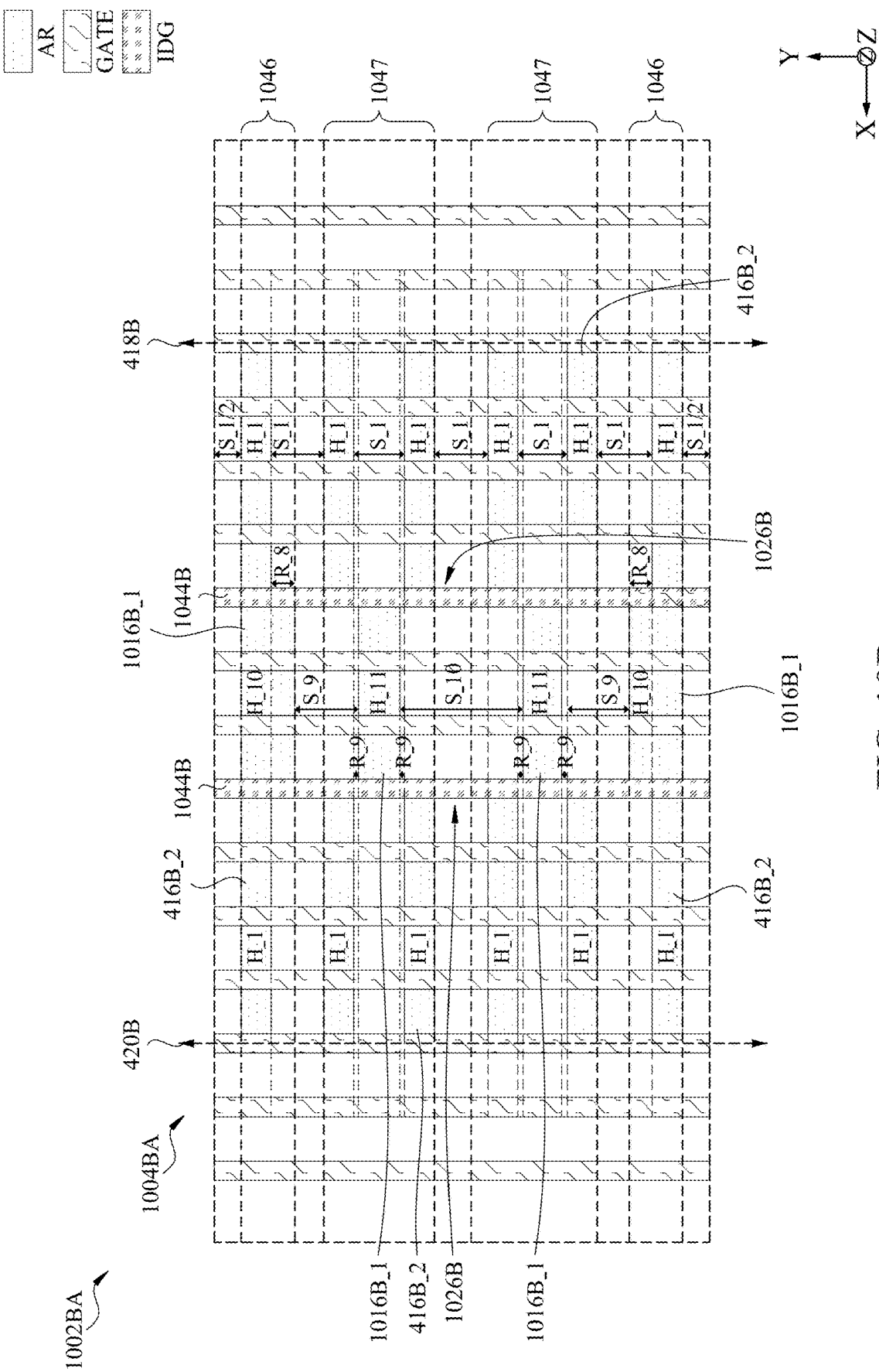

Semiconductor devices 1002B and 1002BA of corresponding FIGS. 10A and 10B are variations of semiconductor device 902B of FIG. 9A. Discussion of FIGS. 10A-10B is limited to the differences between semiconductor device 902B and semiconductor devices 1002B and 1002BA of FIGS. 10A-10B for the sake of brevity, conciseness, and to reduce repetitiveness Like elements retain their reference number while new or different elements are called out with different reference numbers.

Cell region 1004B includes ARs 416B_2 and ARs 1016B_1. ARs 416B_2 are separated from ARs 1016B_1 by corresponding isolation dummy gates 1044B that occupy corresponding intervening regions 1026B. Isolation dummy gates 1044B extend from reference lines 1032BT to 1032BB. Due to each of isolation dummy gates 1044B, each of ARs 416B_2 and 1016B_1 in FIG. 10A is without full projection.

In FIG. 10A, cell region 1004B includes a set 1047 of ARs and upper and lower sets 1046 of corresponding ARs. FIG. 10A is similar to FIG. 9A. Each of sets 1046 is similar to each of sets 946 of FIG. 9A in that, e.g., each of sets 1046 forms an T-frame, upper set 1046 of FIG. 10A is arranged similarly to upper set 946 of FIG. 9A, and lower set 1046 of FIG. 10A is arranged similarly to lower set 946 of FIG. 9A. Relative to the Y-axis, the lower edge of AR 1016B_1 of upper set 1046 extends below the lower edge of ARs 416B_2 of upper set 1046 by a distance R_8. Relative to the Y-axis, the upper edge of AR 1016B_1 of lower set 1046 extends above the upper edge of ARs 416B_2 of lower set 1046 by distance R_8.

In FIG. 10A, set 1047 is similar to set 947 of FIG. 9A in that, e.g., set 1047 forms an I-frame. Nevertheless, the arrangement of set 1047 of FIG. 10A differs from the arrangement of set 947 of FIG. 9A. For example, whereas upper edge, relative to the Y-axis, the upper edge of AR 916B_1 of set 947 of FIG. 9A is between the upper and lower edges of upper ARs 416B_2 of set 947, the upper edge of AR 1016B_1 of set 1047 of FIG. 10A does not overlap but remains below the lower edges of upper ARs 416B_2 of set 1047 by a distance R_9. Also, for example, whereas, relative to the Y-axis, the lower edge of AR 916B_1 of set 947 of FIG. 9A is between the upper and lower edges of lower ARs 416B_2 of set 947, the lower edge of AR 1016B_1 of set 1047 of FIG. 10A does not overlap but remains above the upper edges of lower ARs 416B_2 of set 1047 by distance R_9.

Relative to the Y-axis: ARs 416B_2 are separated from each other by distance S_1; AR 1016B_1 of set 1047 is separated from ARs 1016B_1 of corresponding upper and lower sets 1046 by a distance S_9; ARs 416B_2 have height H_1; ARs 1016B_1 of upper and lower sets 1046 have a height H_10; and AR 1016B_1 of set 1047 has a height H_11. Cell region 1004B is configured according to design rules (32), (33), (34), (35), and (36) to satisfy DRC.

$$0 \leq R\_8 \leq S\_1 \qquad \text{rule (32)}$$

$$0 \leq R\_9 \leq S\_1/2 \qquad \text{rule (33)}$$

$$H\_10 = H\_1 + R\_8 \qquad \text{rule (34)}$$

$$H\_1 \leq H\_11 \leq S\_1 \qquad \text{rule (35)}$$

$$S\_9 = S\_1 + H\_1 + R\_9 \qquad \text{rule (36)}$$

FIG. 10B is a plan view of a semiconductor device 1002BA in accordance with some embodiments.

Cell region 1004BA of semiconductor device 1002BA is an example of cell region 904B of semiconductor device 902B, however, cell region 1004BA includes an additional set 1047 of ARs as compared to FIG. 10A. ARs 1016B_1 of corresponding upper and lower sets 1047 are separated by a distance S_10. Distance S_10 is equal to distance S_1 plus twice H_1 plus twice R_9.

$$S\_10 = S\_1 + 2H\_1 + 2R\_9 \qquad \text{rule (37)}$$

Figure 11A:
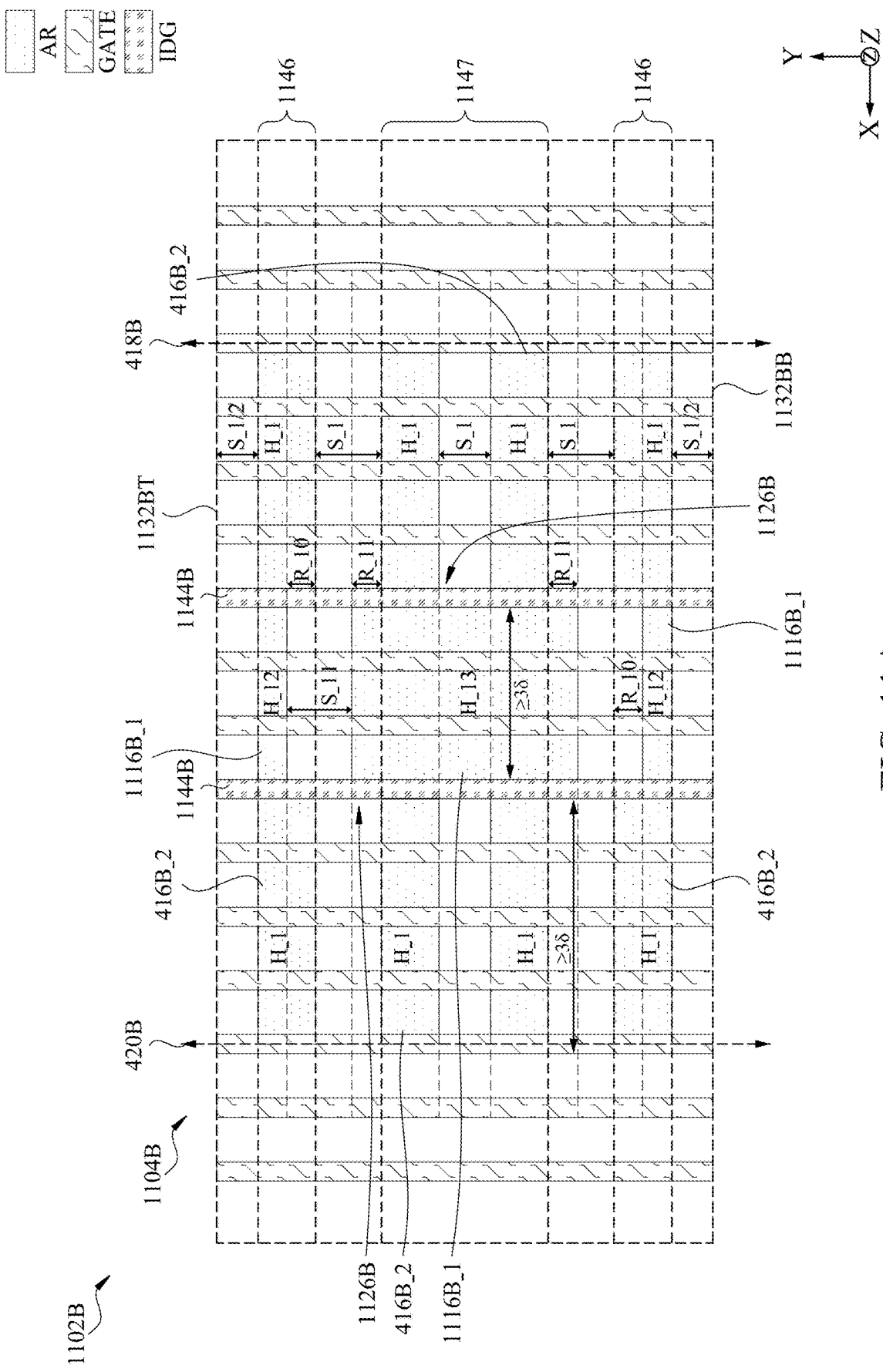
FIGS. 11A and 11B are plan views of a semiconductor device, in accordance with some embodiments.

FIG. 11A is a plan view of a semiconductor device 1102B, in accordance with some embodiments.

Semiconductor device 1102B is an example of semiconductor device 102 and is configured to be used within IC 100. In some embodiments, cell region 1104B is an example of cell region 104. In some embodiments, ARs 1116B_1 are HL sections, e.g., HL section 106. In some embodiments, ARs 416B_2 are LL sections, e.g., LL section 108.

Figure 11B:
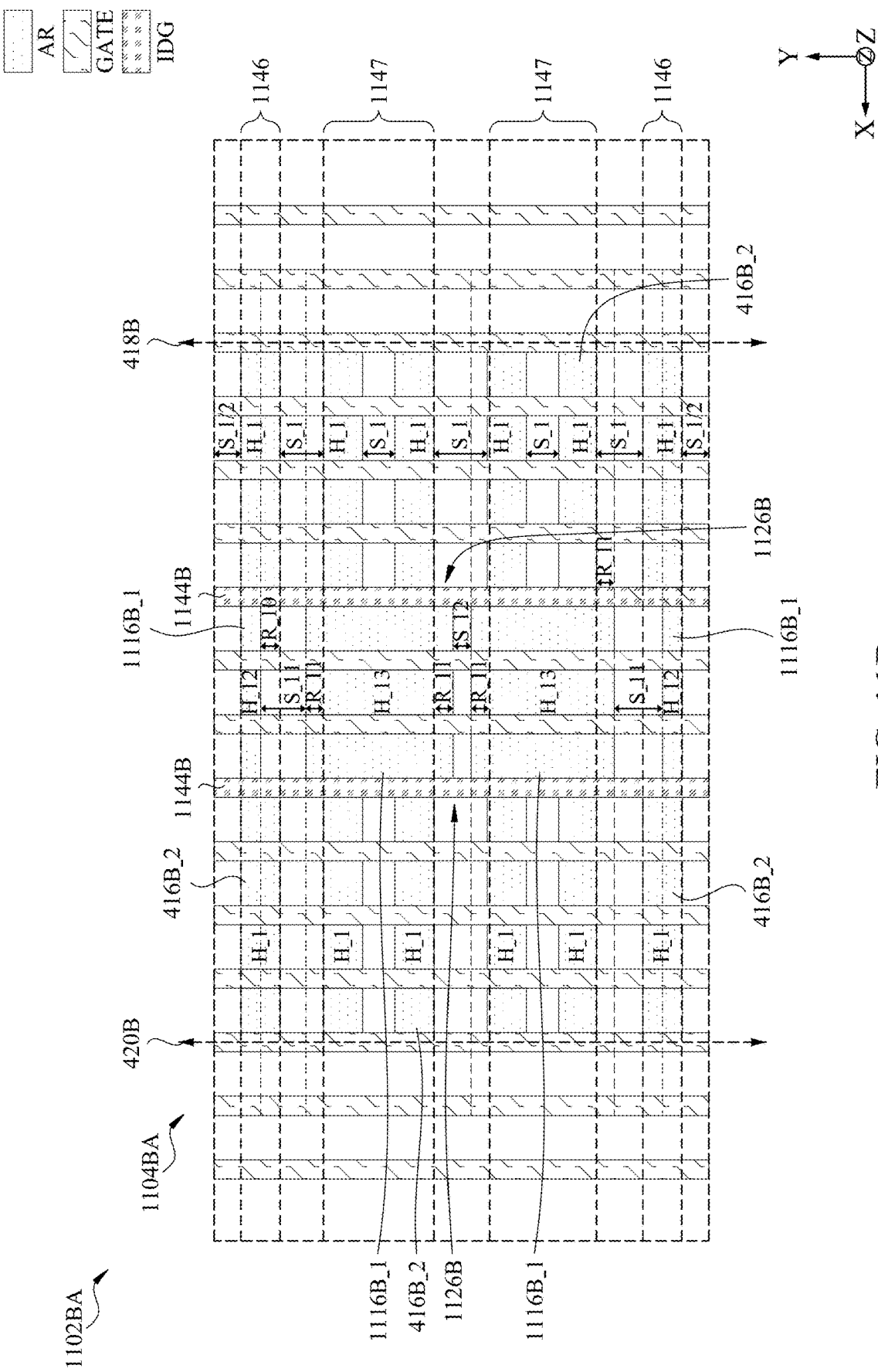

Semiconductor devices 1102B and 1102BA of corresponding FIGS. 11A and 11B are variations of semiconductor devices 902B and 902BA of corresponding FIGS. 9A and 9B. Discussion of FIGS. 11A-11B is limited to the differences between semiconductor devices 902B and 902BA of corresponding FIGS. 9A and 9B and semiconductor devices 1102B and 1102BA of corresponding FIGS. 11A-11B for the sake of brevity, conciseness, and to reduce repetitiveness Like elements retain their reference number while new or different elements are called out with different reference numbers.

Cell region 1104B includes ARs 416B_2 and ARs 1116B_1. ARs 416B_2 are separated from ARs 1016B_1 by corresponding isolation dummy gates 1144B that occupy corresponding intervening regions 1126B. Isolation dummy gates 1144B extend from reference lines 1132BT to 1132BB. Due to each of isolation dummy gates 1144B, each of ARs 416B_2 and 1116B_1 in FIG. 11A is without full projection.

Cell region 1104B includes a set 1147 of ARs and upper and lower sets 1146 of corresponding ARs. Set 1147 of FIG. 11A is similar to each of sets 946 of FIG. 9A in that, e.g., set 1147 forms an I-frame. Examples of differences between set 1147 and 947 include: relative to the Y-axis, the upper edge of AR 1116B_1 in set 1147 extends above the upper edge of upper ARs 416B_2 in set 1147, whereas the upper edge of AR 916B_1 in set 947 extends between the upper and lower edges of upper ARs 416B_2 of set 947; and, relative to the Y-axis, the lower edge of AR 1116B_1 in set 1147 extends below the lower edge of lower ARs 416B_2 in set 1147, whereas the lower edge of AR 916B-1 in set 947 extends between the upper and lower edges of lower ARs 416B_2 of set 947.

In FIG. 11A, upper and lower sets 1146 are similar to corresponding upper and lower sets 946 of FIG. 9A. Example differences between upper set 1146 and upper set 946 include: upper set 1146 forms a U-shape or a U-frame, whereas upper set 946 forms a T-frame; relative to the Y-axis, the lower edge of AR 1116B_1 of upper set 1146 is between the upper and lower edges of ARs 416B_2 of upper set 1146, whereas the lower edge of AR 916B_1 of upper set 946 of FIG. 9A extends below the lower edge of ARs 416B_2 of upper set 946 of FIG. 9A; and looking from a central location in cell region 1102B/902B, and relative to the Y-axis, the lower profile of upper set 1146 is concave, whereas the lower profile of upper set 946 is convex. Example differences between lower set 1146 and lower set 946 include: lower set 1146 forms a U-frame, whereas lower set 946 forms a T-frame; and relative to the Y-axis, the upper edge of AR 1160B_1 of lower set 1146 is between the upper and lower edges of ARs 416B_2 of lower set 1146, whereas the upper edge of AR 916B_1 of lower set 946 of FIG. 9A extends above the upper edge of ARs 416B_2 of lower set 946 of FIG. 9A; and looking from a central location in cell region 1102B/902B, and relative to the Y-axis, the upper profile of lower set 1146 is concave, whereas the upper profile of lower set 946 is convex.

Relative to the Y-axis, the lower edge of AR 1116B_1 in upper set 1146 is recessed by a distance R_10 above the lower edge of ARs 416B_2 in upper set 1146. Relative to the Y-axis, the upper edge of AR 1116B_1 in lower set 1146 is recessed by distance R_10 below the upper edge of ARs 416B_2 in lower set 1146. Relative to the Y-axis, the upper edge of AR 1116B_1 of set 1147 extends above the upper edge of ARs 416B_2 of set 1147 by a distance R_11. Relative to the Y-axis, the lower edge of AR 1116B_1 of set 1147 extends below the lower edge of ARs 416B_2 of set 1147 by distance R_11.

Relative to the Y-axis: AR 1116B_1 of set 1147 is separated from ARs 1116B_1 of corresponding upper and lower sets 1146 by a distance S_11; ARs 416B_2 are separated from each other by distance S_1; ARs 416B_1 have height H_1; ARs 1116B_1 of upper and lower sets 1146 have a height H_12; and AR 1116B_1 of set 1147 has a height H_13. Cell region 1104B is configured according to design rules (38), (39), (40), (41), and (42) to satisfy DRC.

$0 \leq R\_10 \leq H\_1$ rule (38)

$0 \leq R\_11 \leq S\_1$ rule (39)

$H\_12 = H\_1 - R\_10$ rule (40)

$H\_13 = S\_1 + 2H\_1 + 2R\_11$ rule (41)

$S\_11 = S\_1 + R\_10$ rule (42)

FIG. 11B is a plan view of a semiconductor device 1102BA in accordance with some embodiments.

Cell region 1104BA of semiconductor device 1102BA is an example of cell region 1104B of semiconductor device 1102B, however, cell region 1104BA includes an additional set 1147 of ARs as compared to FIG. 11A. Relative to the Y-axis, ARs 1116B_1 of corresponding upper and lower sets 1147 are separated by a distance S_12. Distance S_12 is equal to distance S_1 minus twice R_11.

$S\_12 = S\_1 - 2R\_11$ rule (43)

Figure 12A:
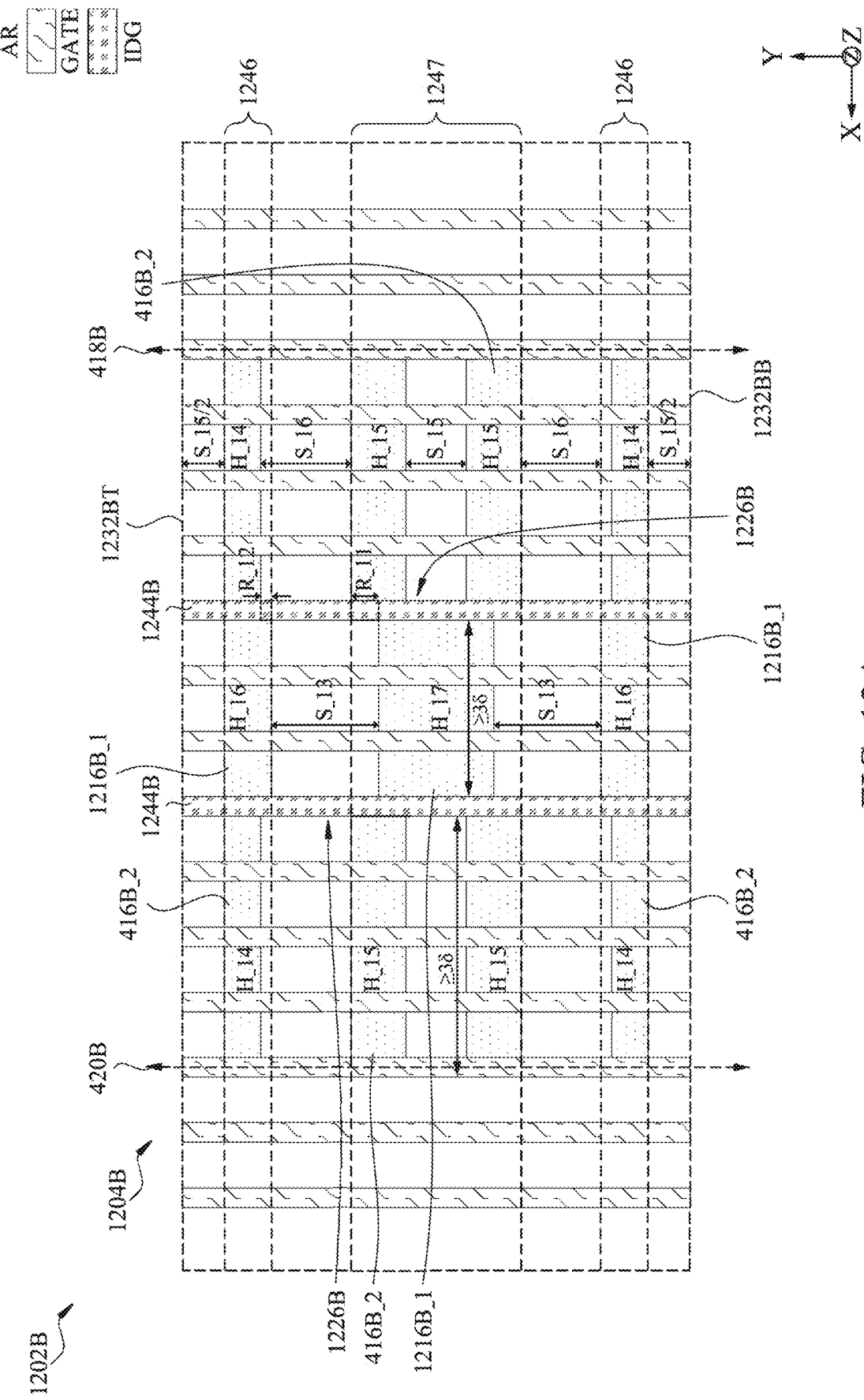
FIGS. 12A and 12B are plan views of a semiconductor device, in accordance with some embodiments.

FIG. 12A is a plan view of a semiconductor device 1202B, in accordance with some embodiments.

Cell region 1204B includes ARs 416B_2 and ARs 1216B_1. ARs 416B_2 are separated from ARs 1216B_1 by corresponding isolation dummy gates 1244B that occupy corresponding intervening regions 1226B. Isolation dummy gates 1244B extend from reference lines 1232BT to 1232BB. Due to each of isolation dummy gates 1244B, each of ARs 416B_2 and 1216B_1 in FIG. 12A is without full projection.

Semiconductor device 1202B is an example of semiconductor device 102 and is configured to be used within IC 100. In some embodiments, cell region 1204B is an example of cell region 104. In some embodiments, ARs 1216B_1 are HL sections, e.g., HL section 106. In some embodiments, ARs 416B_2 are LL sections, e.g., LL section 108.

Figure 12B:
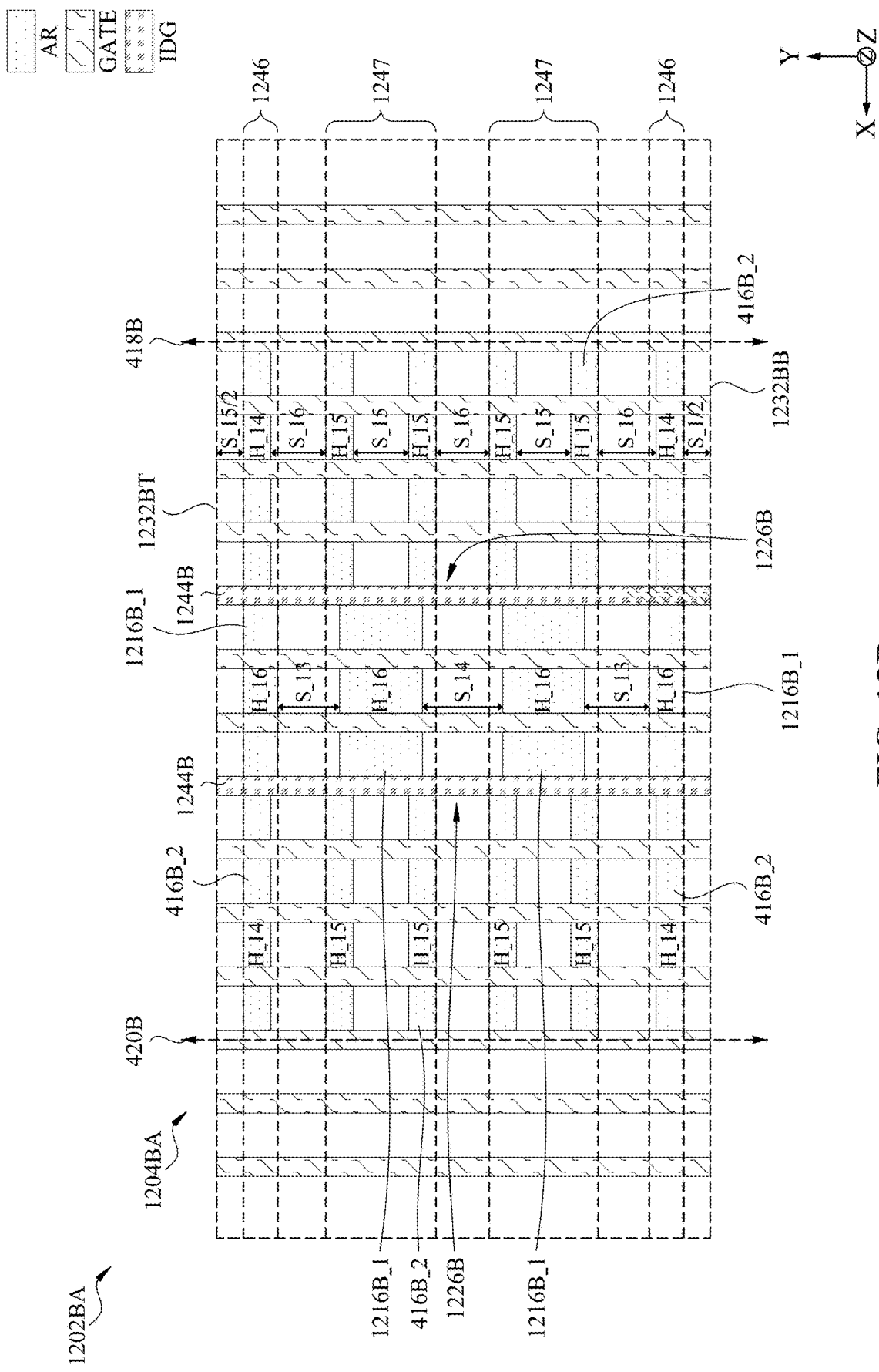

Cell region 1204B includes a set 1247 of ARs and upper and lower sets 1246 of corresponding ARs. In FIG. 12A, cell region 1204B is similar to cell region 904B of FIG. 9A. Upper and lower sets 1246 of FIG. 12A are similar to upper and lower sets 946 of FIG. 9A. Set 1247 of FIG. 12A is similar to set 947 of FIG. 9A. Discussion of FIGS. 12A-12B is limited to the differences between semiconductor device 902B and semiconductor devices 1202B and 1202BA of FIGS. 12A-12B for the sake of brevity, conciseness, and to reduce repetitiveness. Like elements retain their reference number while new or different elements are called out with different reference numbers.

Relative to the Y-axis: AR 1216B_1 of set 1247 is separated from ARs 1216B_1 of corresponding upper and lower sets 1246 by a distance S_13; ARs 416B_2 of set 1247 are separated from each other by a distance S_15; ARs 416B_2 of set 1247 are separated from corresponding ARs 416B_2 of upper and lower sets 1246 by a distance S_16; ARs 416B_2 of upper and lower sets 1246 have a height H_14; ARs 416B_2 of set 1247 have a height H_15; ARs 1216B_1 of upper and lower sets 1246 have a height H_16; and AR 1216B_1 of set 1247 has a height H_17.

Relative to the Y-axis and looking from a central location in cell region 1204B: the lower edge of AR 1216B_1 of upper set 1246 extends below the lower edge of ARs 416B_2 of upper set 1246; and the upper edge of AR 1216B_1 of lower set 1246 extends above the upper edge of ARs 416B_2 of lower set 1246.

FIG. 12B is a plan view of a semiconductor device 1202BA in accordance with some embodiments.

Cell region 1204BA of semiconductor device 1202BA of FIG. 12B is like cell region 1204B of semiconductor device 1202B, however, cell region 1204BA includes an additional set of ARs 1247 as compared to FIG. 12A. Relative to the Y-axis, ARs 1216B_1 of corresponding upper and lower sets 1247 are separated by a distance S_14. Distance S_14 is greater than or equal S_16, but is less than or equal to S_16 plus twice H_15.

Cell regions 1204B and 1204BA are configured according to design rules related to a first scenario or second scenario or third scenario or fourth scenario as follows:

When under a first scenario in which H_14=H_15 and S_15=S_16, then:

$$H\_14 \leq H\_16 \leq H\_14 + S\_15 \qquad \text{rule (44)}$$

$$S\_15 \leq H\_17 \leq S\_15 + 2H\_14 \qquad \text{rule (45)}$$

$$S\_15 \leq S\_13 \leq S\_15 + H\_14 \qquad \text{rule (46)}$$

$$S\_15 \leq S\_14 \leq S\_15 + 2H\_14 \qquad \text{rule (47)}$$

When under a second scenario in which H_14≠H_15 and S_15=S_16, then:

$$S\_15 \leq H\_17 \leq S\_15 + 2H\_15 \qquad \text{rule (48)}$$

$$S\_15 < S\_13 \leq S\_15 + H\_15 \qquad \text{rule (49)}$$

$$S\_15 \leq S\_14 \leq S\_15 + 2H\_15 \qquad \text{rule (50)}$$

When under a third scenario in which H_14=H_15 and S_15≠S_16, then:

$$H\_14 \leq H\_16 \leq H\_14 + S\_16 \qquad \text{rule (51)}$$

$$S\_16 \leq S\_13 \leq S\_16 + H\_14 \qquad \text{rule (52)}$$

$$S\_16 \leq S\_14 \leq S\_16 + 2H\_14 \qquad \text{rule (53)}$$

When under a fourth scenario in which H_14≠H_15 and S_15≠S_16, then:

$$S\_15 \leq H\_17 \leq S\_15 + 2H\_15 \qquad \text{rule (54)}$$

$$S\_16 \leq S\_13 < S\_16 + H\_15 \qquad \text{rule (55)}$$

$$S\_16 \leq S\_14 \leq S\_16 + 2H\_15 \qquad \text{rule (56)}$$

Figure 13:
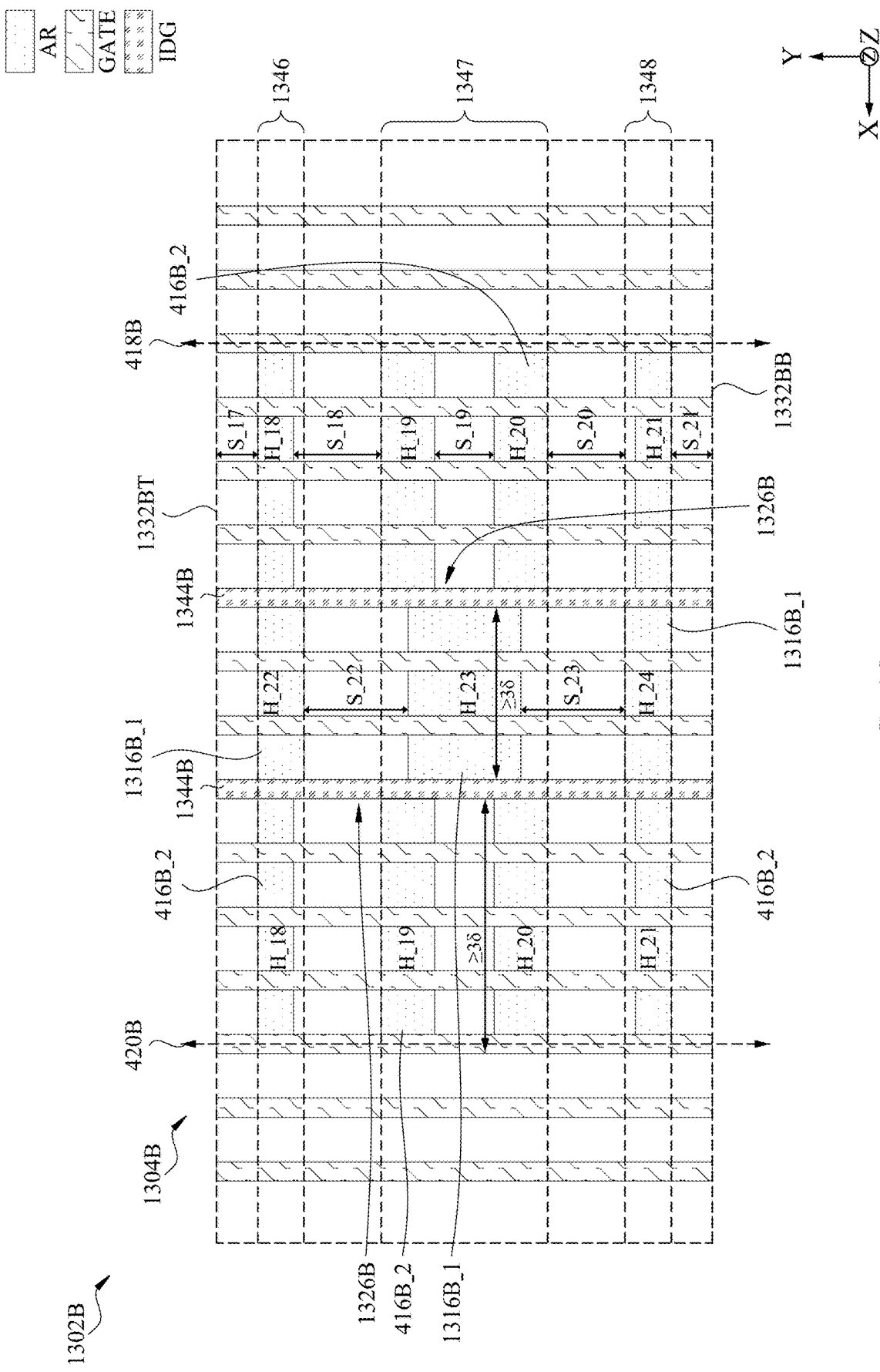
FIG. 13 is a plan view of a semiconductor device, in accordance with some embodiments.

FIG. 13 is a plan view of a semiconductor device 1302B, in accordance with some embodiments.

FIG. 13 is similar to FIG. 12A but differs primarily in terms of the design rules for FIG. 13 relate to a fifth scenario, whereas design rules for FIGS. 12A and 12B relate to the noted first, second, third and fourth scenarios.

Cell region 1304B includes ARs 416B_2 and ARs 1316B_1. ARs 416B_2 are separated from ARs 1316B_1 by corresponding isolation dummy gates 1344B that occupy corresponding intervening regions 1326B. Isolation dummy gates 1344B extend from reference lines 1332BT to 1332BB. Due to each of isolation dummy gates 1344B, each of ARs 416B_2 and 1316B_1 in FIG. 13 is without full projection.

Semiconductor device 1302B is an example of semiconductor device 102 and is configured to be used within IC 100. In some embodiments, cell region 1304B is an example of cell region 104. In some embodiments, ARs 1316B_1 are HL sections, e.g., HL section 106. In some embodiments, ARs 1316B_2 are LL sections, e.g., LL sections 416B_2 and 108.

Cell region 1304B includes a set 1347 of ARs and upper and lower sets 1346 of corresponding ARs. In FIG. 13, cell region 1304B is similar to cell region 904B of FIG. 9A. Upper and lower sets 1346 of FIG. 13 are similar to upper and lower sets 946 of FIG. 9A. Set 1347 of FIG. 13 is similar to set 947 of FIG. 9A. Discussion of FIG. 13 is limited to the differences between (1) semiconductor devices 1202B and 1202BA of corresponding FIGS. 12A and 12B and (2) semiconductor devices 1302B of FIG. 13 for the sake of brevity, conciseness, and to reduce repetitiveness Like elements retain their reference number while new or different elements are called out with different reference numbers.

Relative to the Y-axis: AR 1316B_1 of set 1347 is separated from ARs 1316B_1 of corresponding upper and lower sets 1346 by a distance S_22; ARs 416B_2 of set 1347 are separated from each other by a distance S_19; ARs 416B_2 of set 1347 are separated from corresponding ARs 416B_2 of upper and lower sets 1346 by a distance S_18; ARs 416B_2 of upper and lower sets 1346 have a height H_18; ARs 416B_2 of set 1347 have a height H_19; ARs 1316B_1 of upper and lower sets 1346 have a height H_22; and AR 1316B_1 of set 1347 has a height H_23.

Relative to the Y-axis and looking from a central location in cell region 1304B: the lower edge of AR 1316B_1 of upper set 1346 extends below the lower edge of ARs 416B_2 of upper set 1346; and the upper edge of AR 1316B_1 of lower set 1346 extends above the upper edge of ARs 416B_2 of lower set 1346.

Cell region 1304B is configured according to design rules relative to a fifth scenario, whereas cell regions 1204B and 1204BA of corresponding FIGS. 12A and 12B are configured according to the noted first, second, third and fourth scenarios. When under the fifth scenario, i.e., when H_18≠H_19≠H_20≠H_21 and S_17≠S_18≠S_19≠S_20≠S_21, then:

$$H\_18 \leq H\_22 \leq H\_18 + S\_18 \qquad \text{rule (57)}$$

$$S\_19 \leq H\_23 \leq S\_19 + H\_19 + H\_20 \qquad \text{rule (58)}$$

$$H\_21 \leq H\_24 \leq H\_21 + S\_20 \qquad \text{rule (59)}$$

$$S\_18 \leq S\_22 \leq S\_18 + H\_19 \qquad \text{rule (60)}$$

$$S\_20 \leq S\_23 \leq S\_20 + H\_20 \qquad \text{rule (61)}$$

Figure 14:
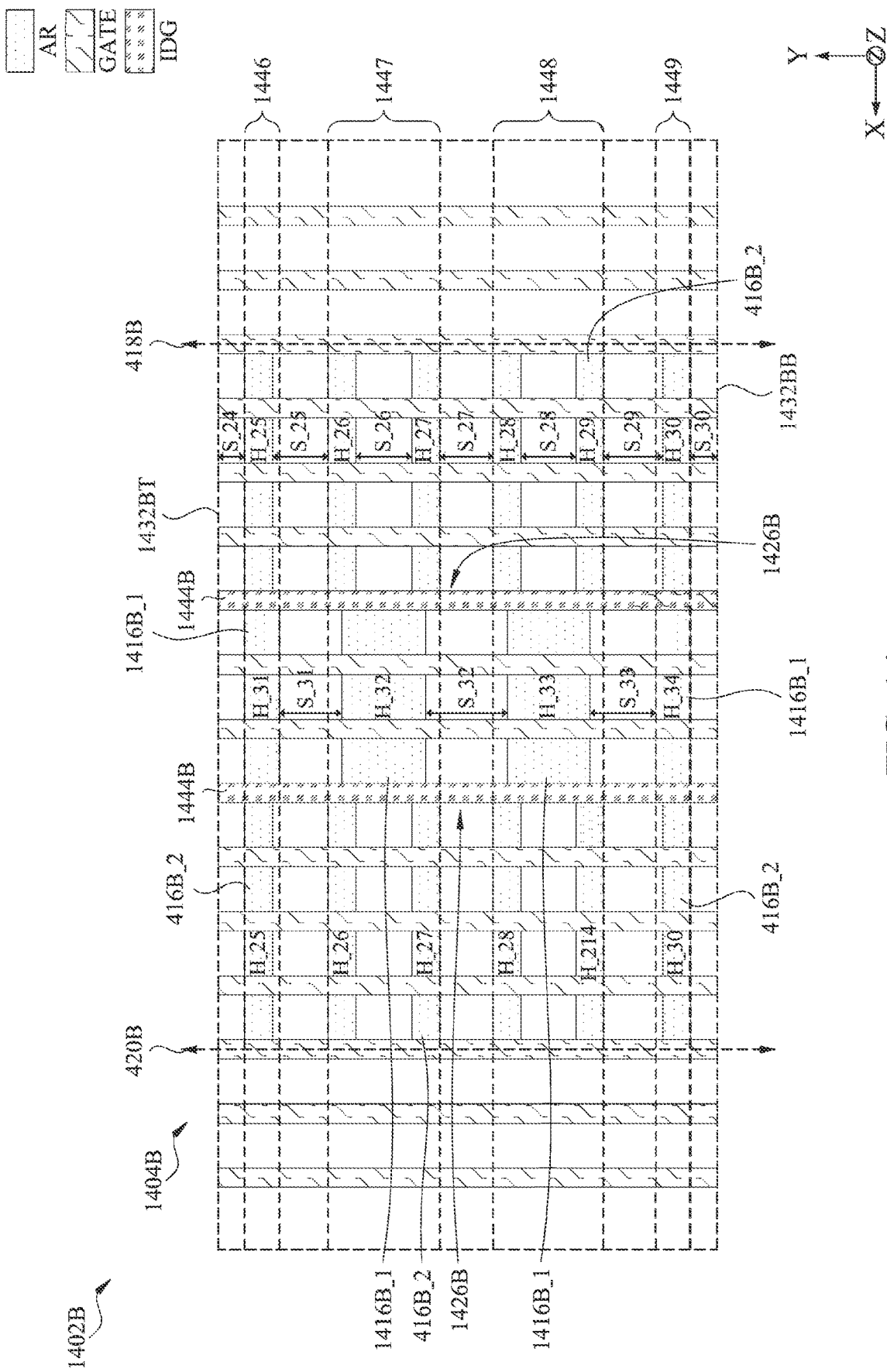
FIG. 14 is a plan view of a semiconductor device, in accordance with some embodiments.

FIG. 14 is a plan view of a semiconductor device 1402B, in accordance with some embodiments.

Semiconductor device 1402B is an example of semiconductor device 102 and is configured to be used within IC 100. In some embodiments, cell region 1404B is an example of cell region 104. In some embodiments, ARs 1416B_1 are HL sections, e.g., HL section 106. In some embodiments, ARs 416B_2 are LL sections, e.g., LL sections 416B_2 and 108.

Cell region 1404B includes an upper set 1447 of ARs, a lower set 1448 of ARs, an upper set 1446 of ARs and a lower set 1449 of ARs. In FIG. 14, cell region 1404B is similar to cell region 904B of FIG. 9A. Upper set 1446 of FIG. 14 is similar to upper set 946 of FIG. 9A. Lower set 1449 of FIG. 14 is similar to lower set 946 of FIG. 9A. Upper set 1447 of FIG. 14 is similar to upper set 947 of FIG. 9A. Lower set 1448 of FIG. 14 is similar to lower set 947 of FIG. 9A. Discussion of FIG. 14 is limited to the differences between semiconductor device 902B of FIG. 9A and semiconductor device 1402B of FIG. 14 for the sake of brevity, conciseness, and to reduce repetitiveness. Like elements retain their reference number while new or different elements are called out with different reference numbers.

Cell region 1404B includes ARs 416B_2 and ARs 1416B_1. ARs 416B_2 are separated from ARs corresponding ARs 1416B_1 by corresponding isolation dummy gates 1444B that occupy corresponding intervening regions 1426B. Isolation dummy gates extend from reference lines 1444B to 1432BB. Due to each of isolation dummy gates 1444B, each of ARs 416B_2 and 1416B_1 in FIG. 14 is without full projection.

Relative to the Y-axis: AR 1416B_1 of set 1446 is separated from AR 1416B_1 of set 1447 by a distance S_31;

AR 1416B_1 of set 1447 is separated from AR 1416B_1 of set 1448 by a distance S_32; AR 1416B_1 of set 1448 is separated from AR 1416B_1 of set 1449 by a distance S_33; ARs 416B_2 of set 1446 are separated from corresponding upper ARs 416B_2 of set 1447 by a distance S_25; ARs 416B_2 of set 1447 are separated from each other by a distance S_26; lower ARs 416B_2 of set 1447 are separated from corresponding upper ARs 416B_2 of set 1448 by a distance S_27; ARs 416B_2 of set 1448 are separated from each other by a distance S_28; lower ARs 416B_2 of set 1448 are separated from corresponding upper ARs 416B_2 of set 1449 by a distance S_29; ARs 416B_2 of set 1446 have a height H_25; upper ARs 416B_2 of set 1447 have a height H_26; lower ARs 416B_2 of set 1447 have a height H_27; upper ARs 416B_2 of set 1448 have a height H_28; lower ARs 416B_2 of set 1448 have a height H_29; and ARs 416B_2 of set 1449 have a height H_30.

When $H\_25 \neq H\_26 \neq H\_27 \neq H\_28 \neq H\_29 \neq H\_30$ and $S\_24 \neq S\_25 \neq S\_26 \neq S\_27 \neq S\_28 \neq S\_29 \neq S\_30$, then:

$$H\_25 \leq H\_31 \leq H\_25 + S\_25 \quad \text{rule (62)}$$

$$S\_26 \leq H\_32 \leq S\_26 + H\_26 + H\_27 \quad \text{rule (63)}$$

$$S\_28 \leq H\_33 \leq S\_28 + H\_28 + H\_29 \quad \text{rule (64)}$$

$$H\_30 \leq H\_34 \leq H\_30 + S\_29 \quad \text{rule (65)}$$

$$S\_25 \leq S\_31 \leq S\_25 + H\_26 \quad \text{rule (66)}$$

$$S\_27 \leq S\_32 \leq S\_27 + H\_27 + H\_28 \quad \text{rule (67)}$$

$$S\_29 \leq S\_33 \leq S\_29 + H\_29 \quad \text{rule (68)}$$

Figure 15A:
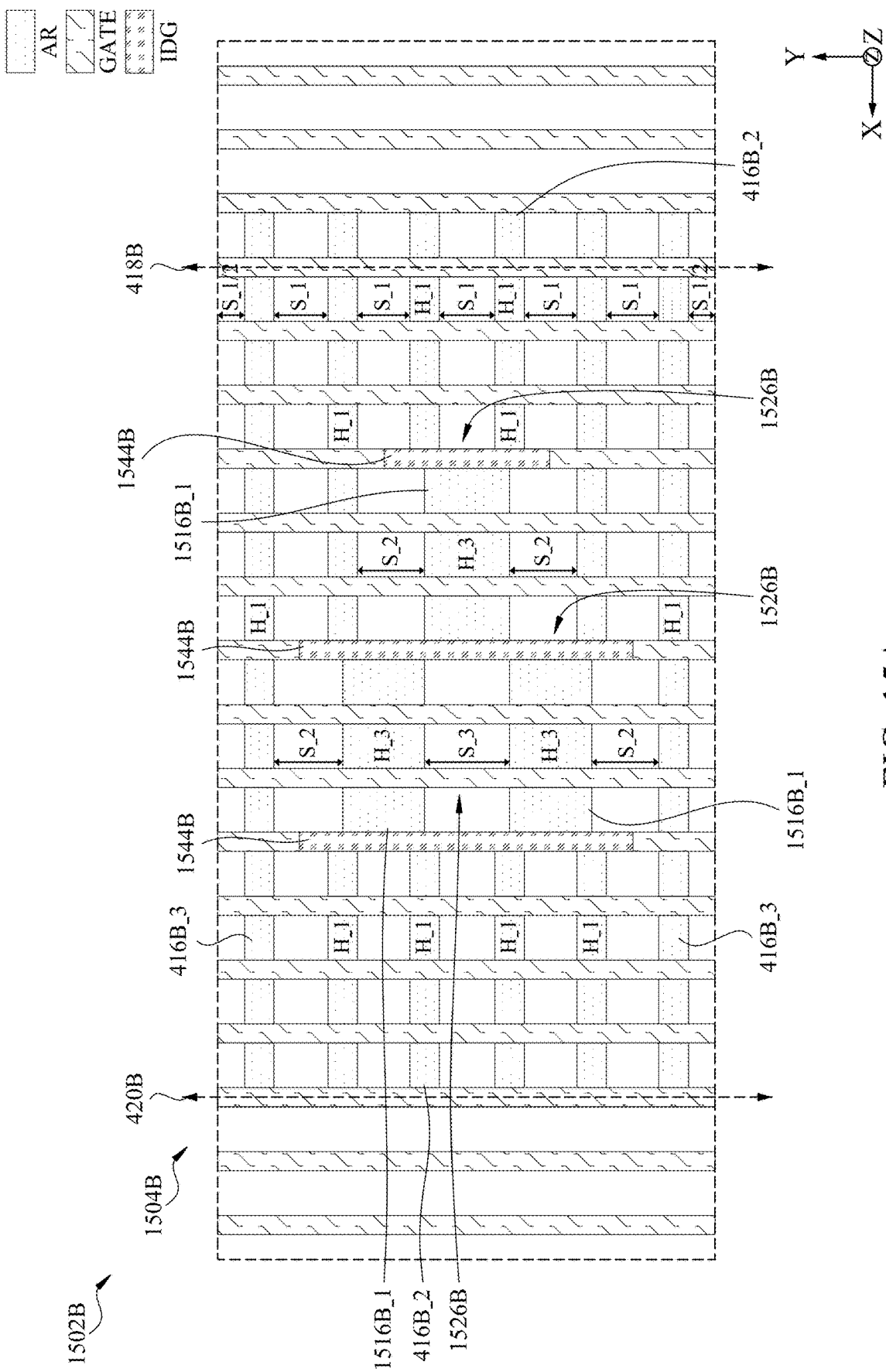
FIGS. 15A, 15B, and 15C are plan views of a semiconductor device, in accordance with some embodiments.

FIG. 15A is a plan view of a semiconductor device 1502B, in accordance with some embodiments.

Semiconductor device 1502B is an example of semiconductor device 102 and is configured to be used within IC 100. In some embodiments, semiconductor device 1502B is a variation of semiconductor device 302B. In some embodiments, cell region 1504B is an example of cell region 104. In some embodiments, AR 1516B_1 is an HL section, e.g., HL section 106. In some embodiments, ARs 416B_2 and 416B_3 are LL sections, e.g., LL section 108.

In FIG. 15A, cell region 1504B includes ARs 416B_2, 416B_3, and AR 1516B_1. ARs 416B_2 are separated from corresponding ARs 1516B_1 by corresponding isolation dummy gates 1544B that occupy corresponding intervening regions 1526B. Left-upper and left-lower ARs 1516B_1 share left isolation dummy gates 1544B. Left-upper, left-lower and right-middle ARs 1516B_1 share middle isolation dummy gates 1544B.

Right-middle AR 1516B_1 is associated with right isolation dummy gates 1544B, i.e., right-middle AR 1516B_1 does not share right isolation dummy gate 1544B with another instance of AR 1516B_1.

Cell region 1504B includes an uppermost and lowermost AR 416B_3 that extends from imaginary reference line 418A to imaginary reference line 420A. In some embodiments, the uppermost and lowermost AR 416B_3 have different heights (see FIG. 13). Each of ARs 416B_2 and 416B_3 have a height of H_1 that is smaller than the height of AR 1516B_1 that is H_3. Each of ARs 416B_3 in FIG. 15A is shown with full projection.

In some embodiments, the location of ARs 1516B_1 are different. In some embodiments, relative to the X-axis, ARs 1516B_1 do not overlap. In FIG. 15A, relative to the Y-axis: ARs 416B_3 are separated from corresponding ARs 416B_2 by distance S_1; ARs 416B_2 are separated from each other by distance S_1; ARs 1516B_1 are separated from corresponding ARs 416B_2 and 416B_3 by distance S_2; ARs 1516B_1 are separated from each other by distance S_3; ARs 416B_1 have height H_1 and ARs 1516B_1 have a height H_3. Cell region 1504B is configured according to design rules (3), (4), and (5) to satisfy DRC.

Figure 15B:
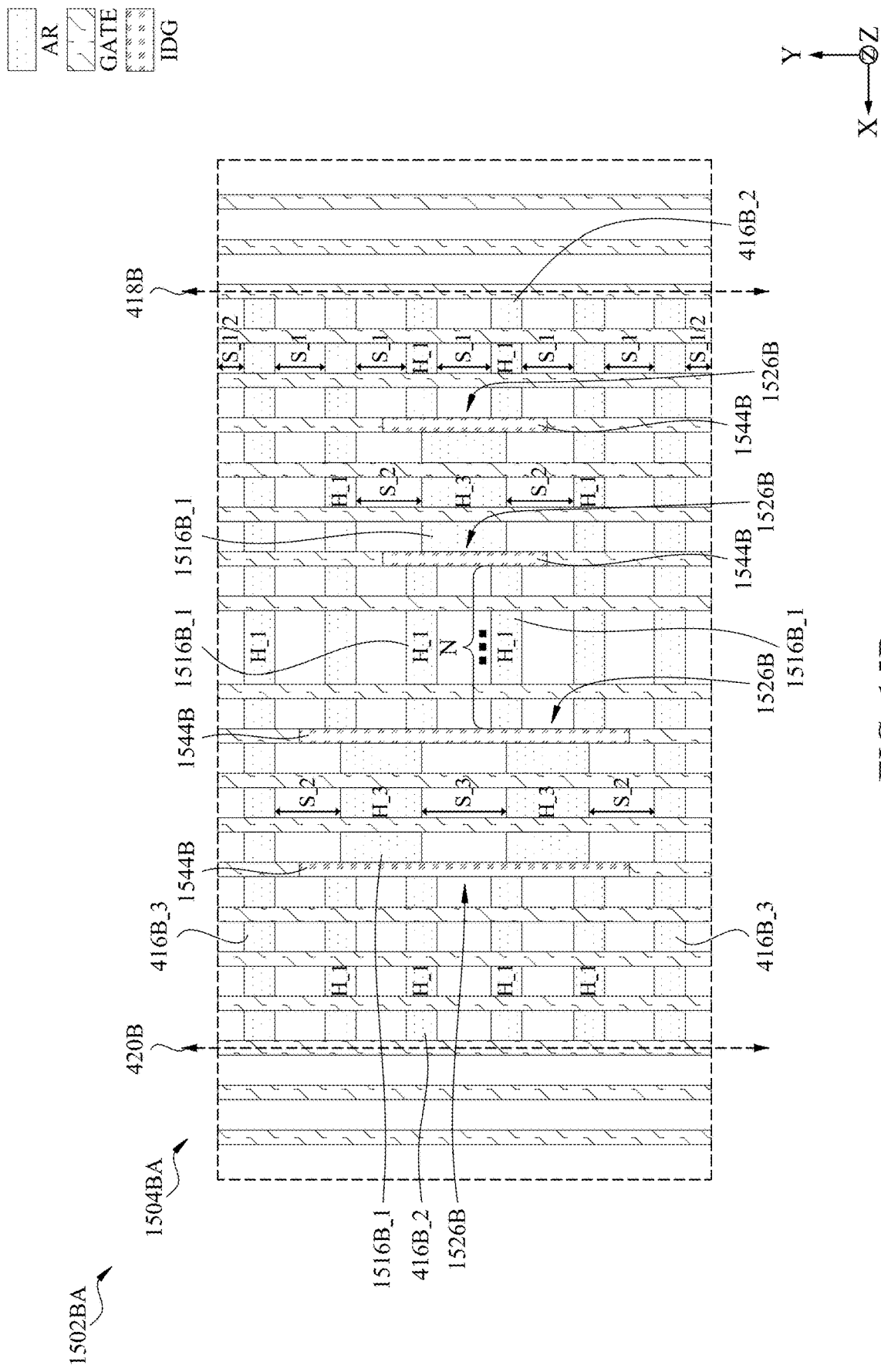

FIG. 15B is a plan view of a semiconductor device 1502BA, in accordance with some embodiments.

Cell region 1504BA of FIG. 15B is similar to cell region 1504B of FIG. 15A. In FIG. 15B, one or more shorter (relative to the Y-axis) instances of AR 1516B_1 are formed between two taller (relative to the Y-axis) instances of AR 1516B_1 on the left and one taller instance of AR 1516B_1 on the right such that FIG. 15B includes an additional instance of isolation dummy gate 1544B as compared to FIG. 15A, i.e., FIG. 15B includes far-left, left-middle, right-middle and far-right isolation dummy gates 1544B wherein right-middle isolation dummy gate 1544B is the additional instance of isolation dummy gate 1544B as compared to FIG. 15A. The shorter instances of AR 1516B_1 have a width of N*δ, where N is an integer and N≥1.

Figure 15C:
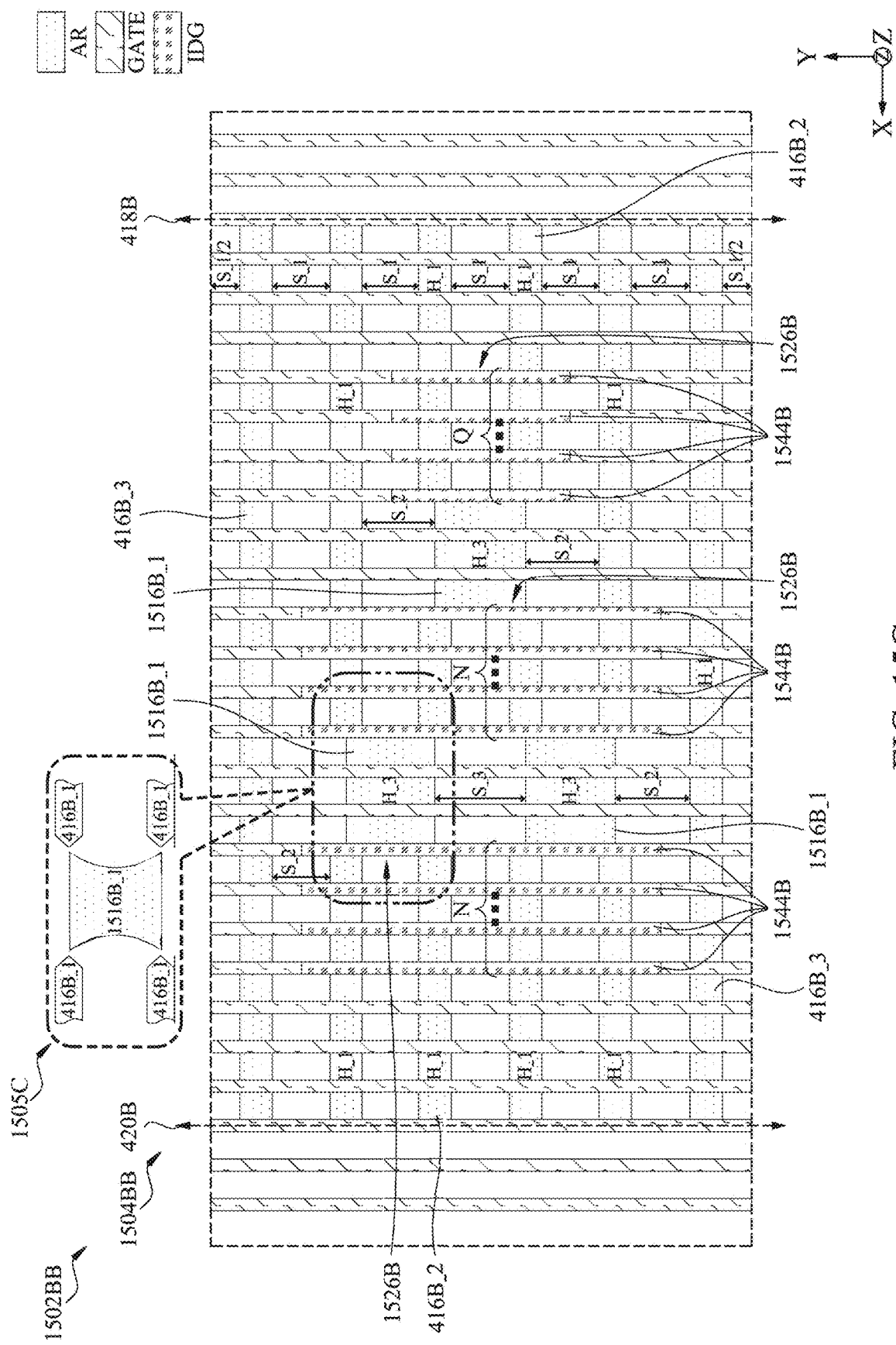

FIG. 15C is a plan view of a semiconductor device 1502BB, in accordance with some embodiments.

Cell region 1504BB of FIG. 15C is similar to cell region 1504BA of FIG. 15B. Whereas FIG. 15B includes one instance of isolation dummy gate 1544B to the left of each of upper-left and lower-left ARs 1516B_1, FIG. 15C includes M instances of isolation dummy gate 1544B to the left of each of upper-left and lower-left ARs 1516B_1, where M is an integer and M≥2. In FIG. 15C, M=4. Whereas FIG. 15B includes two instances of isolation dummy gate 1544B to the right of each of upper-left and lower-left ARs 1516B_1 and the right of right-middle AR 1516B_1, FIG. 15C includes N instances of isolation dummy gate 1544B to the right of each of upper-left and lower-left ARs 1516B_1 and the left of right-middle AR 1516B_1, where N is an integer and N≥2. In FIG. 15C, N=4. Whereas FIG. 15B includes one instance of isolation dummy gate 1544B to the right of right-middle AR 1516B_1, FIG. 15C includes Q instances of isolation dummy gate 1544B to the right of right-middle AR 1516B_1, where Q is an integer and Q≥2. In FIG. 15C, Q=4. Under some circumstances, limitations of etching techniques resultantly cause: ARs 1516B_1, 1516B_2 and 1516B_3 to have shapes (as shown in exploded view 1505C of FIG. 15C) which resemble biconcave (or double concave) lenses rather than the rectangular shapes shown in FIG. 15C; and ARs 416B_2 to have hexagonal shapes rather than the rectangular shapes shown in FIG. 15C. Under such circumstances (see exploded view 1505C of FIG. 15C), the pointed corners of the biconcave instances of ARs 1516B_1 align with pointed ends of the hexagonal instances of ARs 416B_2, which leads to increased leakage current. In some embodiments under such circumstances (see exploded view 1505C of FIG. 15C), the additional instances of isolation dummy gate 1544B have an advantage of reducing leakage current.

Figure 16A:
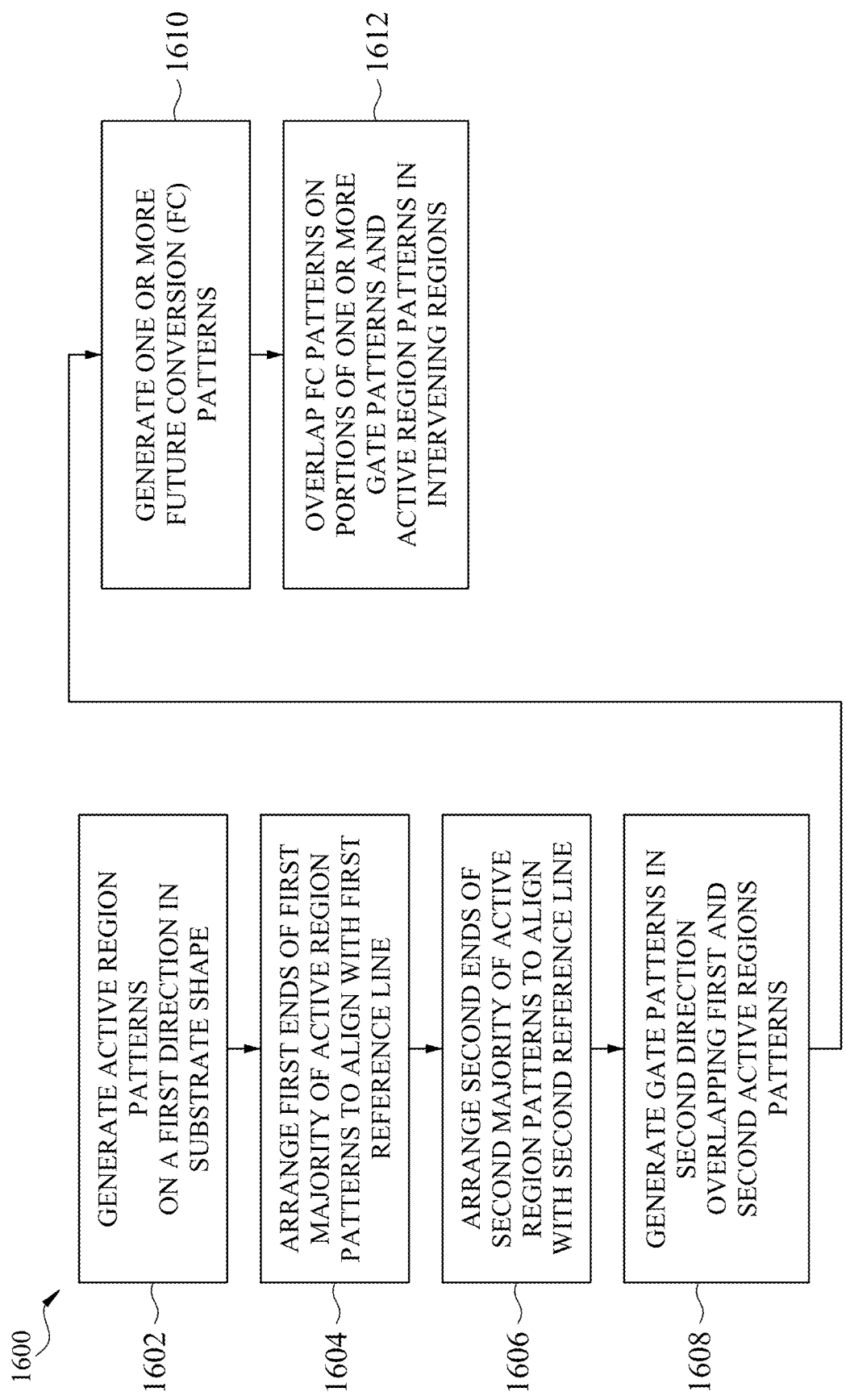
FIG. 16A is a flowchart of a method of generating a layout diagram, in accordance with some embodiments.

FIG. 16A is a flowchart of a method 1600 of generating a layout diagram, in accordance with some embodiments.

At a block 1602 of FIG. 16, active region patterns are generated extending in a first direction on a substrate. An example of the first direction is the X-axis. Examples of active region patterns include AR patterns in groups 216A_1 and 216A_2 of AR patterns of FIG. 2A, AR patterns 316A_1, 316A_2 and 316A_3 of FIG. 3A, or the like. From block 1602, flow proceeds to block 1604.

At block 1604, a first majority of the AR patterns is arranged so that first ends of the first majority of the AR patterns align with an imaginary first reference line that extends parallel to the Y-axis. The first reference line is parallel and proximal to a first side of a cell region. Examples of such a first majority of AR patterns include group 216A_2 of FIG. 2A that extend correspondingly from an imaginary central reference line 219A of FIG. 2A to a first imaginary reference line 218A of FIG. 2A, AR patterns 316A_3 and selected AR patterns 316A_2 that extend from an imaginary central reference line 319A of FIG. 3A to a first imaginary reference line 318A of FIG. 3A, or the like. Continuing the example, first imaginary reference lines 218A and 318A are proximal and parallel with corresponding first sides 210AR and 310AR of corresponding cell regions 204A and 304A. From block 1604, flow proceeds to block 1606.

At block 1606, a second majority of the AR patterns is arranged so that second ends of the second majority of the AR patterns align with an imaginary second reference line that extends parallel to the Y-axis. The second reference line is parallel and proximal to a second side of the cell region. Examples of such a second majority of AR patterns include ARs patterns in groups 216A_1 of FIG. 2A that extend correspondingly from imaginary central reference line 219A of FIG. 2A to a second imaginary reference line 220A in FIG. 2A, and AR patterns 316A_3 and selected AR patterns 316A_2 that extend from imaginary central reference line 319A of FIG. 3A to a second imaginary reference line 320A in FIG. 3A, or the like. Continuing the example, second imaginary reference lines 220A and 320A are proximal and parallel with second sides 210AL and 310AL of corresponding cell regions 204A and 304A. In some embodiments, the second majority is different than the first majority. In some embodiments, the second majority is the same as the first majority. From block 1606, flow proceeds to a block 1608.

At block 1608, gate patterns are generated. The gate patterns are substantially parallel to each other and extend parallel to the Y-axis. The gate patterns are overlaid on the active region patterns. Examples of such gate patterns are instances of gate patterns of groups 222A and 322A of corresponding FIGS. 2A and 3A, or the like. From block 1608, flow proceeds to a block 1610.

At block 1610, future conversion (FC) patterns are generated. Examples of such FC patterns are instances of FC patterns 224A and 324A of corresponding FIGS. 2A and 3A, or the like. From block 1610, flow proceeds to a block 1612.

At block 1612, FC patterns are arranged so as to overlap portions of one or more gate patterns and one or more AR patterns at corresponding intervening regions. Examples of such intervening regions are instances of intervening regions 226A and 326A of corresponding FIGS. 2A and 3A.

Figure 16B:
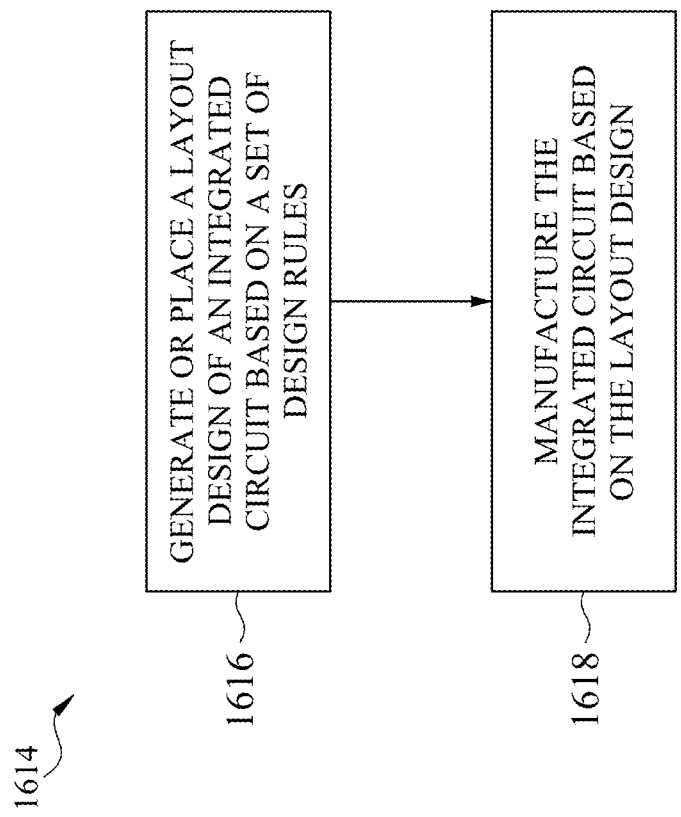
FIG. 16B is a flowchart of a method of manufacturing a semiconductor device, in accordance with some embodiments.

FIG. 16B is a flowchart of a method 1614 of manufacturing a semiconductor device, in accordance with some embodiments.

Method 1614 is implementable, for example, using EDA system 1800 (FIG. 18, discussed below) and an integrated circuit (IC), manufacturing system 1900 (FIG. 19, discussed below), in accordance with some embodiments. Examples of a semiconductor device which can be manufactured according to method 1614 include semiconductor devices 202B, 302B, 402B, 502B, 602B, 702B, 802B, 902B, 1002B, 1102B, 1202B, 1302B, 1402B and 1502B of corresponding FIGS. 2B, 3B, 4A, 5A, 6A, 7A, 8A, 9A, 10A, 11A, 12A, 13, 14 and 15A, semiconductor devices corresponding to various ones of the layout diagrams disclosed herein, or the like.

In FIG. 16B, method 1614 includes blocks 1616-1618. At block 1616, a layout diagram is generated which, among other things, includes one or more of layout diagrams disclosed herein, e.g., a layout diagram resulting from method 1600 of FIG. 16A, layout diagrams corresponding to semiconductor devices 202B, 302B, 402B, 502B, 602B, 702B, 802B, 902B, 1002B, 1102B, 1202B, 1302B, 1402B and 1502B of corresponding FIGS. 2B, 3B, 4A, 5A, 6A, 7A, 8A, 9A, 10A, 11A, 12A, 13, 14 and 15A, or the like. Block 1616 is implementable, for example, using EDA system 1800 (FIG. 18, discussed below), in accordance with some embodiments.

More particularly, block 1616 includes generating shapes corresponding to structures in a semiconductor diagram which are to be represented. For example: where the layout diagram being generated corresponds to cell region 204A, block 1616 includes generating shapes corresponding to the structures shown in cell region 204B; where the layout diagram being generated corresponds to cell region 304A, block 1616 includes generating shapes corresponding to the structures shown in cell region 304B; or the like. From block 1616, flow proceeds to block 1618.

At block 1618, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 1900 in FIG. 19 below.

Figure 17A:
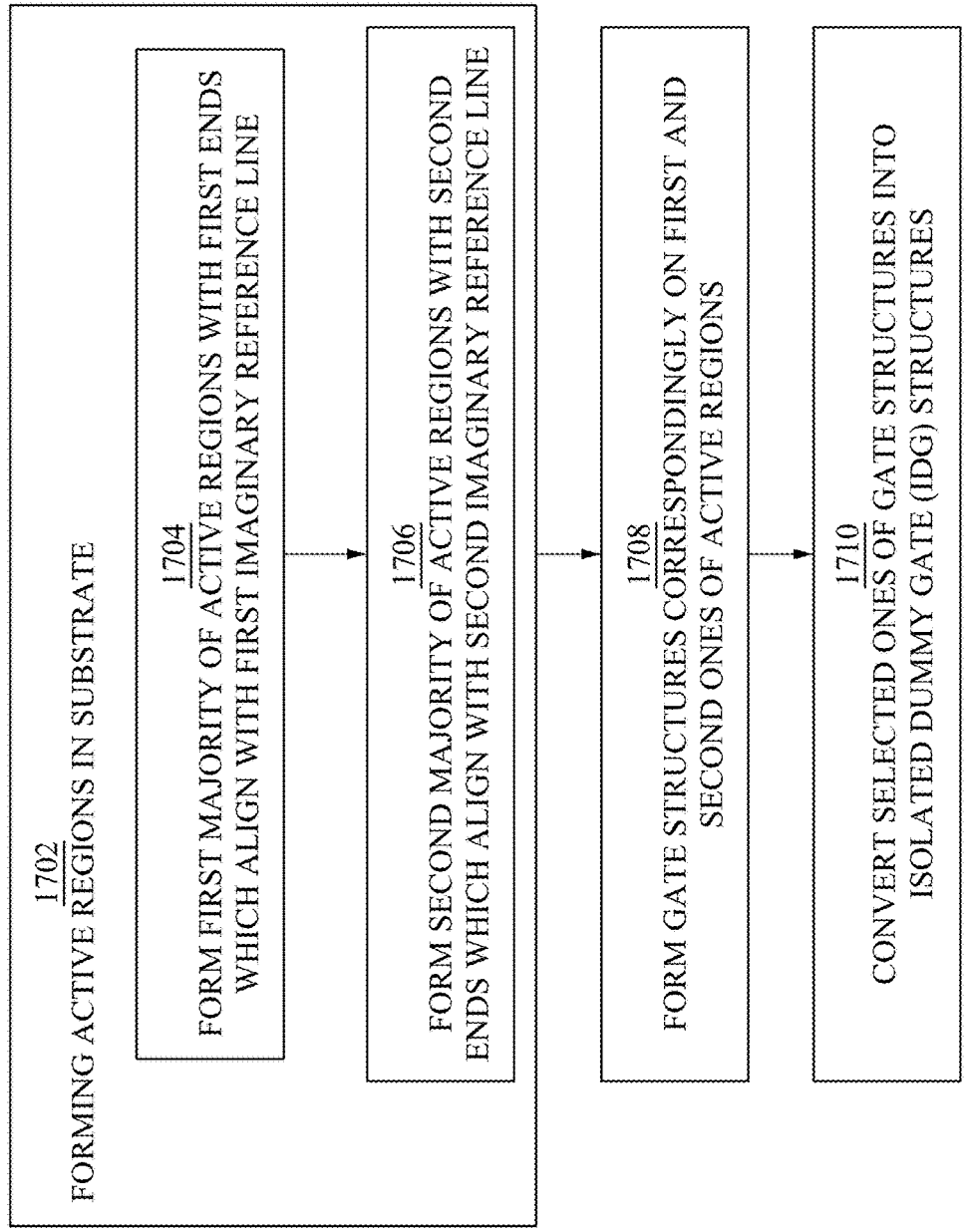
FIGS. 17A and 17B are flowcharts of a method of manufacturing a semiconductor device, in accordance with some embodiments.
Figure 17B:
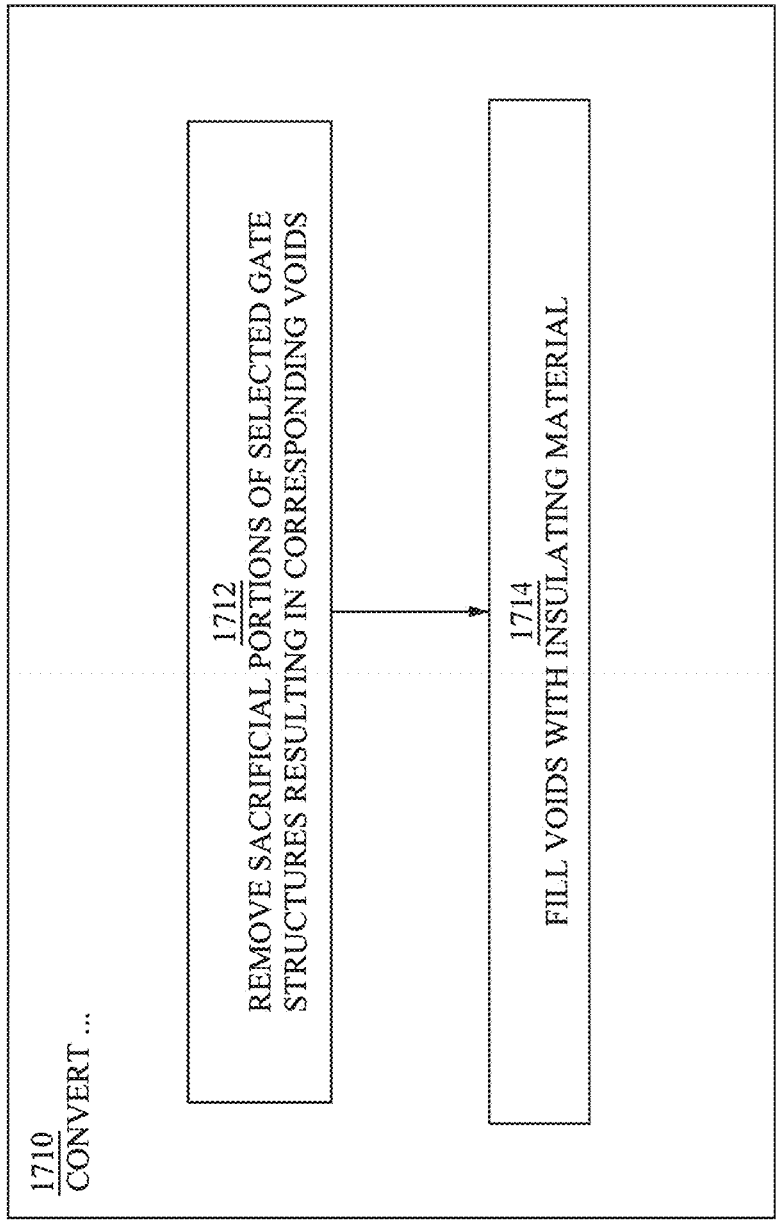

FIGS. 17A-17B are corresponding flowcharts of a method 1700 of manufacturing an semiconductor device, in accordance with some embodiments.

Method 1700 includes blocks 1702-1714. At block 1702, active regions are formed in a substrate where the active regions extend in a first direction. An example of the first direction is the X-axis. Examples of AR patterns in layout diagrams corresponding to the active regions in the substrate extending the first direction include the AR patterns of FIGS. 2A and 3A, or the like. Examples of active regions corresponding to the active regions in the substrate extending the first direction include the AR regions of FIGS. 2A and 3B, or the like. Block 1702 includes blocks 1704 and 1706.

At block 1704, a first majority of the active regions are formed with first ends which align with an imaginary first reference line extending in a second direction perpendicular to the first direction. An example of the second direction is the Y-axis. A first side of a cell region is parallel and proximal to the first reference line. Examples of such a first majority of active regions include ARs in groups 216B_2 of FIG. 2B that extend correspondingly from an imaginary central reference line 219B of FIG. 2B to a first imaginary reference line 218B of FIG. 2B, active regions 316B_3 and selected active regions 316B_2 that extend from an imaginary central reference line 319B of FIG. 3B to a first imaginary reference line 318B of FIG. 3B, or the like. Continuing the example, first imaginary reference lines 218B and 318B are proximal and parallel with corresponding first sides 210BR and 310BR of corresponding cell regions 204B and 304B. From block 1704, flow proceeds to block 1706.

At block 1706, a second majority of the active regions are formed with second ends which align with an imaginary second reference line that extends in the second direction. A second side of a cell region is parallel and proximal to the second reference line. Examples of such a second majority of active regions include ARs in groups 216B_1 of FIG. 2B that extend correspondingly from imaginary central reference line 219B of FIG. 2B to a second imaginary reference line 220B in FIG. 2B, and active regions 316B_3 and selected active regions 316B_2 that extend from imaginary central reference line 319B of FIG. 3B to a second imaginary reference line 320B in FIG. 3B, or the like. Continuing the example, second imaginary reference lines 220B and 320B are proximal and parallel with second sides 210BL and 310BL of corresponding cell regions 204B and 304B. In some embodiments, the second majority is different than the first majority. In some embodiments, the second majority is the same as the first majority. From block 1706, flow proceeds to block 1708.

At block 1708, gate structures are formed on first and second ones of the AR. Examples of gate patterns corresponding to the gate structures of groups 222B and 322B, which correspond to gate patterns of groups 222A and 322A of corresponding FIGS. 2A and 3A, or the like. From block 1708, flow proceeds to block 1710.

At block 1710, selected gate structures are converted into corresponding isolation dummy gates such that none of the gate structures occupies an intervening region between the first and second active regions. In some embodiments, the concurrent formation of the isolation dummy gates includes multiple steps including: sacrificing/removing (e.g., etching) each of the sacrificial portions of the selected gate structures representing the intervening region to form a trench removing the gate structure and the AR below the gate structure. Examples of FC patterns (based on which isolation dummy gates are formed) and corresponding intervening regions include FC patterns 224A and 324A occupying corresponding intervening regions 226A and 326A of corresponding FIGS. 2A and 3A, or the like. Examples of isolation dummy gates and corresponding intervening regions include isolation dummy gates 244B and 344B occupying corresponding intervening regions 226B and 326B of corresponding FIGS. 2B and 3B, or the like. From block 1710, flow proceeds to block 1712.

In FIG. 17B, block 1710 includes blocks 1712 and 1714. At block 1712, sacrificial portions of the selected gate structures are removed resulting in corresponding voids. Relative to the first direction, sacrificial portions of selected ones of the gate structures correspondingly overlap first and second active regions at corresponding abutment areas where the first and second active regions abut the intervening region. Relative to a third direction, e.g., the Z-axis, perpendicular to each of the first and second directions, the voids have a first depth. Removing portions of the selected gate structures exposes sacrificial portions of the first and second active regions which correspondingly underlie the sacrificial portions of the selected gate structures. In some embodiments, the sacrificial portions of the first and second active regions are removed thereby deepening the voids correspondingly to a second depth which is greater than the first depth. Examples of such voids include the voids AR layer 394 in FIGS. 3C-3D that are filled by corresponding isolation dummy gates 344B, or the like. From block 1712, flow proceeds to block 1714.

At block 1714, the voids are filled with insulating material. Filling the voids fills the voids to the second depth with the insulating material. Examples of the insulating material include the insulating material which comprise isolation dummy gates 344B in FIGS. 3C-3D, or the like. isolation dummy gates separate one or more active regions into a first portion and a second portion. The first and second portions are separated by the isolation dummy gate structure.

Figure 18:
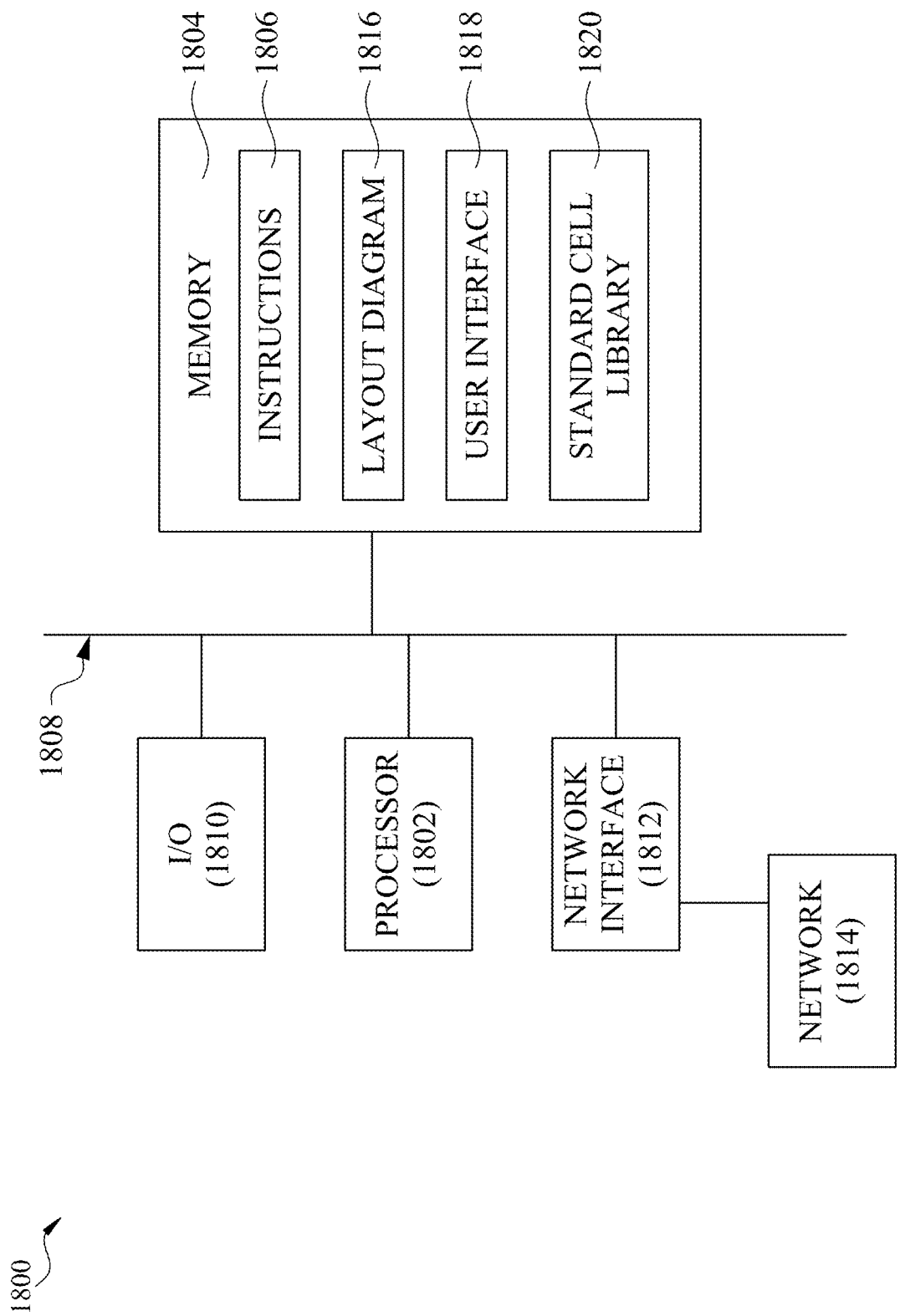
FIG. 18 is a block diagram of an electronic design automation (EDA) system in accordance with some embodiments.

FIG. 18 is a block diagram of an electronic design automation (EDA) system 1800 in accordance with some embodiments.

In some embodiments, EDA system 1800 includes an APR system. The method 1700 of flowchart of FIG. 17A is implemented, for example, using EDA system 1800, in accordance with some embodiments, in order to generate an instance of non-fully projected cell structures 204B, 304B, 404B, 504B, 604B, 704B, 804B, 904B, 1004B, 1104B, 1204B, 1304B, 1404B or 1504B, or other suitable structures are within the contemplated scope of the disclosure.

In some embodiments, EDA system 1800 is a general purpose computing device including a hardware processor 1802 and a non-transitory, computer-readable storage medium 1804. Storage medium 1804, amongst other things, is encoded with, i.e., stores, computer program code 1806, i.e., a set of executable instructions. Execution of instructions 1806 by hardware processor 1802 represents (at least in part) an EDA tool which implements a portion or all of, e.g., the methods of FIGS. 16A, 16B, 17A, and 17B, in accordance with one or more embodiments (hereinafter, the noted processes and/or methods). Storage medium 1804, amongst other things, stores layout diagram 1816 that includes layout diagrams 202A and 302A, and other layout diagrams of the like within the scope of the present disclosure.

Processor 1802 is electrically coupled to computer-readable storage medium 1804 via a bus 1808. Processor 1802 is further electrically coupled to an I/O interface 1810 by bus 1808. A network interface 1812 is further electrically connected to processor 1802 via bus 1808. Network interface 1812 is connected to a network 1814, so that processor 1802 and computer-readable storage medium 1804 are capable of connecting to external elements via network 1814. Processor 1802 is configured to execute computer program code 1806 encoded in computer-readable storage medium 1804 in order to cause system 1800 to be usable for performing a portion or all of the noted processes and/or methods. In one or more embodiments, processor 1802 is a central processing unit (CPU), a multi-processor, a distributed processing system, an application specific integrated circuit (ASIC), and/or a suitable processing unit.

In one or more embodiments, computer-readable storage medium 1804 is an electronic, magnetic, optical, electromagnetic, infrared, and/or a semiconductor system (or apparatus or device). For example, computer-readable storage medium 1804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1804 includes a compact disk-read only memory (CD-ROM), a compact disk-read/write (CD-R/W), and/or a digital video disc (DVD).

In one or more embodiments, storage medium 1804 stores computer program code 1806 configured to cause system 1800 (where such execution represents (at least in part) the EDA tool) to be usable for performing a portion or all of the noted processes and/or methods. In one or more embodiments, storage medium 1804 further stores information which facilitates performing a portion or all of the noted processes and/or methods. In one or more embodiments, storage medium 1804 stores library 1820 of standard cells including such standard cells as disclosed herein.

EDA system 1800 includes I/O interface 1810. I/O interface 1810 is coupled to external circuitry. In one or more embodiments, I/O interface 1810 includes a keyboard, keypad, mouse, trackball, trackpad, touchscreen, and/or cursor direction keys for communicating information and commands to processor 1802.

EDA system 1800 further includes network interface 1812 coupled to processor 1802. Network interface 1812 allows system 1800 to communicate with network 1814, to which one or more other computer systems are connected. Network interface 1812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1800.

System 1800 is configured to receive information through I/O interface 1810. The information received through I/O interface 1810 includes one or more of instructions, data, design rules, libraries of standard cells, and/or other parameters for processing by processor 1802. The information is transferred to processor 1802 via bus 1808. EDA system 1800 is configured to receive information related to a UI through I/O interface 1810. The information is stored in computer-readable storage medium 1804 as user interface (UI) 1818.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1800. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 19:
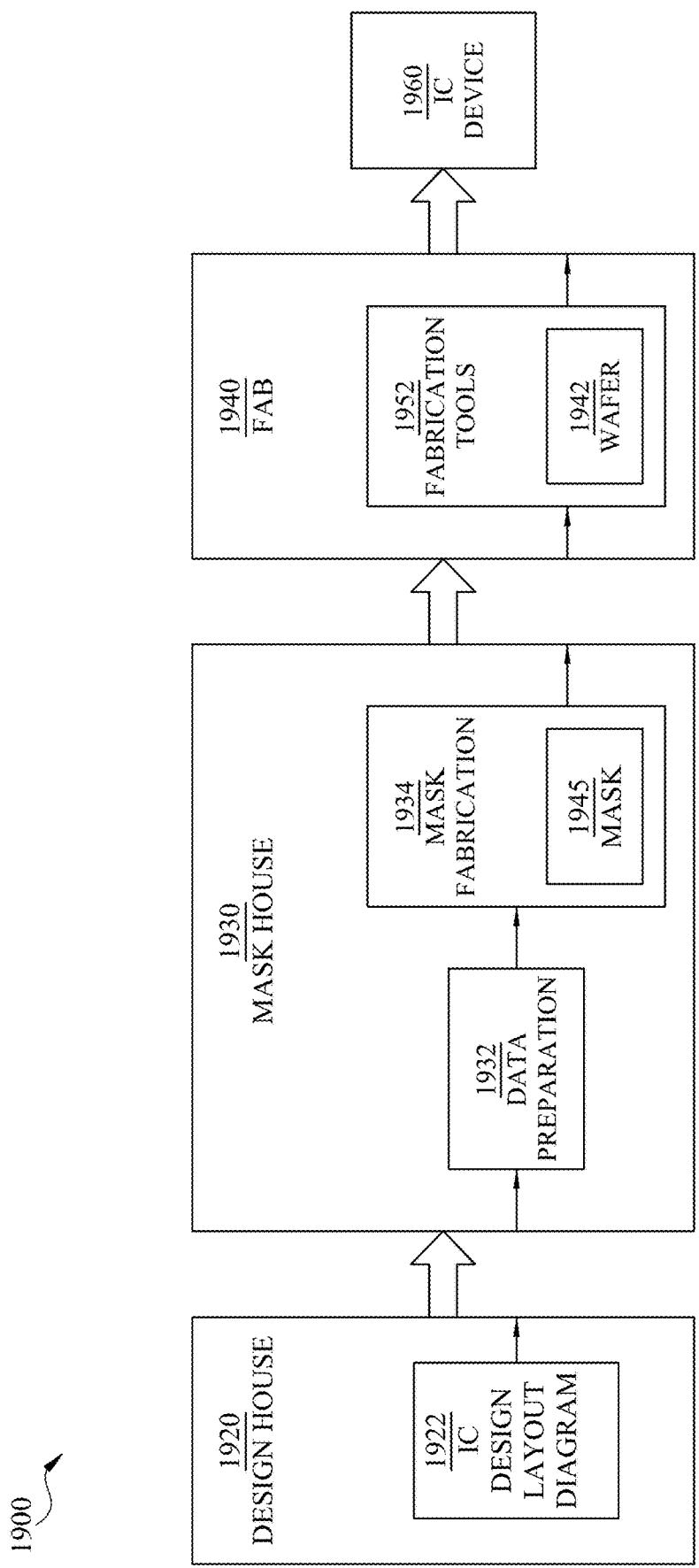
FIG. 19 is a block diagram of an integrated circuit (IC) manufacturing system, and an IC manufacturing flow associated therewith, in accordance with some embodiments.

FIG. 19 is a block diagram of an integrated circuit (IC) manufacturing system 1900, and an IC manufacturing flow associated therewith, in accordance with some embodiments.

After block 1616 of FIG. 16B, based on the layout, at least one of (A) one or more semiconductor masks or (B) at least one component in a layer of an inchoate semiconductor integrated circuit is fabricated using manufacturing system 1900. In some embodiments, after block 1702 of FIG. 17, based on the layout, at least one of (A) one or more semiconductor masks or (B) at least one component in a layer of an inchoate semiconductor integrated circuit is fabricated In FIG. 19, IC manufacturing system 1900 includes entities, such as a design house 1920, a mask house 1930, and an IC manufacturer/fabricator ("fab") 1940, that interact with one another in the design, development, and manufacturing cycles and/or services related to manufacturing an IC device 1960. The entities in system 1900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 1920, mask house 1930, and IC fab 1940 is owned by a single larger company. In some embodiments, two or more of design house 1920, mask house 1930, and IC fab 1940 coexist in a common facility and use common resources.

Design house (or design team) 1920 generates an IC design layout 1922. IC design layout 1922 includes various geometrical patterns designed for an IC device 1960. The geometrical patterns correspond to patterns of metal, oxide, or semiconductor layers that make up the various components of IC device 1960 to be fabricated. The various layers combine to form various IC features. For example, a portion of IC design layout 1922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1920 implements a proper design procedure to form IC design layout 1922. The design procedure includes one or more of logic design, physical design or place and route. IC design layout 1922 is presented in one or more data files having information of the geometrical patterns. For example, IC design layout 1922 is expressed in a GDSII file format or DFII file format.

Mask house 1930 includes data preparation 1932 and mask fabrication 1934. Mask house 1930 uses IC design layout 1922 to manufacture one or more masks to be used for fabricating the various layers of IC device 1960 according to IC design layout 1922. Mask house 1930 performs mask data preparation 1932, where IC design layout 1922 is translated into a representative data file ("RDF"). Mask data preparation 1932 supplies the RDF to mask fabrication 1934. Mask fabrication 1934 includes a mask writer. A mask writer converts the RDF to an image on a substrate, such as a mask (reticle) or a semiconductor wafer. The design layout is manipulated by mask data preparation 1932 to comply with particular characteristics of the mask writer and/or requirements of IC fab 1940. In FIG. 19, mask data preparation 1932, mask fabrication 1934, and mask 1945 are illustrated as separate elements. In some embodiments, mask data preparation 1932 and mask fabrication 1934 are collectively referred to as mask data preparation.

In some embodiments, mask data preparation 1932 includes optical proximity correction (OPC) which uses lithography enhancement techniques to compensate for image errors, such as those that can arise from diffraction, interference, other process effects and the like. OPC adjusts IC design layout 1922. In some embodiments, mask data preparation 1932 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 1932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1934, which may undo part of the modifications performed by OPC in order to meet mask creation rules.

In some embodiments, mask data preparation 1932 includes lithography process checking (LPC) that simulates processing that will be implemented by IC fab 1940 to fabricate IC device 1960. LPC simulates this processing based on IC design layout 1922 to fabricate a simulated manufactured device, such as IC device 1960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 1922.

It is understood that the above description of mask data preparation 1932 has been simplified for the purposes of clarity. In some embodiments, data preparation 1932 includes additional features such as a logic operation (LOP) to modify the IC design layout according to manufacturing rules. Additionally, the processes applied to IC design layout 1922 during data preparation 1932 may be executed in a variety of different orders.

After mask data preparation 1932 and during mask fabrication 1934, a mask 1945 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 1934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1940 is an IC fabrication business that includes one or more manufacturing facilities for the fabrication of a variety of different IC products. In some embodiments, IC fab 1940 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 1940 uses the mask (or masks) fabricated by mask house 1930 to fabricate IC device 1960 using fabrication tools 1952. Thus, IC fab 1940 at least indirectly uses IC design layout 1922 to fabricate IC device 1960. In some embodiments, a semiconductor wafer 1942 is fabricated by IC fab 1940 using the mask (or masks) to form IC device 1960. Semiconductor wafer 1942 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1900 of FIG. 19), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes a substrate; and a cell region having opposite first and second sides relative to a first direction, the cell region including active regions formed in the substrate extending in the first direction; relative to an imaginary first reference line in a second direction perpendicular to the first direction, a first majority of the active regions having first ends which align with the first reference line, the first side being parallel and proximal to the first reference line; relative to an imaginary second reference line in the second direction, a second majority of the active regions having second ends which align with the second reference line, the second side being parallel and proximal to the second reference line; and gate structures correspondingly on first and second ones of the active regions; and wherein, relative to the second direction, a first end of a selected one of the gate structures abuts an intervening region between the first and second active regions.

In some embodiments, the semiconductor device further includes a first isolation dummy gate formed in the intervening region. In some embodiments, the semiconductor device further includes a lower-leakage section of the semiconductor device in which each active region included therein has a first height relative to the second direction; and a higher-leakage section of the semiconductor device in which each active region included therein has a second height relative to the second direction, the second height being greater than the first height; and wherein the first active region is included in the lower-leakage section; and each active region having the first height exhibits current leakage at or below a predetermined threshold. In some embodiments, the semiconductor device further includes a higher-leakage section of the semiconductor device, wherein the second active region is substantially within the higher-leakage section and the second active region is configured with a height that is greater than the height of the first active region and supports switching speeds within a predetermined threshold. In some embodiments, relative to the first direction, the first and second active regions are separated by the intervening region. In some embodiments, a long axis of the first isolation dummy gate extends in the second direction. In some embodiments, the first active region is one of a plurality of first active regions; and the semiconductor device further includes a lower-leakage section of the semiconductor device in which each active region included therein has a first height relative to the second direction; a higher-leakage section of the semiconductor device in which each active region included therein has a second height relative to the second direction, the second height being greater than the first height; and the lower-leakage section includes a substantial portion of the plurality of first active regions; and members of the plurality of first active regions are separated from each other by corresponding gaps having a size S_1.

In some embodiments, the second active region is one of a plurality of second active regions; and relative to the first direction, a higher-leakage section includes a substantial portion of the plurality of second active regions; relative to the first direction, the plurality of first active regions are of a first size and the plurality of second active regions are of a second size, the second size being greater than the first size; and members of the plurality of second active regions are separated from each other by corresponding gaps having the size S_1. In some embodiments, a second isolation dummy gate separates one or more first active regions of a plurality of first active regions into a first portion and a second portion of the one or more first active regions, wherein the first and second portions are separated by the second isolation dummy gate structure. In some embodiments, the semiconductor device further includes a third isolation dummy gate separating one or more second active regions of a plurality of second active regions into a first portion and a second portion of the one or more second active regions, wherein the first and second portions are separated by the third isolation dummy gate structure.

In some embodiments, a semiconductor device includes a cell region including active regions extending in a first direction; relative to an imaginary central reference line extending in a second direction perpendicular to the first direction, the cell region being arranged so that the central reference line is located centrally within the cell region relative to the first direction; relative to an imaginary first reference line extending in the second direction, first end portions of two or more of the active regions extending a maximum distance in the first direction from the central reference line to the first reference line, a first edge of the cell region being parallel and proximal to the first reference line; relative to an imaginary second reference line extending in the second direction, second end portions of two or more of the active regions extending the maximum distance from the central reference line to the second reference line, a second edge of the cell region being parallel and proximal to the second reference line, the second edge being on an opposite side of the cell region relative the first edge; and first and second ones of the active regions having corresponding long axes in the first direction which are collinear, the first and second active regions being separated by a first intervening region.

In some embodiments, the semiconductor device further includes an isolation dummy gate in the first intervening region. In some embodiments, each of the first and second active regions has a first height in the second direction; and the cell region further includes third and fourth ones of the active regions having corresponding long axes in the first direction which are collinear, the third and fourth active regions being separated by a second intervening region, and each of the third and fourth active regions having the first height in the second direction; and a fifth one of the active regions which is between the first and second active regions relative to each of the first and second directions, and is between the third and fourth active regions relative to each of the first and second directions. In some embodiments, relative to the first direction, the fifth active region does not overlap any one of the first, second, third or fourth active regions. In some embodiments, the semiconductor device further includes relative to the first direction, a first isolation dummy gate is between the fifth active region and the first active region; or relative to the first direction, a second isolation dummy gate between the fifth active region and the second active region; or relative to the first direction, a third isolation dummy gate between the fifth active region and the third active region; or relative to the first direction, a fourth isolation dummy gate between the fifth active region and the fourth active region. In some embodiments, relative to the second direction, the fifth active region at least partially overlaps each of the first and second active regions; or relative to the second direction, the fifth active region at least partially overlaps each of the third and fourth active regions. In some embodiments, first end portions of first and third active regions extend the maximum distance in the first direction from the central reference line to the first reference line; or second end portions of the third and fourth active regions extend the maximum distance from the central reference line to the second reference line.

In some embodiments, a method of forming a semiconductor device, the method includes forming active regions in a substrate, the active regions correspondingly extending in a first direction, the forming active regions including; relative to an imaginary first reference line in a second direction perpendicular to the first direction, forming a first majority of the active regions with first ends which align with the first reference line, a first side of a cell region being parallel and proximal to the first reference line, the cell region including the active regions; relative to an imaginary second reference line in the second direction, forming a second majority of the active regions with second ends which align with the second reference line, a second side of the cell region being parallel and proximal to the second reference line; forming gate structures correspondingly on first and second ones of the active regions; and converting selected ones of the gate structures into corresponding isolation dummy gate structures such that none of the gate structures occupies an intervening region between the first and second active regions.

In some embodiments, relative to the first direction, sacrificial portions of selected ones of the gate structures correspondingly overlap the first and second active regions at corresponding abutment areas where the first and second active regions abut the intervening region; and the converting includes relative to the second direction, removing the sacrificial portions of the selected gate structures resulting in corresponding voids; and filling the voids with an insulating material. In some embodiments, relative to a third direction perpendicular to each of the first and second direction, the voids have a first depth; the removing portions of the selected gate structures exposes sacrificial portions of the first and second active regions which correspondingly underlie the sacrificial portions of the selected gate structures; the converting further includes removing the sacrificial portions of the first and second active regions thereby deepening the voids correspondingly to a second depth which is greater than the first depth; and the filling the voids fills the voids to the second depth with the insulating material.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
a substrate; and
a cell region having opposite first and second sides relative to a first direction, the cell region including active regions in the substrate extending in the first direction;
relative to an imaginary first reference line in a second direction perpendicular to the first direction, a first majority of the active regions having first ends which align with the first reference line, the first side being parallel and proximal to the first reference line;
relative to an imaginary second reference line in the second direction, a second majority of the active regions having second ends which align with the second reference line, the second side being parallel and proximal to the second reference line; and
gate structures correspondingly on the first majority and the second majority of the active regions;
wherein, relative to the second direction, a first end of a selected one of the gate structures abuts an intervening region between the first majority and the second majority of the active regions; and
a higher-leakage section of the semiconductor device, wherein the second majority of the active regions is substantially within the higher-leakage section and the second majority of active regions is configured with a height that is greater than a height of the first majority of active regions and supports switching speeds within a predetermined threshold.

2. The semiconductor device of claim 1, further comprising:
a first isolation dummy gate formed in the intervening region.

3. The semiconductor device of claim 1, further comprising:
a lower-leakage section of the semiconductor device in which each active region included therein has a first height relative to the second direction; and
a higher-leakage section of the semiconductor device in which each active region included therein has a second height relative to the second direction, the second height being greater than the first height; and
wherein:
the first majority of the active regions is included in the lower-leakage section; and
each active region having the first height exhibits current leakage at or below a predetermined threshold.

4. The semiconductor device of claim 1, wherein a height of each of the first majority of active regions is different from a height of each of the second majority of active regions.

5. The semiconductor device of claim 1, wherein:
relative to the first direction, the first majority and the second majority of the active regions are separated by the intervening region.

6. The semiconductor device of claim 2, wherein:
a long axis of the first isolation dummy gate extends in the second direction.

7. The semiconductor device of claim 1, wherein:
a first active region is one of a plurality of first active regions; and
the semiconductor device further comprises:
a lower-leakage section of the semiconductor device in which each active region included therein has a first height relative to the second direction;
a higher-leakage section of the semiconductor device in which each active region included therein has a second height relative to the second direction, the second height being greater than the first height; and
the lower-leakage section includes a substantial portion of the plurality of first active regions; and
members of the plurality of first active regions are separated from each other by corresponding gaps having a size $S\_1$.

8. The semiconductor device of claim 7, wherein:
a second active region is one of a plurality of second active regions; and
relative to the first direction, a higher-leakage section includes a substantial portion of the plurality of second active regions;
relative to the first direction, the plurality of first active regions are of a first size and the plurality of second active regions are of a second size, the second size being greater than the first size; and
members of the plurality of second active regions are separated from each other by corresponding gaps having the size $S\_1$.

9. The semiconductor device of claim 2, wherein:
a second isolation dummy gate separates one or more first active regions of a plurality of first active regions into a first portion and a second portion of the one or more first active regions, wherein the first and second portions are separated by the second isolation dummy gate.

10. The semiconductor device of claim 9, further comprising:
a third isolation dummy gate separating one or more second active regions of a plurality of second active regions into a first portion and a second portion of the one or more second active regions, wherein the first and second portions of the one or more second active regions are separated by the third isolation dummy gate.

11. A semiconductor device comprising:
a cell region including active regions extending in a first direction;
relative to an imaginary central reference line extending in a second direction perpendicular to the first direction, the cell region being arranged so that the central reference line is located centrally within the cell region relative to the first direction;
relative to an imaginary first reference line extending in the second direction, first end portions of two or more of the active regions extending a maximum distance in the first direction from the central reference line to the first reference line, a first edge of the cell region being parallel and proximal to the first reference line;
relative to an imaginary second reference line extending in the second direction, second end portions of two or more of the active regions extending the maximum distance from the central reference line to the second reference line, a second edge of the cell region being parallel and proximal to the second reference line, the second edge being on an opposite side of the cell region relative the first edge; and
a first active region of the active regions has a first upper edge extending in the first direction which is collinear with a second upper edge of a second active region of the active regions, the first active region has a first lower edge extending in the first direction which is offset in the second direction relative to a second lower edge of the second active region, the first and second active regions being separated by a first intervening region.

12. The semiconductor device of claim 11, further comprising:
an isolation dummy gate in the first intervening region.

13. The semiconductor device of claim 11, wherein:
each of the first and second active regions has a first height in the second direction; and
the cell region further includes:
third and fourth ones of the active regions having corresponding long axes in the first direction which are collinear, the third and fourth active regions being separated by a second intervening region, and each of the third and fourth active regions having the first height in the second direction; and
a fifth one of the active regions which is between the first and second active regions relative to each of the first and second directions, and is between the third and fourth active regions relative to each of the first and second directions.

14. The semiconductor device of claim 13, wherein:
relative to the first direction, the fifth active region does not overlap any one of the first, second, third or fourth active regions.

15. The semiconductor device of claim 13, further comprising:
relative to the first direction, a first isolation dummy gate is between the fifth active region and the first active region; or
relative to the first direction, a second isolation dummy gate between the fifth active region and the second active region; or
relative to the first direction, a third isolation dummy gate between the fifth active region and the third active region; or
relative to the first direction, a fourth isolation dummy gate between the fifth active region and the fourth active region.

16. The semiconductor device of claim 13, wherein:
relative to the second direction, the fifth active region at least partially overlaps each of the first and second active regions; or
relative to the second direction, the fifth active region at least partially overlaps each of the third and fourth active regions.

17. The semiconductor device of claim 13, wherein:
first end portions of first and third active regions extend the maximum distance in the first direction from the central reference line to the first reference line; or
second end portions of the third and fourth active regions extend the maximum distance from the central reference line to the second reference line.

18. A semiconductor device comprising:
a substrate; and
a cell region having opposite first and second sides relative to a first direction, the cell region including active regions formed in the substrate extending in the first direction;
a first plurality of the active regions having first ends which align with a first reference line, wherein the first reference line extends in a second direction perpendicular to the first direction, each of the first plurality of active regions has a first height in the second direction, and the first side is parallel to the first reference line;
a second plurality of the active regions having second ends which align with a second reference line, wherein the second reference line extends in the second direction, each of the second plurality of active regions has a second height in the second direction, the second height is different from the first height, and the second side is parallel to the second reference line;
a plurality of gate structures extending over each of a first active region of the active regions and a second active region of the active regions;
a first isolation dummy gate over the first active region; and
an abutting gate structure abutting the first isolation dummy gate at an abutment location between the first active region and the second active region, wherein the abutting gate structure is separate from the plurality of gate structures.

19. The semiconductor device of claim 18, wherein the first active region is surrounded by a doped well in the substrate.

20. The semiconductor device of claim 18, further comprising a second isolation dummy gate over the second active region, wherein the second isolation dummy gate is offset from the first isolation dummy gate in the first direction.

* * * * *